United States Patent [19]
Yonehara et al.

[11] Patent Number: 5,530,266
[45] Date of Patent: Jun. 25, 1996

[54] LIQUID CRYSTAL IMAGE DISPLAY UNIT AND METHOD FOR FABRICATING SEMICONDUCTOR OPTICAL MEMBER

[75] Inventors: Takao Yonehara, Atsugi; Mamoru Miyawaki, Isehara; Akira Ishizaki, Atsugi; Junichi Hoshi, Hadano; Masaru Sakamoto; Shigetoshi Sugawa, both of Atsugi; Shunsuke Inoue; Toru Koizumi, both of Yokohama; Tetsunobu Kohchi, Hiratsuka; Kiyofumi Sakaguchi; Takanori Watanabe, both of Atsugi, all of Japan

[73] Assignee: Canon Kabushiki Kaisha, Tokyo, Japan

[21] Appl. No.: 242,047

[22] Filed: May 13, 1994

Related U.S. Application Data

[63] Continuation of Ser. No. 921,697, Jul. 30, 1992, abandoned.

[30] Foreign Application Priority Data

| Aug. 2, 1991 | [JP] | Japan | 3-194115 |
| Oct. 11, 1991 | [JP] | Japan | 3-292259 |
| Jan. 31, 1992 | [JP] | Japan | 4-040448 |
| Jan. 31, 1992 | [JP] | Japan | 4-040449 |
| Jan. 31, 1992 | [JP] | Japan | 4-040453 |
| Jan. 31, 1992 | [JP] | Japan | 4-040490 |
| Jan. 31, 1992 | [JP] | Japan | 4-040582 |

[51] Int. Cl.$^6$ ........................ H01L 27/092; H01L 27/105
[52] U.S. Cl. ............................ 257/72; 257/59; 257/347; 257/466; 257/619; 359/59
[58] Field of Search .................... 257/353, 72, 619, 257/347, 466, 59; 359/59

[56] References Cited

U.S. PATENT DOCUMENTS

| 3,997,381 | 12/1976 | Wanlass | 156/3 |
| 4,602,269 | 7/1986 | Koike | 257/351 |

FOREIGN PATENT DOCUMENTS

| 0268380 | 5/1988 | European Pat. Off. . | |
| 55-016464 | 4/1980 | Japan . | |
| 58-143374 | 8/1983 | Japan . | |
| 60-198581 | 10/1985 | Japan . | |
| 38727 | 2/1989 | Japan . | |
| 1194351 | 8/1989 | Japan | 257/353 |
| 100516 | 4/1991 | Japan . | |
| 2204980 | 11/1988 | United Kingdom . | |

OTHER PUBLICATIONS

J. Crys. Growth, vol. 63, No. 3 (1983) 429:590.
Bell Syst. Tech. J., vol. xxxv (1956) 333:347.
J. Electro. Soc., vol. 127, No. 2 (1980) 476:483.
Appl. Phys. Lett., vol. 42, No. 4 (1983) 386:388.

Primary Examiner—Jerome Jackson
Attorney, Agent, or Firm—Fitzpatrick, Cella, Harper & Scinto

[57] ABSTRACT

A liquid crystal image display unit created on a substrate non-transparent to the light in the visible radiation area, characterized in that a portion beneath a liquid crystal pixel part on said substrate is removed, so that the light is made transmissive through said liquid crystal pixel part.

11 Claims, 32 Drawing Sheets

|   | $V_{back}$ |
|---|---|
| a : | 0 V |
| b : | 1 V |
| c : | 2 V |
| d : | 3 V |

---- IDEAL CURVE

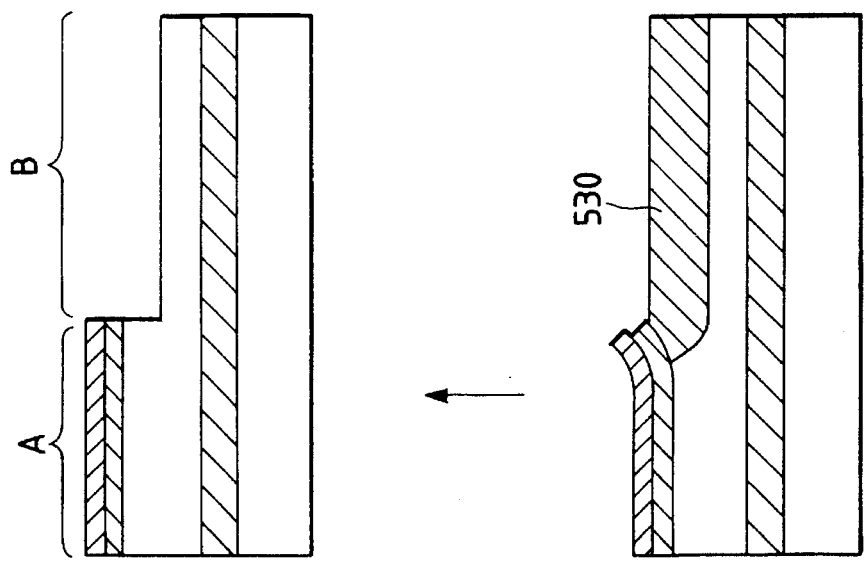
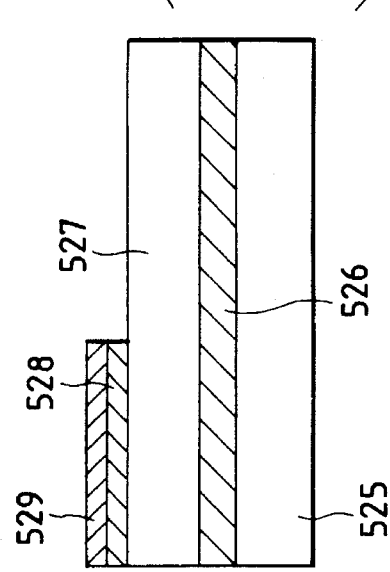
FIG. 37A
FIG. 37B
FIG. 37C

NMOSFET STATIC CURVE

PMOSFET STATIC CURVE

HIGH-VOLTAGE RESISTANT NMOS STATIC CURVE

LOGIC UNIT HIGH-SPEED NMOS STATIC CURVE

LIQUID CRYSTAL IMAGE DISPLAY UNIT AND METHOD FOR FABRICATING SEMICONDUCTOR OPTICAL MEMBER

This application is a continuation, of application Ser. No. 07/921,697, filed Jul. 30, 1992, now abandoned.

BACKGROUND OF THE INVENTION

1. Field of the Invention

The present invention relates to a semiconductor optical member having a light transparent portion and a liquid crystal image display unit using the member, and to a method for fabricating the semiconductor optical member for use with the liquid crystal image display unit, as well as an image sensor, a view finder, an X-ray exposure mask, a pressure sensor, and other micromechanisms.

2. Related Background Art

Formation of a monocrystalline Si semiconductor layer on an insulating material is widely known as silicon on insulator ("SOI") technology, and provides many advantages which cannot be reached by bulk Si substrates for preparing conventional Si integrated circuits. More specifically, by utilizing the SOI structure, the following advantages can be obtained:

① Dielectric isolation can be easily done to enable high degree of integration;

② Radiation hardness is excellent;

③ Stray capacity is reduced to attain high speed;

④ Well formation step can be omitted;

⑤ Latch-up can be prevented;

⑥ Fully depleted field effect transistor can be made by thin film formation.

In order to realize the many advantages in device characteristics as mentioned above, studies have been made about the method for forming the SOI structure for some 10 years. These studies are summarized in, for example, "Single-crystal silicon on non-single-crystal insulators"; edited by G. W. Gullen, Journal of Crystal Growth, volume 63, no. 3, pp. 429–590 (1983).

Also, it has been known for a long time to form the SOS (silicon on sapphire) structure by heteroepitaxy of Si on a monocrystalline sapphire substrate by CVD (chemical vapor deposition) method. This was successful to some extent as the most mature SOI technique, but has not been widely applied due to various reasons including many crystal defects because of lattice mismatching at the interface between the Si layer and the underlaid sapphire substrate, introduction of aluminum from the sapphire substrate into the Si layer, and above all the high price of the substrate and delay in enlargement of the substrate wafer size. In recent years, attempts to realize the SOI structure without use of a sapphire substrate have been made. Such attempts may be broadly classified into the two technologies shown below:

(1) After surface oxidation of an Si monocrystalline substrate, a window is formed to have the Si substrate partially exposed, and epitaxial growth is proceeded in the lateral direction with that exposed portion as the seed to form an Si monocrystalline layer on $SiO_2$.

(2) By use of the surface of an Si monocrystalline substrate itself as an active layer, $SiO_2$ is formed therebeneath.

Methods for realizing the above (1) include the method in which a monocrystalline Si layer is formed directly by lateral epitaxial growth by CVD, the method in which amorphous Si is deposited and subjected to solid phase lateral epitaxial growth by heat treatment, the method in which an amorphous or polycrystalline Si layer is irradiated convergently with an energy beam such as electron beam, laser beam, etc., and a monocrystalline layer is grown on $SiO_2$ by melting and recrystallization, and the method in which a melting region is scanned in a zone fashion by a rod-shaped heater (Zone Melting Recrystallization). Although these methods have advantages, they still have many problems with respect to controllability, productivity, uniformity and quality, and none of them has been industrially applied to date. For example, the CVD method requires the sacrificial oxidation in flat thin film formation, while crystallinity is poor with the solid phase growth method. On the other hand, with the beam annealing method, problems are involved in controllability such as treatment time by converged beam scanning, the manner of overlapping of beams, focus adjustment, etc. Among these, the Zone Melting Recrystallization method is the most mature, and a relatively larger scale integrated circuit has been made on trial, but still a large number of crystal defects such as subboundary remain, and no device driven by minority carriers has been prepared. Also, since any of those methods requires the Si substrate, excellent quality monocrystalline Si layer cannot be obtained on a transparent amorphous insulating substrate such as a glass. Concerning the method (2) using no Si substrate as the seed for epitaxial growth, the following three methods may be exemplified wherein:

① an oxide film is formed on an Si monocrystalline substrate with V-grooves as anisotropically etched on the surface, a polycrystalline Si layer is deposited on the oxide film (as thick as the Si substrate), and thereafter by polishing from the back surface of the Si substrate, Si monocrystalline regions dielectrically separated by surrounding with the V-grooves on the thick polycrystalline Si layer are formed. In this method, although crystallinity is good, there are problems with respect to controllability and productivity (since it requires a process of depositing the polycrystalline Si thick as some hundred μm), and a process in which the monocrystalline Si substrate is polished from the back surface to leave only the Si active layer as separated.

② An $SiO_2$ layer is formed by ion implantation of oxygen into an Si monocrystalline substrate in a method called Separation by ion implanted oxygen ("Simox"), which is currently one of the most mature methods because of good matching with the Si process. However, since $10^{18}$ ions/cm² or more of oxygen ions must be implanted for forming the $SiO_2$ layer, the implantation time is very long and productivity is low. Therefore, the wafer cost is high. Further, many crystal defects remain, and from an industrial point of view, sufficient quality for preparing a device driven by minority carriers has not been attained.

③ An SOI structure is formed by dielectric isolation by oxidizing porous Si. In this method, an N-type Si layer is formed on the surface of a P-type Si monocrystalline substrate in shape of islands by way of proton ion implantation (Imai et al., J. Crystal Growth, vol. 63, 547 (1983)), or by epitaxial growth and patterning; only the P-type Si substrate is made porous by anodization in the HF solution so as to surround the Si islands from the surface; and then the N-type Si islands are dielectrically isolated by accelerated oxidation. However, since the separated Si region is determined before the device steps, the degree of freedom in device design may be limited in some cases.

As is well-known in this art, forming semiconductor elements on a light-transparent substrate is important for constituting a contact sensor serving as a light-receiving device and a projection-type liquid crystal image display. A high-quality driving device is required for further increasing the density, resolution and definition of the pixels (picture elements) of such a sensor or display. The number of switching elements for switching the pixels and the terminals in the drive circuit thereof and the peripheral circuits are so large that their interconnection is mechanically impossible. Consequently, it is desirable that semiconductor elements and peripheral driving circuits as above mentioned are created and interconnected within the same substrate through the same process, and the interconnection thereof should be made by patterning of conductive thin films so as to be connected within the normal integrated circuit, whereby through such a method the high density packaging is only made possible. Further, from the nature industrial demands of making higher quality products, it is needed to fabricate a device on the light-transparent substrate by the use of a mono-crystalline layer having excellent crystallinity.

However, on a light-transparent substrate represented by glass, an amorphous (or, at best, a polycrystalline) layer is generally formed because of the disorder of the crystal structure, and it is therefore difficult to produce a driving device having properties sufficient for the present demands or future demands because of its crystal structure having many defects. This is because the substrate has an amorphous crystal structure, and thus a monocrystalline layer of high quality cannot easily be obtained by simply depositing the Si layer. Further, any of the aforementioned methods using an Si monocrystalline substrate are unsuitable for obtaining a good monocrystalline film on a light-transparent substrate.

It should be noted that an attempt to fabricate a monocrystalline thin film Si on a light-transparent substrate by bonding a light-transparent substrate represented by a glass to an Si substrate, and polishing Si for the formation of thinner film (reported by Abe, Kuwahara, Nakazato, Uchiyama, Yoshizawa, in Electronic Information Communication Institute Technology Research Reports, SDM90-156, 77 (1990)), has not yet been successful because the difference between thermal expansion coefficients is as large as one digit.

Therefore, a liquid crystal display unit provided with an active matrix element, which has been commercialized as a flat panel display or a projection television, conventionally used the thin film transistor (TFT) in which an amorphous or polycrystalline silicon semiconductor layer was formed on the glass substrate.

FIG. 1 shows a schematic view for explaining an active matrix-type liquid crystal display unit which has been conventionally used. Reference numeral 1 is a pixel switch, 5 is a liquid crystal pixel, is a transparent substrate, 2 is a buffer portion, 3 is a horizontal shift register portion, and 4 is a vertical shift register portion. The luminance signal and the voice signal of television are compressed within a certain band width, and transmitted to the buffer portion 2 which is driven by the horizontal shift register 3 having a driving capability of its frequency. Then a signal is transferred to the liquid crystal while the pixel switch 1 is being turned on by the vertical shift register 4.

The performance required for each circuit is such that if a high-definition television is considered, a television signal is transferred to the buffer portion at a frequency of about 45 MHz, when the frame frequency is 50 Hz, the number of scanning lines is 1000, the horizontal scanning period is about 30 μsec (effective scanning period 27 μsec), and the number of horizontal pixels is about 1500. Also, the permissible period for the signal transfer per scanning line is 1 to 2 μsec. Accordingly, the performance required for each element circuit is such that ① the driving ability of horizontal shift register is 45 MHz or greater, ② the driving ability of vertical shift register is 500 kHz or greater, ③ the driving ability of transfer switch which is driven by the horizontal shift register to transfer the television signal to the buffer portion is 45 MHz or greater, and ④ the driving ability of pixel switch is 500 kHz or greater. The driving ability referred to herein means that when the liquid crystal pixel is desired to have a certain number of gradations N, a voltage of not less than $$Vm-(Vm-Vt)/N \text{ [V]}$$

is transferred within the above period, assuming that the voltage giving the maximum or minimum transmittance of liquid crystal is Vm, and the threshold voltage of liquid crystal obtained from a V-T (voltage-transmittance) curve is Vt.

As will be clear from this, the pixel switch and the vertical shift register can be sufficient with a relatively small driving ability, while the horizontal shift register and the buffer portion require a high speed driving. Therefore, in the current liquid crystal display element, the pixel switch or vertical shift register is produced by forming a liquid crystal and a monolithic with a polycrystalline silicon or amorphous silicon TFT deposited on the glass substrate, and other peripheral circuits are produced by packaging IC chips from the outside.

In this case, to obtain a bright display image, it is necessary to increase the quantity of light transmitting through the liquid crystal pixel part. On the other hand, to package IC chips, the glass substrate must have a strength exceeding a certain value, as well as a great thickness thereof. Hence, the use of a thick glass substrate with a sufficiently higher quantity of transmitting light has led to the increase in the fabrication cost. According to the views of the present inventors, it has been found that the transparent portion of the substrate beneath the liquid crystal pixel part is necessary to be thin, and have a high light transmittance and a sufficient mechanical strength.

Additionally, it has been also found that such configuration is not limited to the liquid crystal image display unit, but is applicable to a contact-type image sensor and an X-ray mask, as well as a semiconductor optical member such as a view finder, a pressure sensor, and micro-mechanics.

On the other hand, an attempt to form peripheral circuits in monolithic with the polycrystalline silicon TFT has been made, but since the driving ability of individual TFT is small, it is necessary to increase the size of transistor or take complex measures for the circuit.

A high-quality driving device is required for further increasing the density, resolution and definition of the pixels (picture elements) of the display unit. The number of switching elements for switching the pixels and the terminals in the drive circuit thereof and the peripheral circuits are so large such that interconnection after separate fabrication of both is mechanically impossible (e.g., with the wire bonding or bump connection). Consequently, it is desirable that semiconductor elements and peripheral driving circuits as above mentioned are created within the same substrate through the same process, and the interconnection thereof should be made by patterning of conductive thin films to be connected within the normal integrated circuit, whereby through such a method the higher density packaging is only made possible. Further, from natural industrial demands toward higher quality products to be created, it is necessary to produce a device to be provided on a light-transparent substrate by using a monocrystalline layer having excellent crystallinity.

It is therefore quite difficult to produce a driving device having properties sufficient for the present demands or future demands because of its crystal structure having many defects in the amorphous Si or polycrystalline Si.

And apart from the above-described technical problems of the substrate, the present inventors have noticed that the configuration of switching element in the liquid crystal pixel part of the configuration of semiconductor element in the peripheral circuit must be designed from a new viewpoint, in order to obtain a higher performance liquid crystal image display unit.

SUMMARY OF THE INVENTION

A first object of the present invention is to provide a liquid crystal image display unit comprising a high quality monocrystalline semiconductor layer on the same substrate which can resolve the aforementioned problems and meet the aforementioned requirements.

A second object of the present invention is to provide a liquid crystal image display unit created on a non-transparent substrate to the light in the visible radiation area, characterized in that the light is made transmissive through the liquid crystal pixel part by removing the light non-transparent substrate provided beneath the liquid crystal pixel part.

A third object of the present invention is to provide a method for fabricating a liquid crystal image display unit having a substrate and a liquid crystal pixel part formed on the substrate, wherein a portion beneath the liquid crystal pixel part on the substrate is transparent to the light, characterized in that the light is made incident into the liquid crystal pixel part in such a way that after the liquid crystal pixel part is formed on a light transparent insulation layer provided on the substrate which is non-transparent to the light, a portion of the substrate beneath the liquid crystal pixel part is removed by etching.

A fourth object of the present invention is to provide a method for fabricating a semiconductor optical member having a light transparent portion and a light non-transparent portion, characterized by including processes of:

bonding the surface side of a monocrystalline semiconductor layer formed on a porous first substrate to the insulating surface side of a light non-transparent second substrate, removing the first substrate with a treatment including wet etching, and forming a region upon which the light is incident from the second substrate side on the monocrystalline semiconductor layer by removing a part of the second substrate.

Another object of the present invention is to provide a liquid crystal image display unit comprising at least two semiconductor elements each having an active layer comprised of a monocrystalline semiconductor on a substrate having the insulating surface, characterized in that the at least two semiconductor elements have respective active layers having different layer thicknesses.

The liquid crystal image display unit of the present invention has a monocrystalline layer formed with an active region of semiconductor active element and a liquid crystal layer on a surface of a substrate, the surface of which is constituted of a light transparent insulation layer, wherein it is preferable that the substrate lying under the liquid crystal layer is removed to the light transparent insulation layer from the opposite side of the liquid crystal layer, so that the light is transmissive through the liquid crystal layer.

Also, another liquid crystal image display unit of the present invention has a silicon monocrystalline layer formed with an active region of silicon semiconductor active element and a liquid crystal layer on a surface of a silicon substrate, the surface of which is constituted of a light transparent insulation layer, wherein it is preferable that the silicon substrate lying under the liquid crystal layer is removed to the light transparent insulation layer from the opposite side of the liquid crystal layer, so that the visible light is transmissive through the liquid crystal layer.

Also, another liquid crystal image display unit of the present invention has a silicon monocrystalline layer formed with an active region of silicon semiconductor active element and a liquid crystal layer on a surface of a silicon substrate, the surface of which is constituted of a light transparent insulation layer, wherein it is preferable that the silicon substrate lying under the liquid crystal layer is removed to the light transparent insulation layer from the opposite side of the liquid crystal layer, so that the visible light is transmissive through the liquid crystal layer, and wherein the silicon monocrystalline layer can be obtained in such a way that the surface of the silicon substrate is bonded on to the silicon monocrystalline layer after being formed on a porous silicon semiconductor, which is then removed by etching.

Suitably used as the semiconductor active element may be a field effect transistor, a bipolar transistor, a diode, a thyristor, etc.

The present invention makes it possible to provide a high performance device having the elements and circuits integrated on the same substrate as the liquid crystal image display pixel in which the stray capacity of the semiconductor element is reduced, the high speed operation is enabled, there is no latch-up phenomenon, and the radiation resistant characteristics are superior, since an Si monocrystalline substrate which is more economical, even and flat over a large area, and has a quite excellent crystallinity is used, and semiconductor active elements are created on an Si monocrystalline layer having fewer defects.

A method for fabricating a semiconductor member according to the present invention preferably includes:

a process of bonding a surface of non-porous monocrystalline layer on a first Si substrate made porous or a surface of an insulation layer formed on the non-porous monocrystalline layer onto a second Si substrate having an insulation layer on the surface thereof, a process of removing the first Si substrate made porous with a treatment including at least wet chemical etching, so as to form a monocrystalline semiconductor layer on the bonded insulation layer, a process of removing a part of the second Si substrate or a part of the insulation layer bonded with the second Si substrate with a treatment including at least wet chemical etching from the face side on which the monocrystalline semiconductor layer is not formed, until the insulating surface of the bonded insulation layer or the monocrystalline face of the monocrystalline semiconductor layer is exposed.

Also, a method for fabricating a semiconductor member according to the present invention preferably includes:

a process of bonding a surface of anon-porous monocrystalline layer on a first Si substrate made porous or a surface of an insulating layer formed on the non-porous monocrystalline layer onto a second Si substrate having an insulating layer on the surface thereof, a process of removing the first Si substrate made porous with a treatment including at least wet chemical etching, so as to form a monocrystalline semiconductor layer on the bonded insulation layer, a process of forming an electronic device on the monocrystalline semiconductor layer, and a process of removing a part of the second Si substrate or a part of the insulation layer bonded with the second Si substrate, including at least partly a portion lying directly under the area having the electronic device formed, with a treatment including at least wet chemical etching, from the face side where the monocrystalline semiconductor layer is not formed, until the insulating surface of the bonded insulation layer or the monocrystalline face of the monocrystalline semiconductor layer is exposed.

Further, since the substrate which is non-transparent to the light in the visible light region in the liquid crystal image display unit of the present invention is as thick as about 600 μm, some measures must be taken to remove a lower portion of the liquid crystal pixel part at a high precision. As will be described later, the angle of a slant surface after removal of the substrate with respect to the membrane is preferably from 55° to 90°, and more preferably 90°. Further, it is preferable that the removal of the substrate is correctly ended at the time when the membrane is reached, but since the present invention uses a substrate having the anisotropic etching characteristics as the substrate, the precise removal can be made at an angle of 55° or greater.

The etching method is not particularly limited, but any of well-known methods can be used, and the chemical etching having a large selection ratio is preferable. In particular, the wet etching is preferable due to its cheapness, and the dry etching, particularly RIE (reactive ion etching) is preferable due to its high anisotropy.

BRIEF DESCRIPTION OF THE DRAWINGS

FIGS. 37A to 37C are schematic views for explaining a formation method of a semiconductor layer according to one embodiment of the present invention.

DETAILED DESCRIPTION OF THE PREFERRED EMBODIMENTS

[Embodiments]

The preferred embodiments of the present invention will be described below with reference to the drawings.

Figure 1:
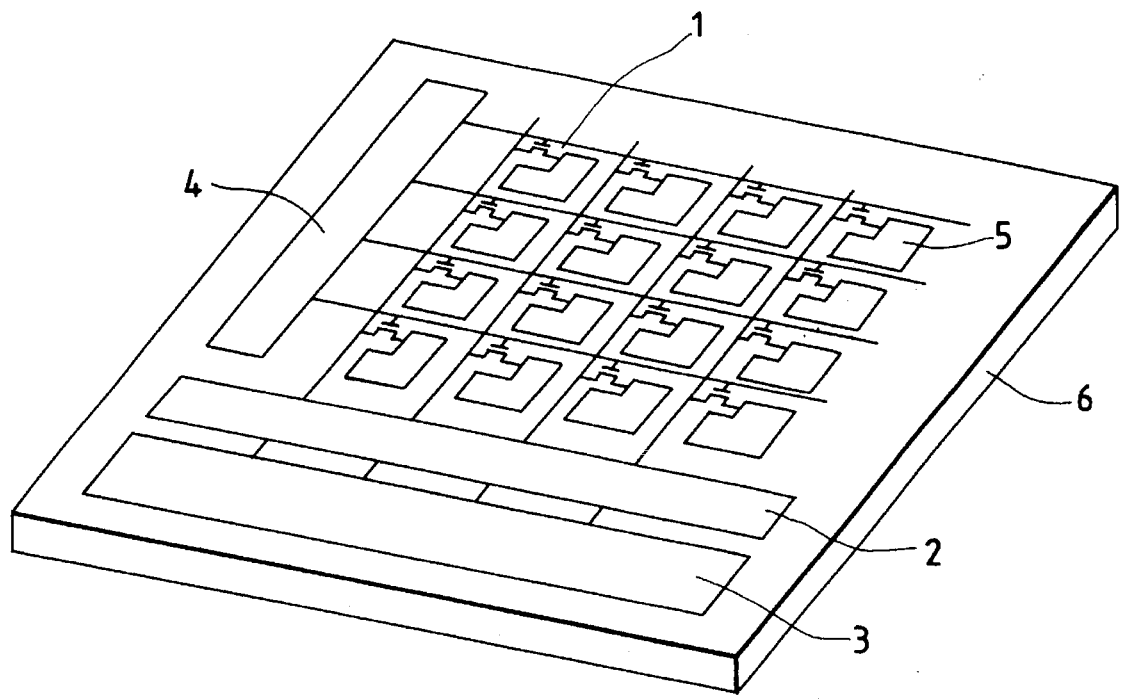
FIG. 1 is a schematic view of a conventional active matrix-type liquid crystal device.
Figure 2A:
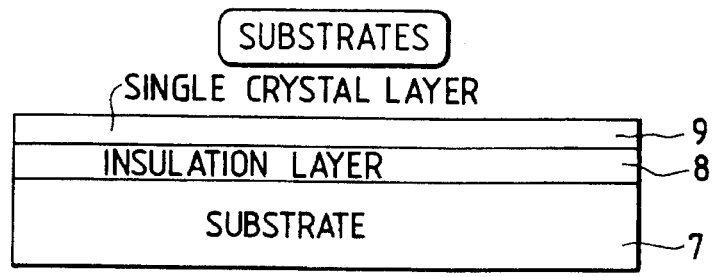
FIGS. 2A to 2D are schematic views for explaining a fabrication process for a liquid crystal display unit according to one embodiment of the present invention.
Figure 2B:
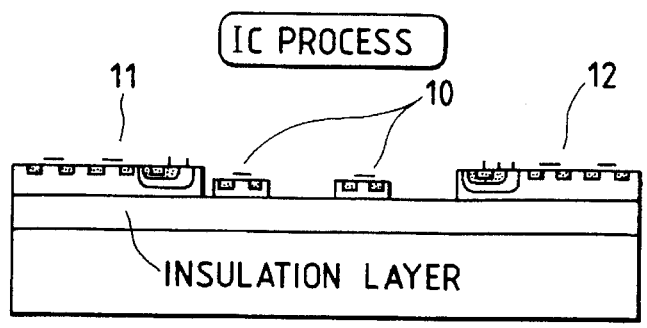
Figure 2C:
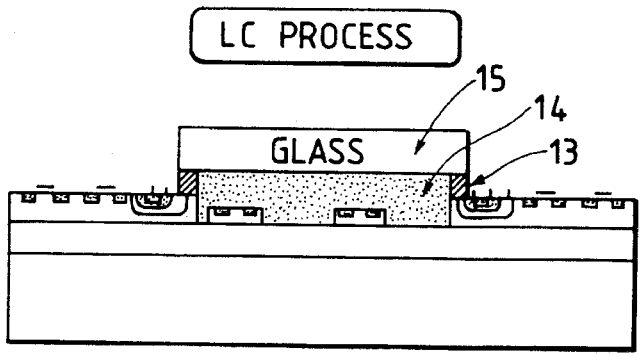
Figure 2D:
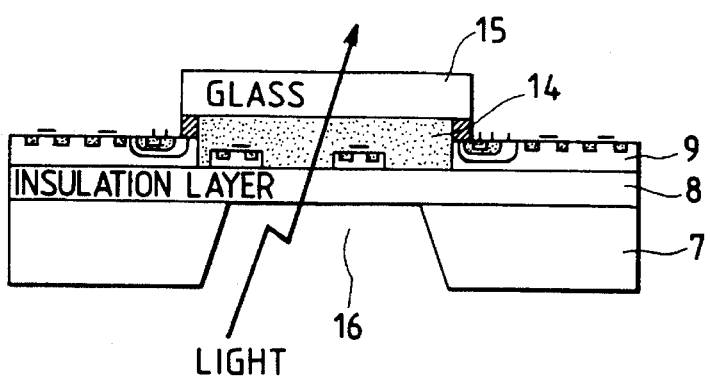

FIGS. 2A to 2D are schematic views typically showing one example of a fabrication process for a liquid crystal image display unit according to one embodiment of the present invention. In FIG. 2A, a substrate 7 is a light non-transparent substrate, 8 is a light transparent insulation layer, and 9 is a semiconductor monocrystalline layer. This substrate structure is widely known as an SOI structure in which two semiconductor substrates are bonded via the insulation layer, with one of the substrates made a thin layer, and is suitable for selecting freely the insulation layer. Using a well-known integrated circuit process technique for an SOI substrate as shown in FIG. 2A, pixel switching elements 10, a drive circuit 11, and a peripheral circuit 12, which are semiconductor active elements necessary for the liquid crystal image display unit as shown in FIG. 2B, are created. Thereafter, a liquid crystal 14 is sealed using a cover glass 15 and a sealing material 13 as shown in FIG. 2C. It is needless to say that this liquid crystal portion requires an oriented film, a counter electrode, a filter, a polarizing plate, etc., but these are well-known technical items and the explanation thereof is omitted herein. Since the substrate is not transparent to the visible light in this state, it is not used as a projection-type display unit in which a light source is disposed behind the substrate. Finally, the light non-transparent substrate 7 lying under a lower portion 16 of the liquid crystal pixel part as shown in FIG. 2D is removed from a back face thereof to the light transparent insulation layer 8 and is made substantially transparent to the light to create a projection-type liquid crystal image display unit. From the demands toward the mechanical strength or the improvement in the reliability, the partially removed area 16 can be filled with a transparent resin or spin on glass.

Further, the liquid crystal image display unit of the present invention is preferably provided with at least an $SiN_x$ insulation layer in the light transparent region obtained by removing the light non-transparent substrate to increase the mechanical strength on that portion and improve the reliability.

The formation method of the $SiN_x$ insulation layer includes the sputtering, the low pressure CVD or the plasma CVD, but the low pressure CVD is preferable from the aspect of controllability. The $SiN_x$ insulation layer may be provided on an upper layer film (protective film) of the device, an interlayer insulation film (layout film) or an underlaid insulation film, or a combination thereof. Further, the strength can be controlled by the film thickness of the $SiN_x$ insulation layer and the patterning.

Figure 3A:
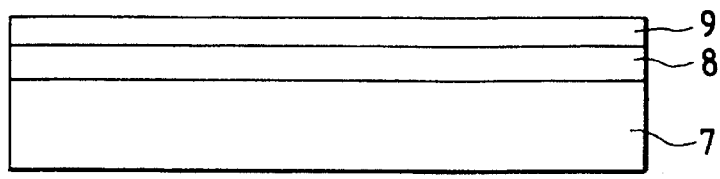
FIGS. 3A to 3D are schematic views for explaining a fabrication process for a liquid crystal display unit according to another embodiment of the present invention.
Figure 3B:
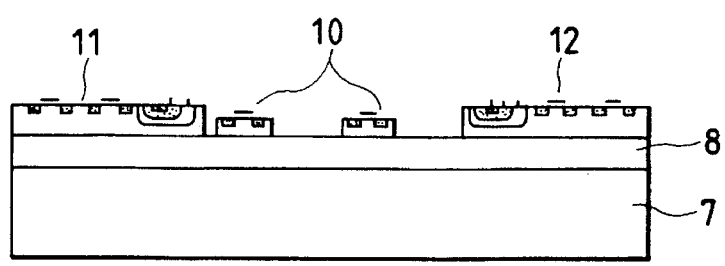
Figure 3C:
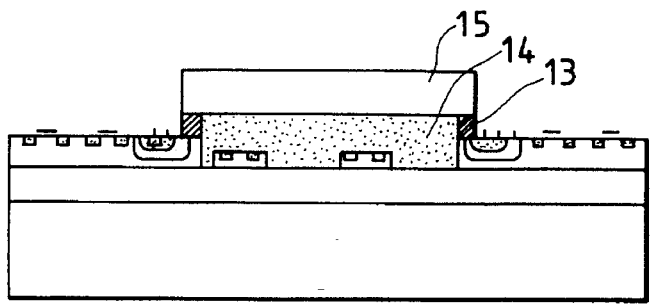
Figure 3D:
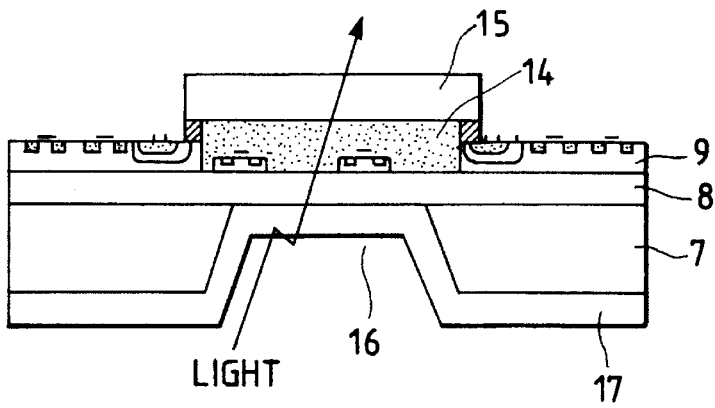

FIGS. 3A–3D are schematic views showing another example of a fabrication process of a liquid crystal image display unit according to the present invention. In FIG. 3A, a substrate 7 is a light non-transparent substrate, 8 is a light transparent insulation layer, and 9 is a semiconductor monocrystalline layer. This substrate structure is widely known as an SOI structure in which two semiconductor substrates are bonded via the insulation layer, with one of the substrates made a thin film, and is suitable for selecting freely the insulation layer. Using a well-known integrated circuit process technique for an SOI substrate as shown in FIG. 3A, pixel switching elements 10, a drive circuit 11, and a peripheral circuit 12, which are semiconductor active elements necessary for the liquid crystal image display unit as shown in FIG. 3B, are created. Thereafter, a liquid crystal 14 is sealed using a cover glass 15 and a sealing material 13 as shown in FIG. 3C. It is needless to say that this liquid crystal portion requires an oriented film, a counter electrode, a filter, a polarizing plate, etc., but these are well-known technical items and the explanation thereof is omitted herein. Since the substrate is not transparent to the visible light in this state, it is not used as a projection-type display unit in which a light source is disposed behind the substrate. Thus, the light non-transparent substrate 7 lying under a lower portion 16 of the liquid crystal pixel part as shown in FIG. 3D is removed from a back face thereof to the light transparent insulation layer 8 and is made substantially transparent to the light to create a projection-type liquid crystal image display unit by further forming an $SiN_x$ insulation layer 17 from the back face of the light transparent region as a reinforcing layer.

In the above-described embodiment, it is possible to provide a high quality device by making the layer thickness of semiconductor active layer of the switching element 10 thinner than that of semiconductor active layer of the peripheral circuit 12 as well as the drive circuit 11.

Herein, the porous semiconductor for use in the present invention will be described below.

Porous Si as a porous semiconductor for use in the present invention was discovered in the course of research on electrolytic polishing of a semiconductor which was conducted by Uhlir et al., in 1956 (A. Uhlir, Bell Syst. Tech. J., Vol. 35, pp. 333 (1956)).

Unagami et alo investigated dissolving reaction of Si during anodization and reported that the anodic reaction of Si in an HF solution requires positive holes, and that the reaction is expressed as follows (T. Unagami, J. Electrochem. Soc., Vol. 127, pp. 476 (1980)):

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ + \lambda e^-$$

$$SiF_4 + 2HF \rightarrow H_2SiF_6$$

wherein $e^+$ and $e^-$ respectively denote a positive hole and an electron, and n and $\lambda$ each denotes the number of positive holes required for dissolving one Si atom. Porous Si can be formed when the condition, n>2 or >4, is satisfied.

It is therefore found that positive holes are required for forming porous Si, and that P-type Si can be more easily made porous Si than N-type Si. However, it is also known that N-type Si can be made porous Si if holes are implanted thereto (R. P. Holmstrom and J. Y. Chi. Appl. Phys. Lett., Vol. 42, 386 (1983)).

The density of the porous Si layer can be changed to the range of 1.1 to 0.6 g/cm$^3$ by changing the concentration of the HF solution from 50 to 20%, as compared with the density of 2.33 g/cm$^3$ of monocrystalline Si. The porous Si layer has pores having an average size of about 600 Å which was measured by observation with a transmission electron microscope. Although the porous Si layer has a density which is half or less than that of monocrystalline Si, monocrystallinity is maintained, and a monocrystalline Si layer can be formed on the porous layer by epitaxial growth.

Although the volume of an Si monocrystal is generally increased by 2.2 times by oxidation, the increase in volume can be suppressed by controlling the density of the porous Si so that the occurrence of curvature of a substrate or the occurrence of a crack in a monocrystalline layer remaining on the surface can be avoided during the oxidation process. The volume ratio R of monocrystalline Si to porous Si after oxidation can be expressed as follows:

$$R=2.2 \times (A2.33)$$

wherein A denotes the density of porous Si. If R=1, i.e., there is no increase in volume after oxidation, A=1.06 (g/cm$^3$), and if the density of the porous Si layer is 1.06, the increase in volume can be suppressed.

Since the porous layer contains a large amount of voids formed internally, the density is decreased down to half or less thereof. Consequently, the surface area is greatly increased as compared with the volume, whereby the chemical etching rate is remarkably accelerated, compared with that of the non-porous Si layer.

The present invention utilizes the property of porous Si layer as above described, and is characterized in that a non-porous monocrystalline Si layer having an excellent crystallinity is created on a first Si substrate made porous, or an insulation layer is further created on the non-porous monocrystalline Si layer, the surface of such non-porous monocrystalline Si layer or insulation layer is then bonded on to the surface of an insulation layer for a second Si substrate, and thereafter by removing the first Si substrate made porous with a treatment including at least wet chemical etching, the monocrystalline Si layer having the excellent crystallinity is formed on the bonded insulation layer, and wherein further by removing a part of the second Si substrate or a part of the insulation layer bonded with the second Si substrate, with a treatment including at least wet chemical etching until the insulation surface of bonded insulation layer or the Si monocrystalline face of monocrystalline Si layer is exposed from the face side on which the monocrystalline Si layer of the second Si substrate is not formed (back face side), consecutive thin layer (monocrystalline Si layer) can be left behind without any support member provided directly underneath.

Also, the present invention resides in that after the monocrystalline Si layer having the excellent crystallinity is formed on the insulation layer bonded in the previous process, electronic devices are formed on the monocrystalline Si layer, and by removing a part of the second Si substrate or a part of the insulation layer bonded with the second Si substrate, including a portion directly under the area having the electronic devices formed, at least in part thereof, with a treatment including at least wet chemical etching until the insulation surface of the bonded insulation layer or the Si monocrystalline face of monocrystalline Si layer is exposed from the face side on which the monocrystalline Si layer of the second Si substrate is not formed (back face side), the consecutive thin layer (monocrystalline Si layer) is left behind without any support member provided underneath, and at least a portion directly under a desired area of the monocrystalline Si layer formed with the electronic devices is made transparent to the light so that the light non-transparent substrate is changed to be partly transparent.

With the present invention, by removing only a necessary portion of the light non-transparent substrate after forming the monocrystalline Si layer on the light non-transparent insulation substrate, only the necessary area of the monocrystalline Si layer formed on the light non-transparent substrate can be irradiated by the light, so that it is possible to easily fabricate a light transparent SOI structure quite excellent in the respect of productivity, uniformity, controllability and economy, and having a crystallinity as good as that of monocrystalline wafer without the use of the light transparent substrate represented by the glass.

First, an etching solution suitably used for the present invention will be described below.

FIGS. 4 to 11 show the etching characteristics of hydrofluoric acid, a mixture of hydrofluoric acid and alcohol, a mixture of hydrofluoric acid and hydrogen peroxide, a mixture of hydrofluoric acid, alcohol and hydrogen peroxide, buffered hydrofluoric acid, a mixture of buffered hydrofluoric acid and alcohol, a mixture of buffered hydrofluoric acid and hydrogen peroxide, and a mixture of buffered hydrofluoric acid, alcohol and hydrogen peroxide, respectively, for each of the porous Si and the non-porous Si.

The porous Si was formed by anodizing a monocrystalline Si, and the conditions thereof are shown below. It is to be noted that the starting material for producing porous Si by anodization is not limited to monocrystalline Si and Si of other crystalline structure may be used as the starting material.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 (μm) |
| Porosity: | 50 (%) |

Figure 4:
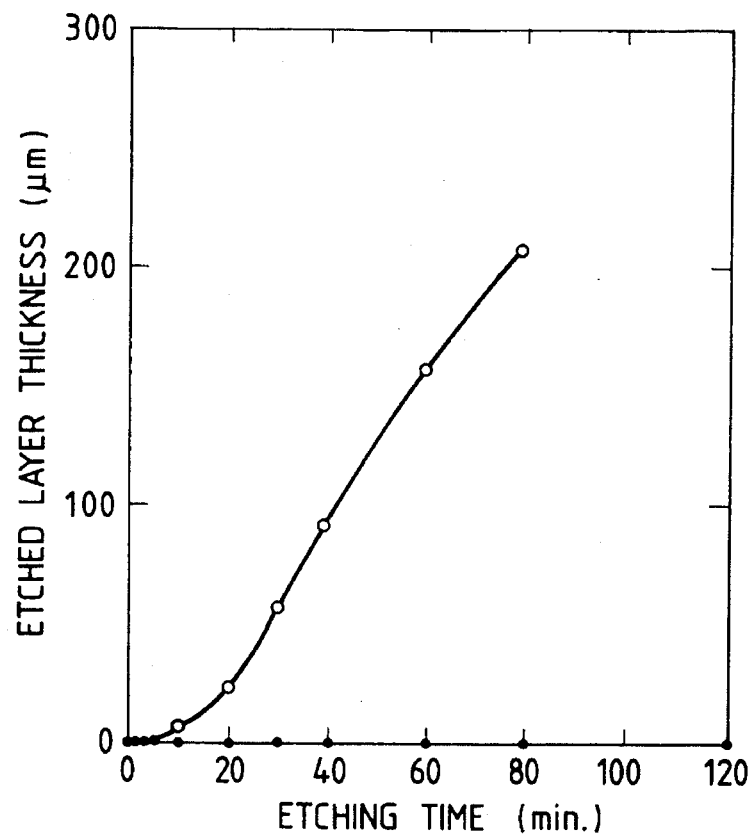
FIGS. 4 to 11 are graphs showing the etching characteristics for the porous silicon and the non-porous silicon.

FIG. 4 shows the etching time dependency of etched thickness of porous Si and monocrystalline Si when the porous Si and the non-porous monocrystalline Si are etched by being immersed in hydrofluoric acid and agitated.

The porous Si thus prepared under the above conditions was immersed in 49% hydrofluoric acid solution (white circles) at room temperature and agitated. The reduction in the thickness of the porous Si was then measured. The porous Si was rapidly etched: namely, by a layer thickness of 90 μm in 40 minutes, and further 205 μm in 80 minutes, with high degrees of surface quality and uniformity. The etching rate has dependencies on the concentration of the etching solution and the temperature.

The monocrystalline Si having a thickness of 500 μm was immersed in 49% hydrofluoric acid solution (black circles) at the room temperature and agitated. The reduction in the thickness of the monocrystalline Si was then measured. The monocrystalline Si was only etched to 60 Å or less after elapse of 80 minutes.

Figure 5:
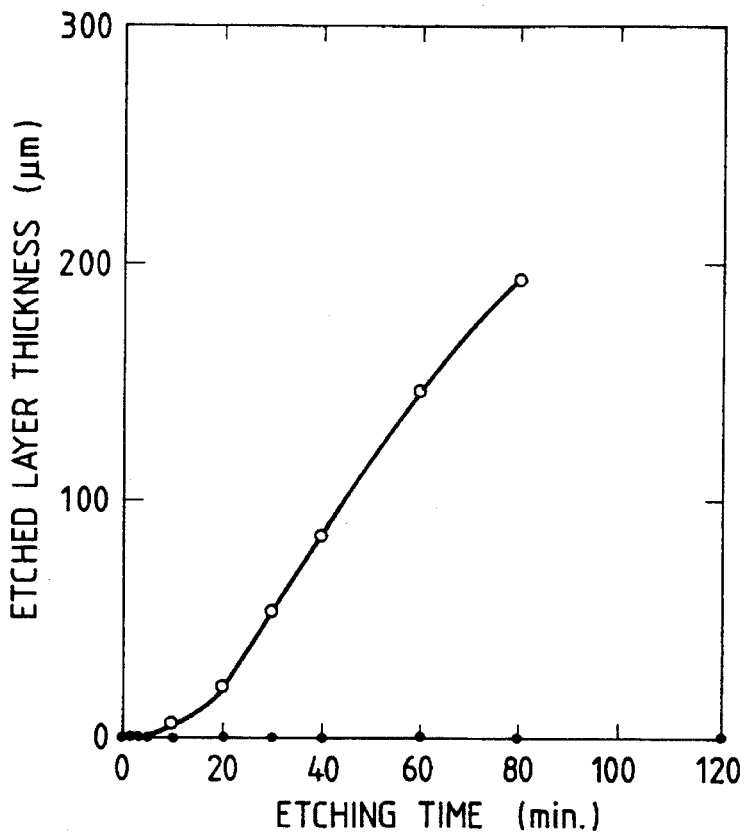

FIG. 5 shows the etching time dependency of etched thickness of porous Si and monocrystalline Si when the porous Si and the non-porous monocrystalline Si are etched by being immersed in a mixture of hydrofluoric acid and alcohol without agitation.

The porous Si thus prepared under the above conditions was immersed in a mixture solution (10:1) of 49% hydrofluoric acid alcohol (white circles) at the room temperature without agitation. The reduction in the thickness of the porous Si was then measured. The porous Si was rapidly etched: namely, by a layer thickness of 85 μm in 40 minutes, and further 195 μm in 80 minutes, with high degrees of surface quality and uniformity. The etching rate has dependencies on the concentration of the etching solution and the temperature.

In particular, the addition of alcohol serves to remove bubbles of reaction product gases generated as a result of the etching without delay from the surface being etched, without necessitating agitation, thus ensuring a high efficiency and uniformity of the etching.

The monocrystalline Si having a thickness of 500 μm was immersed in a mixture solution (10:1) of 49% hydrofluoric acid and alcohol (black circles) at the room temperature without agitation. The reduction in the thickness of the monocrystalline Si was then measured. The monocrystalline Si was only etched to 60 Å or less after a lapse of 80 minutes.

Figure 6:
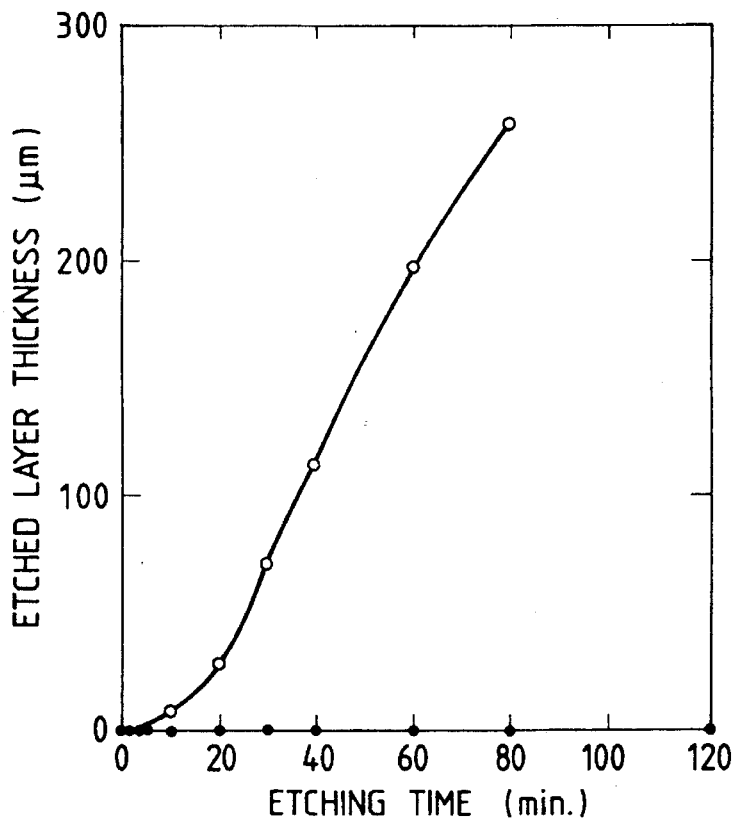

FIG. 6 shows the etching time dependency of etched thickness of porous Si and monocrystalline Si as observed when the porous Si and the non-porous monocrystalline Si are etched by being immersed in a mixture solution of hydrofluoric acid and hydrogen peroxide and agitated.

The porous Si thus produced under the above conditions was immersed in a mixture solution (1:5) of 49% hydrofluoric acid and 30% hydrogen peroxide (white circles) at the room temperature and agitated. The reduction in the thickness of the porous Si was then measured. The porous Si was rapidly etched: namely, by a layer thickness of 112 μm in 40 minutes, and further 256 μm in 80 minutes, with high degrees of surface quality and uniformity. The etching rate has dependencies on the concentration of the etching solution and the temperature.

In particular, the addition of hydrogen peroxide serves to accelerate oxidation of silicon, thus enhancing the reaction speed as compared to the case where hydrogen peroxide is not added. Furthermore, the reaction speed can be controlled by changing the ratio of the hydrogen peroxide.

The monocrystalline Si having a thickness of 500 μm was immersed in a mixture solution (5:1) of 49% hydrofluoric acid and 30% hydrogen peroxide (black circles) at the room temperature and agitated. The reduction in the thickness of the monocrystalline Si was then measured. The monocrystalline Si was only etched to 60 Å or less after a lapse of 80 minutes.

Figure 7:
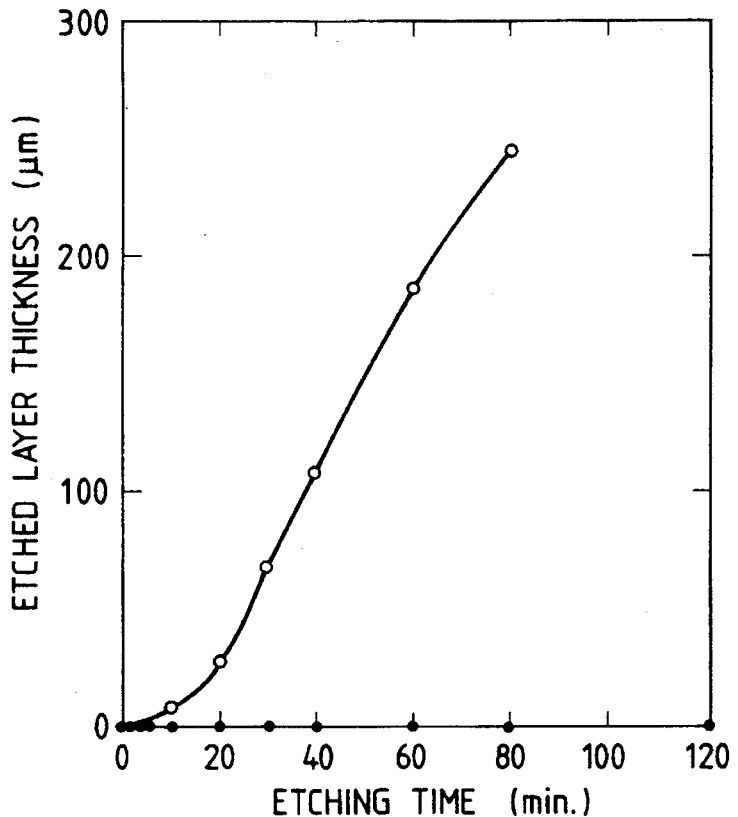

FIG. 7 shows the etching time dependency of etched thickness of porous Si and monocrystalline Si as observed when the porous Si and the non-porous monocrystalline Si are etched by being immersed in a mixture solution of hydrofluoric acid, alcohol and hydrogen peroxide without agitation.

The porous Si thus produced under the above conditions was immersed in a mixture solution (10:6:50) of 49% hydrofluoric acid, alcohol and 30% hydrogen peroxide (white circles) at the room temperature without agitation. The reduction in the thickness of the porous Si was then measured. The porous Si was rapidly etched: namely, by a layer thickness of 106 μm in 40 minutes, and further 244 μm in 80 minutes, with high degrees of surface quality and uniformity. The etching rate has dependencies on the concentration of the etching solution and the temperature.

In particular, the addition of alcohol serves to remove bubbles of reaction product gases generated as a result of the etching instantaneously from the surface being etched, without necessitating agitation, thus ensuring a high efficiency and uniformity of the etching.

In particular, the addition of hydrogen peroxide serves to accelerate oxidation of silicon, thus enhancing the reaction speed as compared to the case where hydrogen peroxide is not added. Furthermore, the reaction speed can be controlled by changing the ratio of the hydrogen peroxide.

The monocrystalline Si having a thickness of 500 μm was immersed in a mixture solution (10:6:50) of 49% hydrofluoric acid, alcohol and 30% hydrogen peroxide (black circles) at the room temperature without agitation. The reduction in the thickness of the monocrystalline Si was then measured. The monocrystalline Si was only etched to 60 Å or less after a lapse of 80 minutes.

Figure 8:
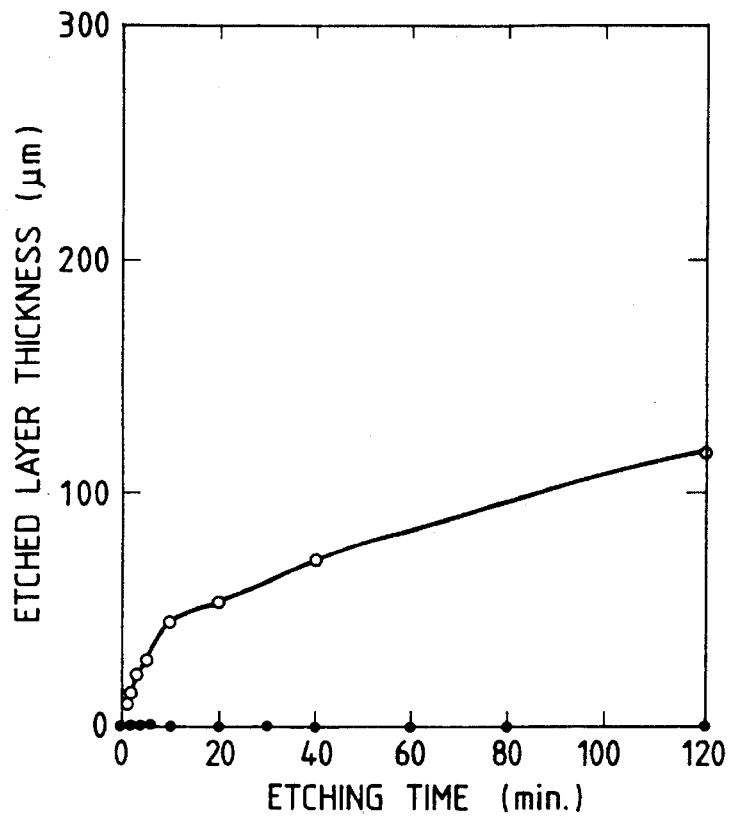

FIG. 8 shows the etching time dependency of etched thickness of porous Si and monocrystalline Si as observed when the porous Si and the non-porous monocrystalline Si are etched by being immersed in buffered hydrofluoric acid and agitated.

The porous Si prepared under the above conditions was immersed in the buffered hydrofluoric acid (4.5% HF+36%NH$_4$F+H$_2$O) (white circles) at the room temperature and agitated. The reduction in the thickness of the porous Si was then measured. The porous Si was rapidly etched: namely, by a layer thickness of 70 μm in 40 minutes, and further 140 μm in 120 minutes, with high degrees of surface quality and uniformity. The etching rate has dependencies on the concentration of the etching solution and the temperature.

The monocrystalline Si having a thickness of 500 μm was immersed in the buffered hydrofluoric acid (4.5% HF+36%NH$_4$F+H$_2$O) (black circles) at the room temperature and agitated. The reduction in the thickness of the monocrystalline Si was then measured. The monocrystalline Si was only etched to 100 Å or less after a lapse of 120 minutes.

Figure 9:
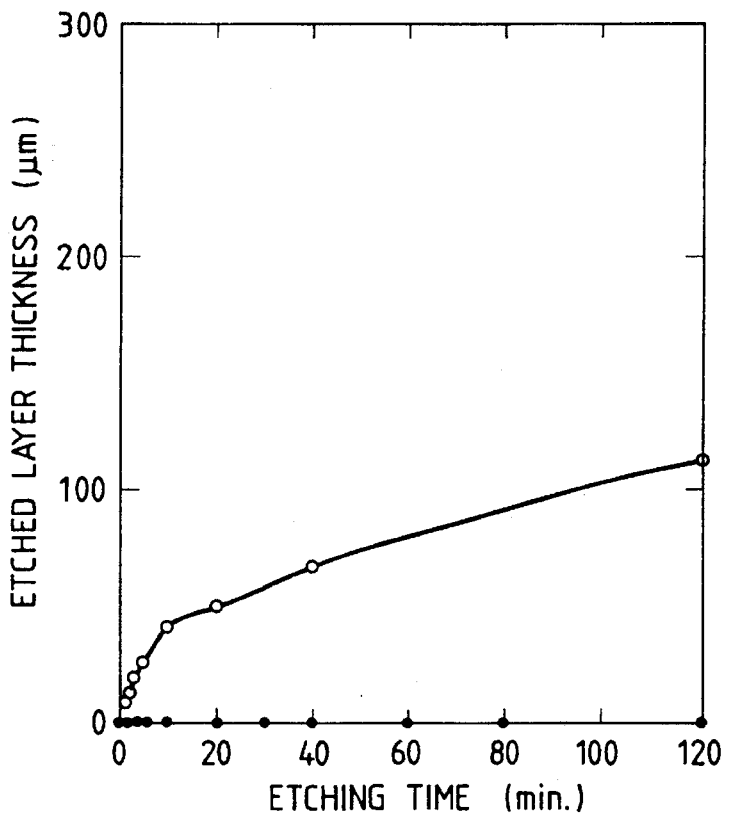

FIG. 9 shows the etching time dependency of etched thickness of porous Si and monocrystalline Si as observed when the porous Si and the non-porous monocrystalline Si are etched by being immersed in a mixture solution of buffered hydrofluoric acid and alcohol without agitation.

The porous Si prepared under the above conditions was immersed, without agitation, in a mixture solution (10:1) of buffered hydrofluoric acid (4.5% HF+36%NH$_4$F+H$_2$O) and alcohol (white circles) at the room temperature. The reduction in the thickness of the porous Si was then measured. The porous Si was rapidly etched: namely, by a layer thickness of 67 μm in 40 minutes, and further 112 μm in 120 minutes, with high degrees of surface quality and uniformity. The etching rate has dependencies on the concentration of the etching solution and the temperature.

In particular, the addition of alcohol serves to remove bubbles of reaction product gases generated as a result of the etching instantaneously from the surface being etched, without necessitating agitation, thus ensuring a high efficiency and uniformity of the etching for the porous Si.

The monocrystalline Si having a thickness of 500 μm was immersed in a mixture solution (10:1) of the buffered hydrofluoric acid (4.5% HF+36% NH$_4$F+H$_2$O) and alcohol (black circles) at the room temperature without agitation. The reduction in the thickness of the monocrystalline Si was then measured. The monocrystalline Si was only etched to 100 Å or less after elapse of 120 minutes.

Figure 10:
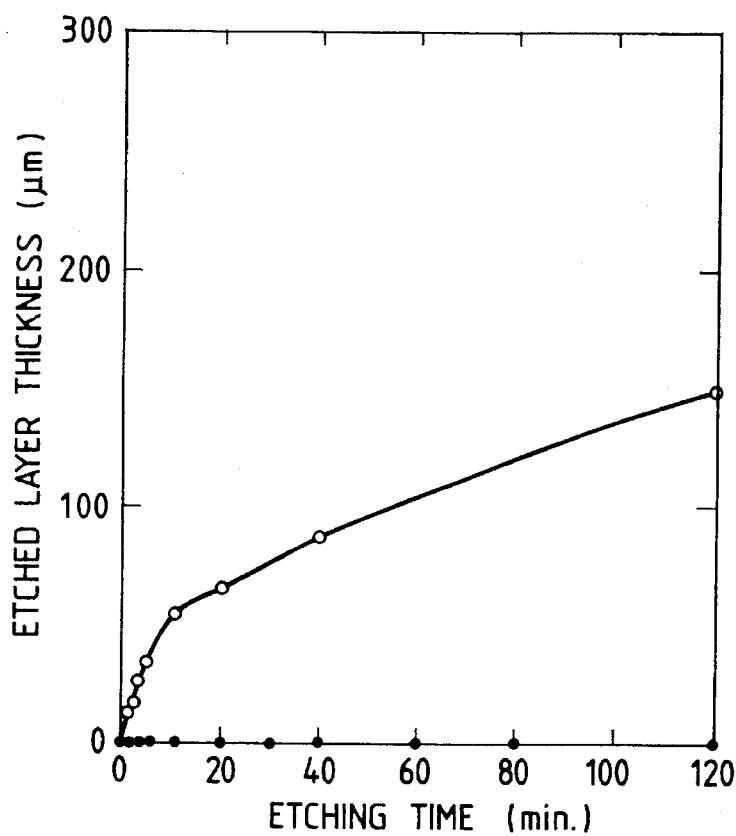

FIG. 10 shows the etching time dependency of etched thickness of porous Si and monocrystalline Si as observed when the porous Si and the non-porous monocrystalline Si are etched by being immersed in a mixture solution of buffered hydrofluoric acid and hydrogen peroxide and agitated.

The porous Si prepared under the above conditions was immersed in a mixture solution (1:5) of buffered hydrofluoric acid (4.5% HF+36% $NH_4F+H_2O$) and 30% hydrogen peroxide (white circles) at the room temperature and agitated. The reduction in the thickness of the porous Si was then measured. The porous Si was rapidly etched: namely, by a layer thickness of 88 μm in 40 minutes, and further 147 μm in 120 minutes, with high degrees of surface quality and uniformity. The etching rate has dependencies on the concentration of the etching solution and the temperature.

In particular, the addition of hydrogen peroxide serves to accelerate oxidation of silicon, thus enhancing the reaction speed as compared to the case where hydrogen peroxide is not added. Furthermore, the reaction speed can be controlled by changing the ratio of the hydrogen peroxide.

The monocrystalline Si having a thickness of 500 μm was immersed in a mixture solution (1:5) of buffered hydrofluoric acid (4.5% HF+36% $NH_4F+H_2O$) and 30% hydrogen peroxide (black circles) at the room temperature and agitated. The reduction in the thickness of the monocrystalline Si was then measured. The monocrystalline Si was only etched to 100 Å or less after elapse of 120 minutes.

Figure 11:
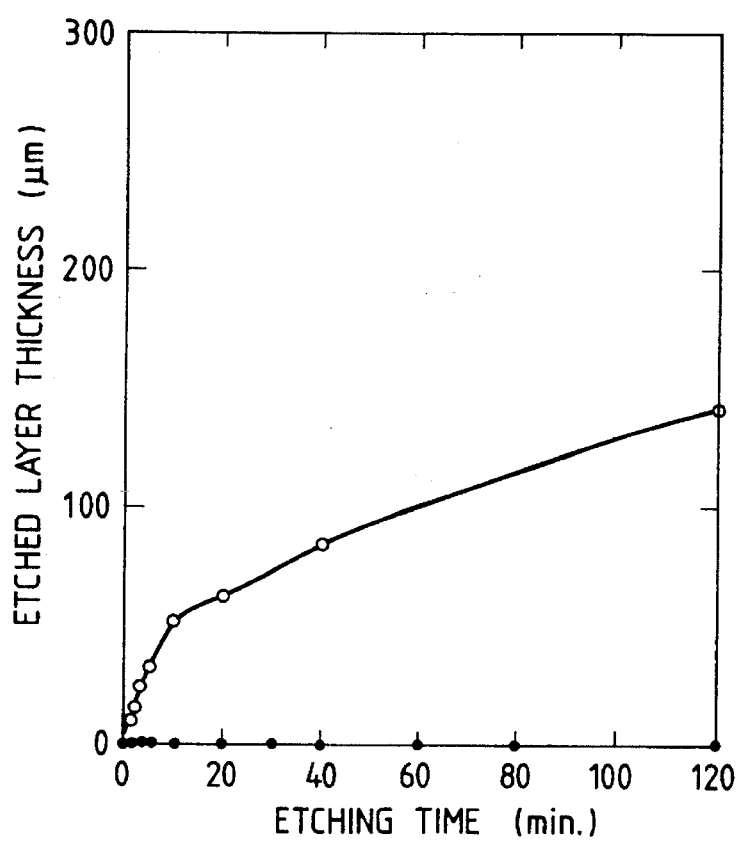

FIG. 11 shows the etching time dependency of etched thickness of porous Si and non-porous monocrystalline Si as observed when the porous Si and the monocrystalline Si are etched by being immersed in a mixture solution of buffered hydrofluoric acid, alcohol and hydrogen peroxide without agitation.

The porous Si prepared under the above conditions was immersed, without agitation, in a mixture solution (10:6:50) of buffered hydrofluoric acid (4.5% HF+36% $NH_4F+H_2O$), alcohol and 30% hydrogen peroxide (white circles) at the room temperature. The reduction in the thickness of the porous Si was then measured. The porous Si was rapidly etched: namely, by a layer thickness of 83 μm in 40 minutes, and further 140 μm in 120 minutes, with high degrees of surface quality and uniformity. The etching rate has dependencies on the concentration of the etching solution and the temperature.

In particular, the addition of alcohol serves to remove bubbles of reaction product gages generated as a result of the etching instantaneously from the surface being etched, without necessitating agitation, thus ensuring a high efficiency and uniformity of the etching for the porous Si.

In particular, the addition of hydrogen peroxide serves to accelerate oxidation of silicon, thus enhancing the reaction speed as compared to the case where hydrogen peroxide is not added. Furthermore, the reaction speed can be controlled by changing the ratio of the hydrogen peroxide.

The monocrystalline Si having a thickness of 500 μm was immersed in a mixture solution (10:6:50) of buffered hydrofluoric acid (4.5% HF+36% $NH_4F+H_2O$), alcohol and 30% hydrogen peroxide (black circles) at the room temperature without agitation. The reduction in the thickness of the monocrystalline Si was then measured. The monocrystalline Si was only etched to 100 Å or less after a lapse of 120 minutes.

The porous Si and monocrystalline Si after being etched in the etching solution as above described were then rinsed with water and the surfaces after the rinsing were examined by microanalysis using secondary ions but no impurity was detected.

Although the solution concentration of hydrogen peroxide was 30% herein, it can be set to fall within the range of not impairing an appreciable effect of the addition of hydrogen peroxide and having no practical inconvenience in commercial production.

The conditions for the concentration of etching solution of the temperature can be set to fall within the ranges in which an appreciable effect of hydrofluoric acid, buffered hydrofluoric acid, hydrogen peroxide and alcohol is provided, and the etching rate would cause no practical inconvenience in commercial production.

Although the solution concentration as previously described and the room temperature are mentioned as an instance, the present invention is not limited to such conditions.

The HF concentration with respect to the etching solution preferably ranges between 1% and 95%, more preferably between 5% and 90%, and most preferably between 5% and 80%.

The HF concentration in the buffered hydrofluoric acid with respect to the etching solution preferably ranges between 1% and 95%, more preferably between 1% and 85%, and most preferably between 1% and 70%, and the $NH_4F$ concentration in the buffered hydrofluoric acid with respect to the etching solution preferably ranges between 1% and 95%, more preferably between 5% and 90%, and most preferably between 5% and 80%.

The $H_2O_2$ concentration with respect to the etching solution preferably ranges between 1% and 95%, more preferably between 5% and 90%, and most preferably between 10% and 80%, and is determined so as to provide an appreciable effect of hydrogen peroxide.

The alcohol concentration with respect to the etching solution is preferably 80% or less, more preferably 60% or less, and is determined so as to provide an appreciable effect of alcohol.

The temperature is set in a range of preferably 0 to 100° C., more preferably 5° to 80° C., and most preferably 5° to 60° C.

The alcohol for use in this invention may be ethyl alcohol, and other alcohols such as isopropyl alcohol, which does not cause any inconvenience in the commercial production and which can provide an appreciable effect of addition of such alcohol.

Next, a method will be described in which after the substrate is made porous, the monocrystal is grown epitaxially.

Figure 12A:
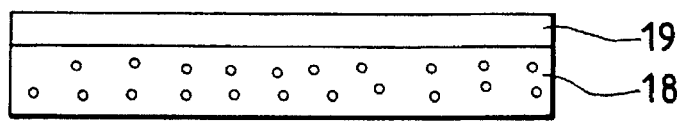
FIGS. 12A to 12E are schematic views for explaining a fabrication process of a semiconductor optical member according to an embodiment of the present invention.

As shown in FIG. 12A, first preparing an Si monocrystalline substrate, the whole substrate is made porous by anodization using an HF solution to form a porous monocrystalline Si substrate 18. With any of a variety of growth methods, the surface of porous substrate is grown epitaxially to form a thin film monocrystalline layer 19.

Figure 12B:
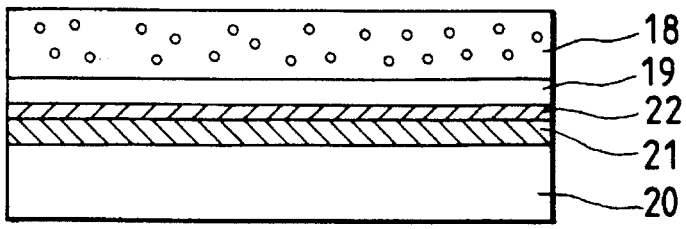

As shown in FIG. 12B, preparing another Si substrate 20, an insulation layer 21 is formed on the surface thereof, and then the Si substrate having the insulation layer 21 on the surface is bonded on to the surface of insulation layer 22 formed on the monocrystalline Si layer of the porous Si substrate. This bonding process is performed by placing cleaned surfaces thereof into contact with each other, and then heating two substrates in an oxidation atmosphere or a nitrogen atmosphere. The insulation layer 22 is formed to reduce the interfacial level of the monocrystalline layer 19 which is a final active layer, although the insulation layer 22 is not necessarily required in the application such as micro mechanics which is not involved in the interfacial level.

Figure 12C:
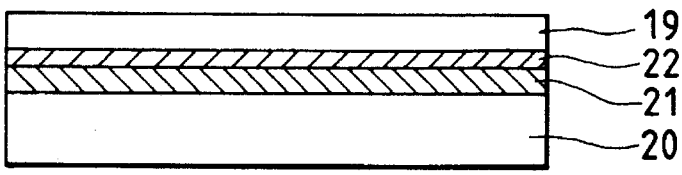

As shown in FIG. 12C, the entire porous Si substrate 18 is subjected to electroless wet chemical etching for only the porous Si by using a selective etching solution for the porous Si so as to leave a monocrystalline Si layer 19 which is made a thinner film on the insulation layers 21, 22. With this process, the monocrystalline Si layer 19 having the same crystallinity as that of silicon wafer is formed on the Si substrate 20 via the insulation layers 21, 22, in the form of a flat and uniform thin film, and over the entire area of the wafer with a large area.

Figure 12D:
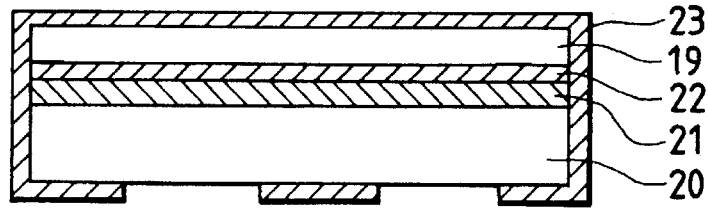

Then, as shown in FIG. 12D, after all the substrate is covered with an anti-etching film 23, except for a back face area which is to be made light-transparent, the Si substrate 20 or the Si substrate 20 and insulation layers 21, 22 are removed by etching, until an insulating surface of the insulation layer 21 or a monocrystalline surface of the monocrystalline Si layer 19 is exposed through the opening portion. This embodiment shows an instance where only the Si substrate 20 is removed by etching as shown in FIG. 12E.

Figure 12E:
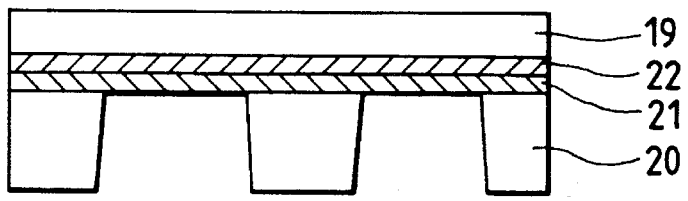

As shown in FIG. 12E, after the anti-etching film 23 is peeled off, the monocrystalline Si layer 19 having the same crystallinity as that of silicon wafer is formed on the Si substrate 20 which is partially made light-transparent and the insulation layers 21, 22, in the form of a flat and uniform thin film, and over the entire wafer with a large area.

There is no support member provided directly under a membrane (monocrystalline Si layer or monocrystalline Si layer and insulation layers) on the surface of light-transparent area.

A method of forming an electronic device on the monocrystalline semiconductor layer before making the above-described substrate light-transparent will be described below.

Figure 13A:
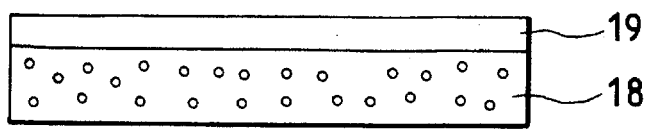
FIGS. 13A to 15G are schematic views for explaining a fabrication process of a semiconductor optical member according to another embodiment of the present invention.

As shown in FIG. 13A, first preparing an Si monocrystalline substrate, the whole substrate is made porous by anodization using an HF solution to form a porous monocrystalline Si substrate 18. With any of a variety of growth methods, the surface of porous substrate is grown epitaxially to form a thin film monocrystalline layer 19.

Figure 13B:
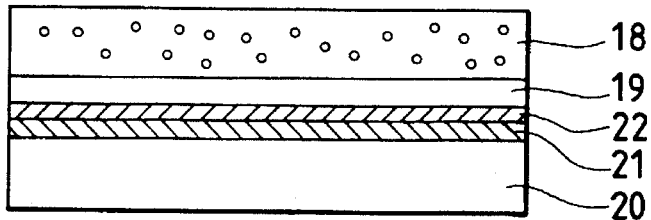

As shown in FIG. 13B, preparing another Si substrate 20, an insulation layer 21 is formed on the surface thereof, and then the Si substrate having the insulation layer 21 on the surface is bonded on to the surface of insulation layer 22 formed on the monocrystalline Si layer of the porous Si substrate. This bonding process is performed by placing cleaned surfaces thereof into contact with each other, and then heating two substrates in an oxidation atmosphere or a nitrogen atmosphere. The insulation layer 22 is formed to reduce the interfacial level of the monocrystalline layer 19 which is a final active layer, although the insulation layer 22 is not necessarily required in the application such as micromechanics which is not involved in the interfacial level.

Figure 13C:
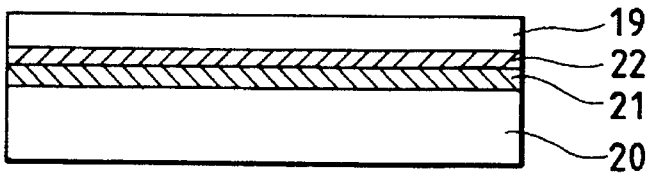

As shown in FIG. 13C, the entire porous Si substrate 18 is subjected to electroless wet chemical etching for only the porous Si by using a selective etching solution for the porous Si so as to leave a monocrystalline Si layer 19 which is made a thinner film on the insulation layers 21, 22. With this process, the monocrystalline Si layer 19 having the same crystallinity as that of silicon wafer is formed on the Si substrate 20 via the insulation layers 21, 22, in the form of a flat and uniform thin film, and over the entire area of the wafer with a large area.

Figure 13D:
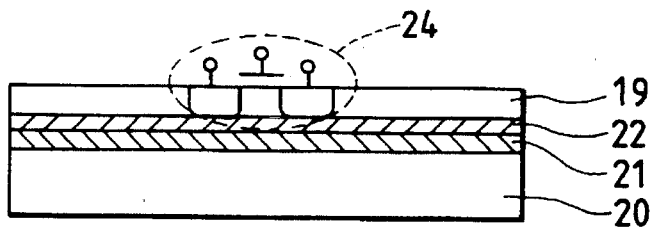
Figure 13E:
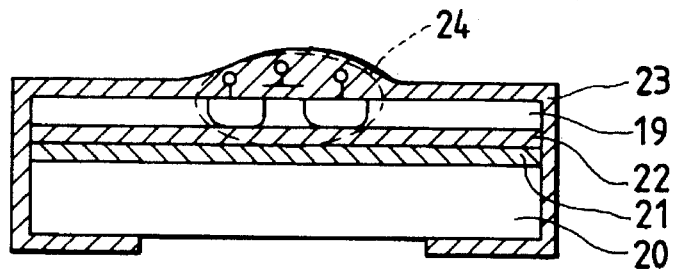

Herein, electronic devices such as transistor, diode, capacitor and resistor, and an integrated circuit thereof are formed on the monocrystalline Si layer 19, as shown in FIG. 13D.

Then, as shown in FIG. 13D, after all the substrate is covered with an anti-etching film 23, except for a back face area which is to be made light-transparent, the Si substrate 20 or the Si substrate 20 and insulation layers 21, 22 are removed by etching, until an insulating surface of the insulation layer 21 or a monocrystalline surface of the monocrystalline Si layer 19 is exposed through the opening portion. In the area which is made light-transparent were included at least one or more electronic devices. This embodiment shows an instance where only the Si substrate 20 is removed by etching as shown in FIG. 13F.

Figure 13F:
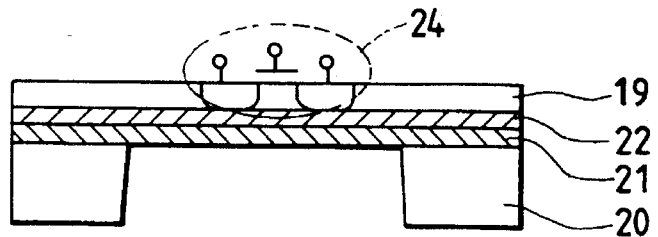

As shown in FIG. 13F, after the anti-etching film 23 is peeled off, the monocrystalline Si layer 19 formed on the Si substrate 20 which is partially made light-transparent and the insulation layers 21, 22 is formed with electronic devices, and is light-transparent.

There is no support member provided directly under a membrane (monocrystalline Si layer or monocrystalline Si layer and insulation layers) on the surface of a light-transparent area into which electronic devices are incorporated.

Next, a method will be described in which the monocrystalline layer is formed before being made porous, and only the substrate is made porous selectively by anodization.

Figure 14A:
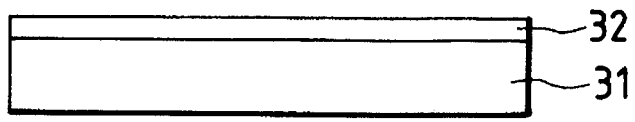

First, as shown in FIG. 14A, a low impurity density layer 32 is formed by epitaxial growth with any of a variety of thin film growth methods. Or an N-type monocrystalline layer 32 is formed by implanting proton ions into the surface of a P-type Si monocrystalline substrate 31.

Figure 14B:
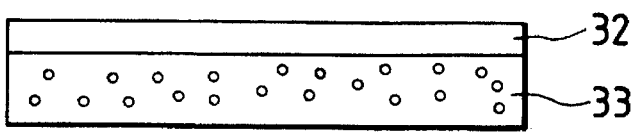

Then, as shown in FIG. 14B, the P-type Si monocrystalline substrate 31 is changed into a porous monocrystalline Si substrate 33 from a back face thereof by anodization using an HF solution.

Figure 14C:
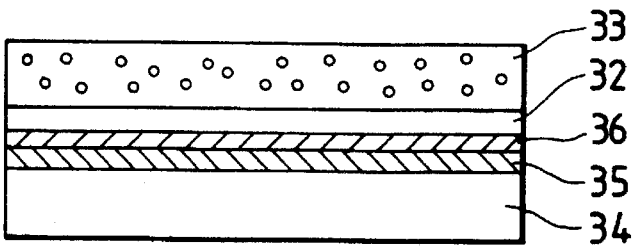

As shown in FIG. 14C, preparing another Si substrate 34, an insulation layer 35 is formed on the surface thereof, and then the Si substrate having the insulation layer 35 on the surface is bonded on to the surface of insulation layer 36 formed on the monocrystalline Si layer of the porous Si substrate. This bonding process is performed by placing cleaned surfaces thereof into contact with each other, and then heating two substrates in an oxidation atmosphere or a nitrogen atmosphere. The insulation layer 36 is formed to reduce the interfacial level of the monocrystalline layer 32 which is a final active layer, although the insulation layer 36 is not necessarily required in the application such as micromechanics which is not involved in the interfacial level.

Figure 14D:
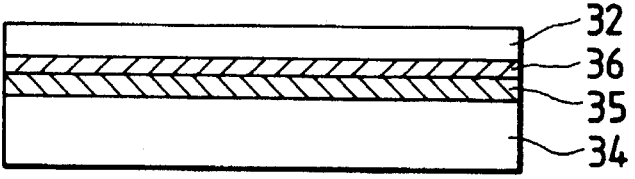

As shown in FIG. 14D, the entire porous Si substrate 33 is subjected to electroless wet chemical etching for only the porous Si by using a selective etching solution for the porous Si so as to leave a monocrystalline Si layer 32 which is made a thinner film on the insulation layers 35, 36. With this process, the monocrystalline Si layer 32 having the same crystallinity as that of silicon wafer is formed on the Si substrate 34 and the insulation layers 35, 36, in the form of a flat and uniform thin film, and over the entire surface of wafer with a large area.

Figure 14E:
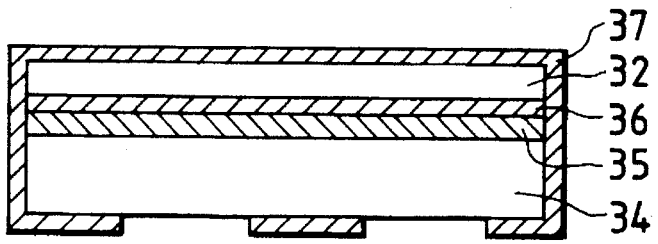

Next, as shown in FIG. 14E, after all the substrate is covered with an anti-etching film 37, except for a back face area which is to be made light-transparent, the Si substrate 34 or the Si substrate 34 and insulation layers 35, 36 are removed by etching, until an insulating surface of the insulation layer 35 or a monocrystalline surface of the monocrystalline Si layer 32 is exposed through the opening portion. This embodiment shows an instance where only the Si substrate 34 is removed by etching as shown in FIG. 14F.

Figure 14F:
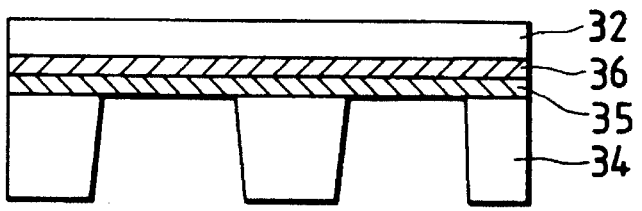

As shown in FIG. 14F, after the anti-etching film 37 is peeled off, the monocrystalline Si layer 32 having the same crystallinity as that of silicon wafer is formed on the Si substrate 34 which is partially made light-transparent and the insulation layers 35, 36 in the form of a flat and uniform thin film, and over the entire surface of wafer with a large area.

There is no support member provided directly under a membrane (monocrystalline Si layer or monocrystalline Si layer and insulation layers) on the surface of a light-transparent area.

Next, a method will be described in which electronic devices are formed on the monocrystalline semiconductor layer before the substrate is made light-transparent.

Figure 15A:
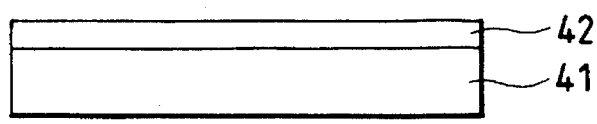

First, as shown in FIG. 15A, a low impurity density layer 42 is formed by epitaxial growth with any of a variety of thin film growth methods. Or an N-type monocrystalline layer 42 is formed by implanting proton ions into the surface of a P-type Si monocrystalline substrate 41.

Figure 15B:
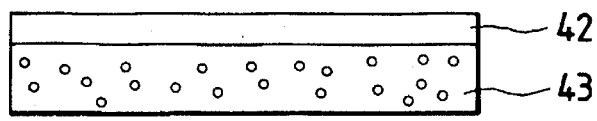

Then, as shown in FIG. 15B, the P-type Si monocrystalline substrate 41 is changed into a porous monocrystalline Si substrate 43 from a back face thereof by anodization using an HF solution.

Figure 15C:
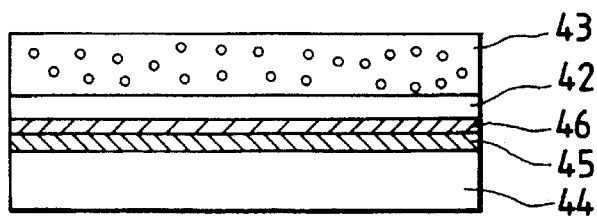

As shown in FIG. 15C, preparing another Si substrate 44, an insulation layer 45 is formed on the surface thereof, and then the Si substrate having the insulation layer 45 on the surface is bonded on to the surface of insulation layer 46 formed on the monocrystalline Si layer of the porous Si substrate. This bonding process is performed by placing cleaned surfaces thereof into contact with each other, and then heating two substrates in an oxidation atmosphere or a nitrogen atmosphere. The insulation layer 46 is formed to reduce the interfacial level of the monocrystalline layer 42 which is final active layer, although the insulation layer 46 is not necessarily required in the application such as micromechanics which is not involved in the interfacial level.

Figure 15D:
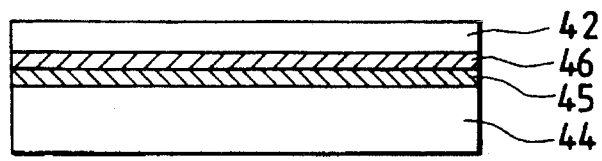

As shown in FIG. 15D, the entire porous Si substrate 43 is subjected to electroless wet chemical etching for only the porous Si by using a selective etching solution for the porous Si so as to leave a monocrystalline Si layer 42 which is made a thinner film on the insulation layers 45, 46. With this process, the monocrystalline Si layer 42 having the same crystallinity as that of silicon wafer is formed on the Si substrate 44 via the insulation layers 45, 46, in the form of a flat and uniform thin film, and over the entire surface of wafer with a large area.

Figure 15E:
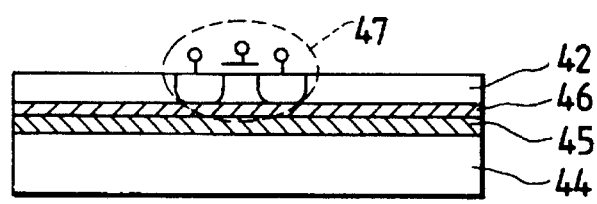

Herein, as shown in FIG. 15E, electronic devices such as transistor, diode, capacitor and resistor or an integrated circuit 47 are formed on the monocrystalline Si layer 42.

Figure 15F:
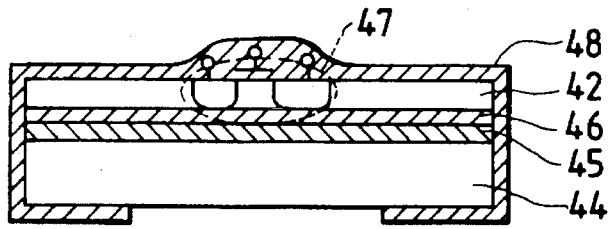

Then, as shown in FIG. 15F, after all the substrate is covered with an anti-etching film 48, except for a back face area which is to be made light-transparent, the Si substrate 44 or the Si substrate 44 and insulation layers 45, 46 are removed by etching, until an insulating surface of the insulation layer 45 or a monocrystalline surface of the monocrystalline Si layer 42 is exposed through the opening portion. In the light-transparent area were included at least one or more electronic devices. This embodiment shows an instance where only the Si substrate 44 is removed by etching as shown in FIG. 15G.

Figure 15G:
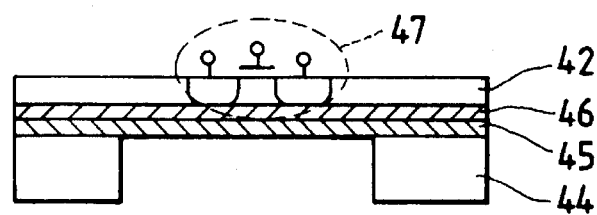

As shown in FIG. 15G, after the anti-etching film 48 is peeled off, the monocrystalline Si layer 42 is formed with electronic devices via the insulation layers 45, 46 on the Si substrate 44 which has been made light-transparent partially, and is a light-transparent type.

There is no support member provided directly under a membrane (monocrystalline Si layer or monocrystalline Si layer and insulation layers) on the surface of a light-transparent area into which electronic devices are incorporated.

Another method for fabricating a semiconductor substrate will be described below.

First, an Si monocrystalline substrate is prepared and made porous by anodization using an HF solution. The density of monocrystalline Si is 2.33 g/cm$^3$, but the density of porous Si substrate can be changed to the range of 0.6 to 1.1 g/cm$^3$ by changing the concentration of the HF solution from 10 to 50 wt %. This porous layer is easily formed into P-type Si substrate for the above-mentioned reason.

The density of the porous layer is decreased to half or less thereof, because a large amount of voids are formed internally. Consequently, the surface area is greatly increased as compared with the volume, so that the chemical etching rate is significantly accelerated as compared with the normal etching rate for the monocrystalline layer.

The conditions for making the monocrystalline Si porous by anodization will be shown. It is to be noted that the starting material for producing porous Si by anodization is not limited to monocrystalline Si and Si of other crystalline structure may be also used.

| | |
|---|---|
| Voltage applied: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 (μm) |
| Porosity: | 56 (%) |

Si is grown epitaxially on the porous Si substrate thus formed to form a monocrystalline Si thin film. The thickness of the monocrystalline Si thin film is preferably 50 μm or less, and more preferably 20 μm or less.

Next, after the surface of the monocrystalline Si thin film is oxidized, a substrate which will constitute the final substrate is prepared, and an oxide film on the surface of the monocrystalline Si and the above-mentioned substrate are bonded. Or a newly prepared monocrystalline Si wafer is oxidized on the surface thereof, and then bonded with the monocrystalline Si layer of the porous Si wafer. The reason for the necessity of the oxide film between the substrate and the monocrystalline Si layer is that when the glass is used as the substrate, for example, the interfacial level occurring from an underlayer interface of Si active layer can be made lower on the oxide film interface than on the above glass interface, so that the characteristics of electronic device can be remarkably improved. It should be noted herein that the present invention requires such insulation layer of oxide film as above mentioned, because of its use of a semiconductor or electrical conductor on the substrate to control the back face potential. Further, the monocrystalline Si thin film formed by removing porous Si substrate by selective etching as will be described later may be bonded on to a new substrate. The two surfaces are bonded strong enough not to be peeled off easily by virtue of a van der Waals force only by making respective surfaces contact at the room temperature after washing, and further completely bonded by heat treatment at a temperature from 200° C. to 900° C., and preferably from 600° C. to 900° C., in a nitrogen atmosphere.

Subsequently, an Si$_3$N$_4$ layer is formed by deposition as an anti-etching film to cover the entire member composed of the two bonded substrates, and the Si$_3$N$_4$ layer on the surface of porous Si substrate is only removed. In place of the Si$_3$N$_4$ layer, Apiezon Wax may be used. Then, by removing all the porous Si substrate by etching means, a semiconductor substrate having a thin film monocrystalline Si layer can be obtained.

A selective etching method will be described in which only this porous Si substrate is subjected to electroless wet etching.

Suitable for use as the etching solution which has no etching action on the crystalline Si, and is capable of making the selective etching for the porous Si only are hydrofluoric acid, buffered hydrofluoric acid containing ammonium fluoride ($NH_4F$) and hydrogen fluoride (HF), a mixture solution of hydrofluoric acid or buffered hydrofluoric acid with hydrogen peroxide, a mixture solution of hydrofluoric acid or buffered hydrofluoric acid with alcohol, and a mixture solution of hydrofluoric acid or buffered hydrofluoric acid with hydrogen peroxide and alcohol. The bonded substrates are etched by being immersed in such a solution. The etching rate depends on the concentration and the temperature of buffered hydrofluoric acid and hydrogen peroxide. The addition of hydrogen peroxide serves to accelerate oxidation of Si, thus enhancing the reaction speed as compared to the case where hydrogen peroxide is not added. Further, the reaction speed can be controlled by changing the ratio of hydrogen peroxide. In addition, alcohol serves to remove, without delay, bubbles of the reaction product gases generated as a result of the etching without requiring agitation from the surface being etched, thus ensuring the etching of porous Si with high degrees of uniformity and efficiency.

The HF concentration in the buffered hydrofluoric acid with respect to the etching solution preferably ranges between 1 and 95 wt %, more preferably between 1 and 85 wt %, and most preferably between 1 and 70 wt %, and the $NH_4F$ concentration in the buffered hydrofluoric acid with respect to the etching solution preferably ranges between 1 and 95 wt %, more preferably between 5 and 90 wt %, and most preferably between 5 and 80 wt %.

The HF concentration with respect to the etching solution preferably ranges between 1 and 95 wt %, more preferably between 5 and 90 wt %, and most preferably between 5 and 80 wt %.

The $H_2O_2$ concentration with respect to the etching solution preferably ranges between 1 and 95 wt %, more preferably between 5 and 90 wt %, and most preferably between 10 and 80 wt %, and is determined so as to provide an appreciable effect of hydrogen peroxide.

The alcohol concentration with respect to the etching solution is preferably 80 wt % or less, more preferably 60 wt % or less, and most preferably 40 wt % or less, and is determined so as to provide an appreciable effect of alcohol.

The temperature is set in a range of preferably 0° to 100° C., more preferably 5° to 80° C., and most preferably 5° to 60° C.

The alcohol for use in this invention may be ethyl alcohol, and other alcohols such as isopropyl alcohol, which does not cause any inconvenience in the commercial production and which can provide an appreciable effect of addition of such alcohol.

The semiconductor substrate thus obtained has the same monocrystalline Si layer as that of normal Si wafer in the form of flat and uniform thin film, and over the entire surface of substrate with a large area.

In the present invention, using a substrate formed with the monocrystalline Si layer as above described, a liquid crystal display unit is made up by forming a circuit in the normal method.

Figure 16:
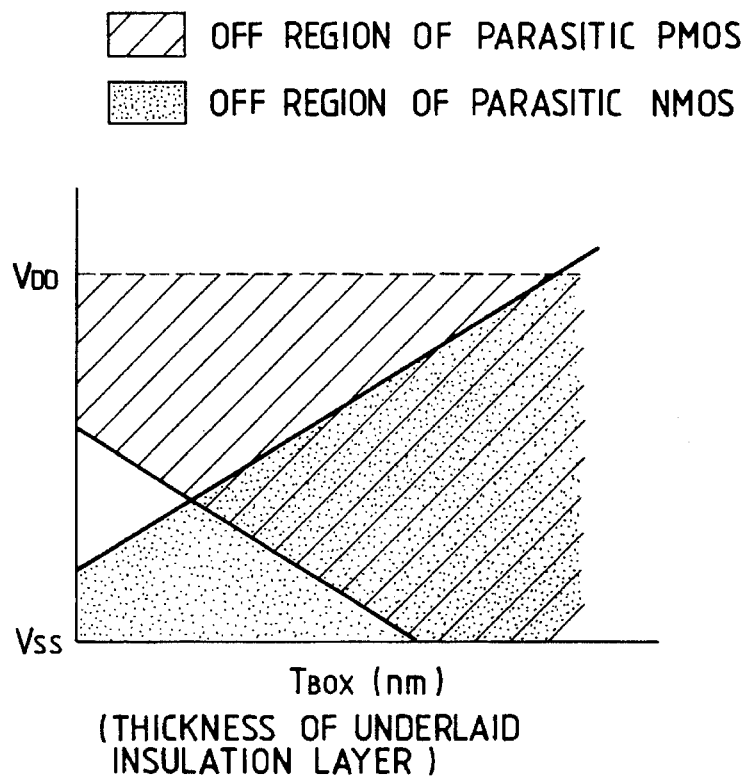
FIG. 16 is a schematic view showing the relation between the thickness of an underlaid insulation layer and the operating voltage of CMOS.

In the present invention, the potential of the back face electrode to be controlled lies in the off region of a parasitic transistor with the supporting substrate as a gate electrode, and the underlaid insulation layer as a gate insulating film, and when PMOS transistor and NMOS transistor such as CMOS inverter are used together as shown in FIG. 16, an overlapping area of the off regions of the both parasitic transistors is used. To take out the electrode, any means can be adopted within the range of not interfering with any function of display unit, but when taking the electrode out from the back face of a semiconductor substrate, the control can be made easier by the wiring via a metallic electrode made of, e.g., aluminum. As will be described later, it is also possible to take the electrode out from the upper side of the substrate. If it is taken out from the upper side, the wiring to a package is easier, thus reducing the size and improving the assembly yield.

An electrical conductive substrate for use with the present invention is preferably a metal having a high melting point of 900° C. or greater because of the bonding by heat treatment in the formation of a monocrystalline Si thin film. For the semiconductor substrate, a P- or N-type Si substrate is normally widely used.

Figure 17:
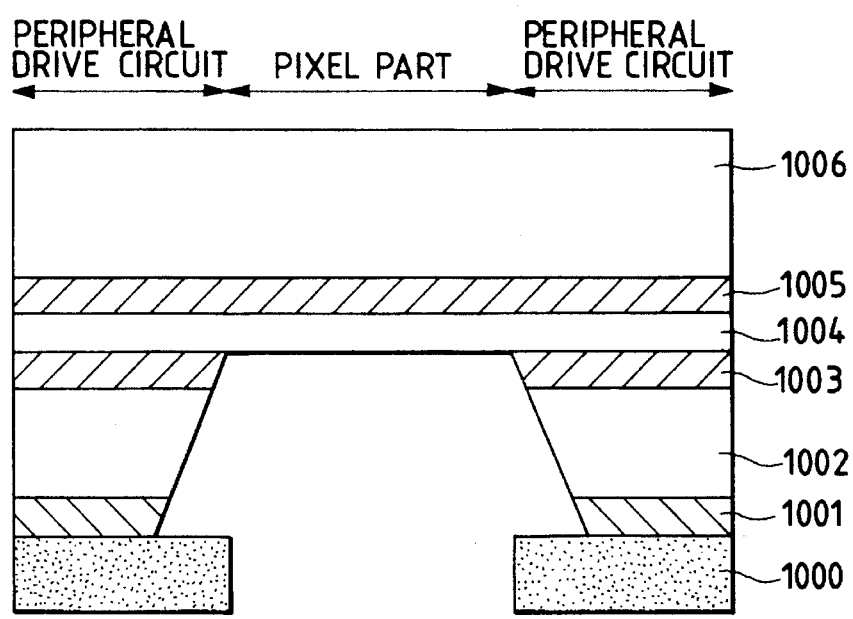
FIG. 17 is a schematic view for explaining a fabrication method of a semiconductor substrate portion in the liquid crystal display unit of the present invention.
Figure 18A:
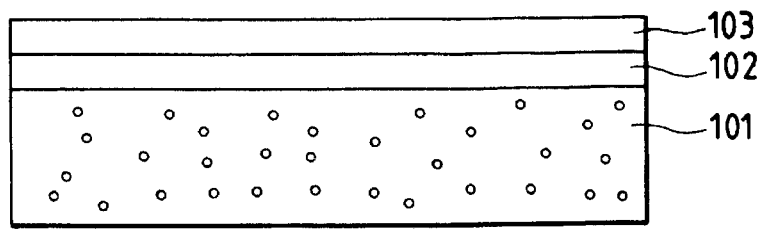
FIGS. 18A to 18D are schematic views for explaining a fabrication process of a semiconductor substrate for the liquid crystal display unit according to one embodiment of the present invention.
Figure 18B:
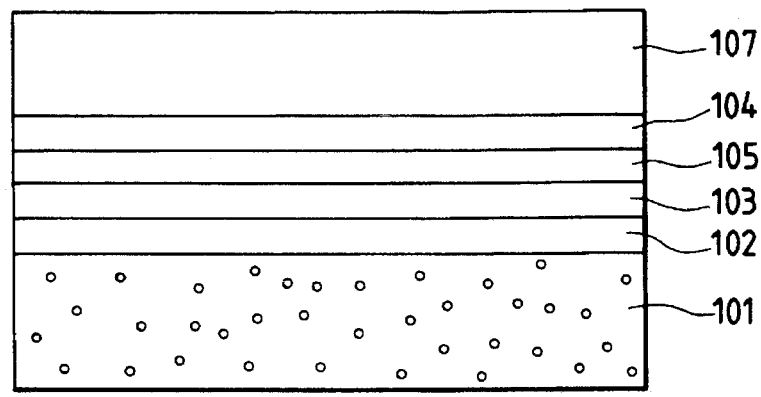
Figure 18C:
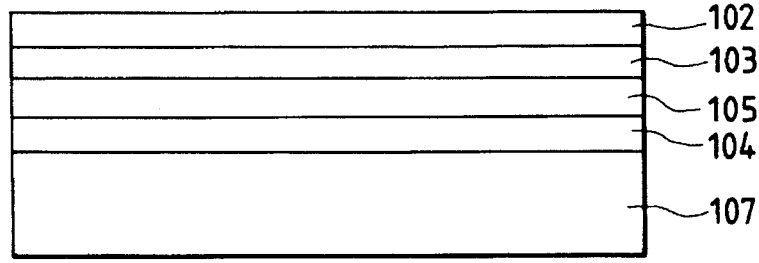
Figure 18D:
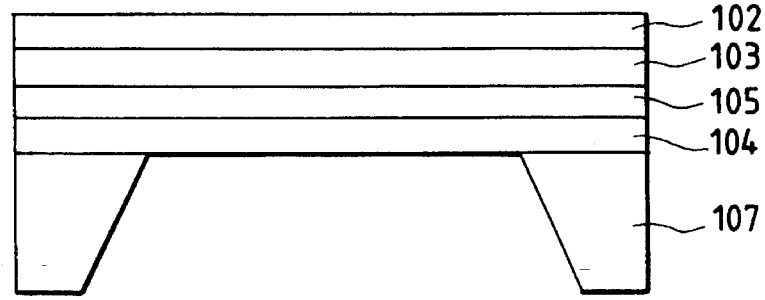

In the present invention, the substrate of image display unit is rendered more transparent by removing the back face side by etching. For etching, it is desirable to use an etching solution capable of assuring a sufficient etching rate between Si and the underlaid insulation layer (10:1 or greater). For example, when $SiO_2$, which is the most typical insulation layer, is used, KOH or ethylene diamine aqueous solution can be used as the etching solution. KOH is 10% to 70% aqueous solution, having a solution temperature of 50° to 120° C., and desirably KOH is 20% to 50%, with a solution temperature of 70° to 110° C. At this time, the etching rate of Si is 1 to 10 μm/min. Ethylene diamine aqueous solution is preferably a mixture solution of ethylene, pyrocatechol and water, with the composition being 10:1:10, for example. The solution temperature is 80° to 150° C., and the etching rate is 0.5 to 5 μm/min. For a more precise control of the etching rate, the addition of 5% to 20% pyrazine is preferred. FIG. 17 shows an etched state. As shown in FIG. 17, the substrate is removed by etching with the peripheral drive circuit portion protected by an anti-etching layer, so that the substrate on the peripheral drive circuit portion is left behind. In FIG. 17, 1000 is an anti-etching layer, 1001 is a back face electrode, 1002 is a substrate, 1003 is silicon oxide layer, 1004 is an etching stopper, 1005 is a silicon oxide layer, and 1006 is a semiconductor layer for the formation of device.

The hollow portion may not require any treatment if the strength is sufficient, but a light-transparent filler may be filled for the reinforcement. The filler is preferably silicon resin, which is most frequently used.

In the liquid crystal display unit of the present invention, the leak current with the operation of a parasitic MOS transistor decreases and the channel potential of a semiconductor device used in the drive circuit is stabilized by controlling the potential of the substrate for the peripheral drive circuit. Further, since the active layer is comprised of a monocrystalline Si thin film, the semiconductor device can be operated at a speed 5 to 100 times higher than that when made from a polycrystalline TFT. Also, the substrate of image display unit is removed by etching from the back face to make the image display unit transparent, while the rigidity is held by the remaining substrate.

In the present invention, for example, if a CMOS inverter having a low consumption power is used for the drive circuit, and a PMOS transistor having no back face leak and a high voltage resistance is used for the switching element, a liquid crystal display unit having a reduced consumption power can be provided; if PMOS transistors are used for both of them, a cheap liquid crystal display unit can be provided; and if an NMOS transistor is used for the drive circuit and a PMOS transistor is used for the switching element, a liquid crystal display unit having no back face leak and a low price can be provided.

The specific examples of the present invention will be described below.

(EXAMPLE 1)

First, anodization was conducted on a P-type (100) monocrystalline Si substrate having a thickness of 300 μm to form a porous Si substrate.

The conditions of anodization are as follows:

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 2.4 hours |
| Thickness of porous Si: | 300 (μm) |
| Porosity: | 56 (%) |

A 1.0 μm thick Si epitaxial layer was grown on the P-type (100) porous Si substrate thus obtained by a low pressure CVD method. Deposition was conducted under the following conditions:

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

Next, a 1000 Å thick oxide layer was formed on the surface of this epitaxial layer, and then bonded on to another Si substrate having a 5000 Å thick oxide layer and a 1000 Å thick nitride layer formed on the surface thereof, whereupon two Si substrates were bonded strongly by heating them at 800° C. for 0.5 hour in a nitrogen atmosphere.

Thereafter, selective etching was conducted on the bonded substrates in a mixture solution (10:6:50) of 49% hydrofluoric acid, alcohol and 30% hydrogen peroxide without agitation. In 65 minutes, the porous Si substrate was completely removed by the selective etching, with the monocrystal Si acting as an etch stopper, and the non-porous Si layer only was left behind without being etched. The etching rate of the non-porous Si monocrystal with respect to the etching solution was so low that the etching amount was less than 50 Å after 65 minutes, with the selection ratio of the etching rate of the non-porous layer to that of the porous layer being as large as 1:10$^5$, and the etching amount of non-porous layer (several tens angstroms) could be ignored in a practical operation. Thus, the 200 μm thick porous Si substrate was removed with a result that a 1.0 μm thick monocrystalline Si layer remained on the SiO$_2$. When SiH$_2$Cl was used as a source gas, the growth temperature was necessary to raise by several degrees, wherein the accelerated etching characteristics peculiar to the porous substrate were maintained.

A field effect transistor was created on the monocrystalline silicon thin film, and interconnected to produce a complementary element and an integrated circuit thereof, and form a pixel switching element and a peripheral drive circuit necessary for the liquid crystal image display unit. Note that the method of fabricating each transistor was a well-known MOS integrated circuit fabrication technology.

After a black matrix and a color filter were created in a cover glass, a common electrode was formed and the orientation processing was performed. After an active matrix substrate was subjected to the orientation processing and a seal material was printed, both of them were assembled and the liquid crystal was injected therein. For various processes for the liquid crystal, a well-known liquid crystal display unit fabrication technique was applied.

Then, hydrofluoric acid resistant rubber was covered on the Si substrate, except for a portion directly under the liquid crystal pixel part, and the silicon substrate was partially removed to an insulation layer, using a mixture solution of hydrofluoric acid, acetic acid and nitric acid, whereupon a projection-type liquid crystal image display unit based on the light transmission was completed by filling a transparent resin within a removed concave portion for a further improvement of the reliability.

(EXAMPLE 2)

First, a 5 μm thick Si epitaxial layer was grown on a P-type (100) Si substrate having a thickness of 200 μm by atmospheric pressure CVD method. Deposition was conducted under the following conditions:

| | | |
|---|---|---|
| Reaction gas flow: | SiH$_2$Cl$_2$ | 1000 SCCM |
| | H$_2$ | 230 1/min. |
| Temperature: | 1080° C. | |
| Pressure: | 760 Torr | |
| Time: | 1 min. | |

Then, anodization was conducted on the Si substrate thus obtained in an HF solution to form a porous layer.

The conditions of anodization were as follows:

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

As previously described, with this anodization, the P-type (100) Si substrate only was made porous, and there was no change in the Si epitaxial layer.

Next, a 1000 Å thick oxide layer was formed on the surface of this epitaxial layer, and then bonded on to another Si substrate having a 5000 Å thick oxide layer and a 500 Å thick nitride layer formed on the surface thereof and an insulation layer disposed, whereupon two Si substrates were bonded strongly by heating them at 800° C. for 0.5 hour in a nitrogen atmosphere.

Thereafter, selective etching was conducted on the bonded substrates in a mixture solution (10:6:50) of 49% hydrofluoric acid, alcohol and 30% hydrogen peroxide without agitation. In 65 minutes, the porous Si substrate was completely removed by the selective etching, with the monocrystal Si acting as an etch stopper, and the monocrystalline Si layer only was left behind without being etched. The etching rate of the non-porous Si monocrystal with respect to the etching solution was so low that the etching amount was less than 50 Å after 65 minutes, with the selection ratio of the etching rate of the non-porous layer to that of the porous layer being as large as 1:10$^5$, and the etching amount of non-porous layer (several tens angstroms) could be ignored in a practical operation. Thus, the 200 μm thick porous Si substrate was removed with a result that a 0.5 μm thick monocrystalline Si layer remained on the SiO$_2$. Observing the cross-section with a transmission electron microscope, it was confirmed that no crystal defects were newly introduced into the Si layer and excellent crystallinity was maintained. A bipolar and a field effect transistor were created on the monocrystalline silicon thin film, and interconnected to produce a complementary element and an integrated circuit thereof, and form a pixel switching element and a peripheral drive circuit necessary for the liquid crystal image display unit. Note that the method of fabricating each transistor was a well-known MOS and Bi-CMOS integrated circuit fabrication technique.

After a black matrix and a color filter were created in a cover glass, a common electrode was formed and the orientation processing was performed. After an active matrix substrate was subjected to the orientation processing and a seal material was printed, both of them were assembled and the liquid crystal was injected therein. For various processes for the liquid crystal, a well-known liquid crystal display unit fabrication technique was applied.

Then, hydrofluoric acid resistant rubber was covered on the Si substrate, except for a portion directly under the liquid crystal pixel part, the silicon substrate was partially removed to an insulation layer, using a mixture solution of hydrofluoric acid, acetic acid and nitric acid, whereupon a projection-type liquid crystal image display unit based on the light transmission was completed by filling a spin on glass within a removed concave portion for a further improvement of the reliability.

(EXAMPLE 3)

A 1 μm thick N-type Si layer was formed on the surface of a P-type (100) Si substrate having a thickness of 200 μm by proton ion implantation. The implantation amount of $H^+$ was $5\times10^{15}$ (ions/$cm^2$). Anodization was conducted on this substrate in a 50% HF solution. The current density at this time was 100 mA/$cm^2$. The porosity rate at this time was 8.4 μm/min, and the whole of P-type (100) Si substrate was made porous in 24 minutes. With this anodization, the P-type (100) Si substrate only was made porous, and there was no change in the N-type Si layer.

Next, a 1000 Å thick oxide layer was formed on the surface of this N-type Si layer, and then bonded on to another Si substrate having a 5000 Å thick oxide nitride layer formed on the surface thereof, whereupon two Si substrates were bonded strongly by heating them at 800° C. for 0.5 hour in a nitrogen atmosphere.

Thereafter, selecting etching was conducted on the bonded substrate in a mixture solution (10:6:50) of 49% hydrofluoric acid, alcohol and 30% hydrogen peroxide without agitation. In 65 minutes, the porous Si substrate was completely removed by the selective etching, with the monocrystal Si acting as an etch stopper, and the monocrystalline Si layer only was left behind without being etched. The etching rate of the non-porous Si monocrystal with respect to the etching solution was so low that the etching amount was less than 50 Å after 65 minutes, with the selection ratio of the etching rate of the non-porous layer to that of the porous layer being as large as $1:10^5$, and the etching amount of non-porous layer (several tens angstroms) could be ignored in a practical operation. Thus, the 200 μm thick porous Si substrate was removed with a result that a 1.0 μm thick monocrystalline Si layer remained on the $SiO_2$. Observing the cross-section with a transmission electron microscope, it was confirmed that no crystal defects were newly introduced into the Si layer and excellent crystallinity was maintained.

A bipolar and a field effect transistor were created on the monocrystalline silicon thin film, and interconnected to produce a complementary element and an integrated circuit thereof, and form a pixel switching element and a peripheral drive circuit necessary for the liquid crystal image display unit Note that the method of fabricating each transistor was a well-known MOS and Bi-CMOS integrated circuit fabrication technique.

After a black matrix and a color filter were created in a cover glass, a common electrode was formed and the orientation subjected to the orientation processing and a seal material was printed, both of them were assembled and the liquid crystal was injected therein. For various processes for the liquid crystal, a well-known liquid crystal display unit fabrication technique was applied.

Then, Apiezon Wax was covered on the back face side of the Si substrate, except for a portion directly under the liquid crystal pixel part, and the silicon substrate was partially removed to an insulation layer, using a mixture solution of hydrofluoric acid, acetic acid and nitric acid, whereupon a projection-type liquid crystal image display unit based on the light transmission was completed by filling a clear mold within a removed concave portion for a further improvement of the reliability.

(EXAMPLE 4)

Anodization was conducted on a P-type (100) monocrystalline Si substrate having a thickness of 500 μm in a 50% HF solution. The current density at this time was 10 mA/$cm^2$. A porous layer having a thickness of 20 μm was formed on the surface thereof in ten minutes. A 0.5 μm thick Si epitaxial layer was grown at a low temperature on the P-type (100) porous Si substrate by the low pressure CVD method. Deposition was conducted under the following conditions:

| Gas: | $SiH_2Cl_2$ (0.61 l/min), $H_2$ (1000 l/min) |
|---|---|
| Temperature: | 850° C. |
| Pressure: | 50 Torr |
| Growth rate: | 0.1 μm/min |

Next, the surface of this epitaxial layer was thermally oxidized to 50 nm. Then another silicon substrate having a 0.8 μm thick oxide layer on the surface thereof was bonded on to the thermally oxidized film, whereupon two Si substrates were bonded strongly by heating them at 900° C. for 1.5 in a nitrogen atmosphere.

Then, by removing the silicon substrate by a thickness of 490 μm by grinding from the back face thereof, the porous layer was exposed.

Thereafter, selective etching was conducted on the bonded substrates in a mixture solution (10:6:50) of 49% hydrofluoric acid, alcohol and hydrogen peroxide without agitation. After 15 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be less than about 40 Å in 15 minutes, with the selection ratio of the etching rate of the non-porous layer to that of the porous layer being as large as $1:10^5$ or greater, and the etching amount of non-porous layer (several tens angstroms) could be ignored in a practical operation. Thus, the $Si_3N_4$ layer was removed with a result that a 0.5 μm thick monocrystalline Si layer remained on the silicon substrate having an insulation layer on the surface thereof.

Apiezon Wax or electron wax can be covered in place of the $Si_3N_4$ layer, with the same effects, and only the porous Si layer can be completely removed.

A field effect transistor was created on the monocrystalline silicon thin film, and interconnected to produce a complementary element and an integrated circuit thereof, and form a pixel switching element and a peripheral drive circuit necessary for the liquid crystal image display unit. Note that the method of fabricating each transistor was a well-known MOS integrated circuit fabrication technique.

After a black matrix and a color filter were created in a cover glass, a common electrode was formed and the orientation processing was performed. After an active matrix substrate was subjected to the orientation processing and a seal material was printed, both of them were assembled and the liquid crystal was injected therein. For various processes for the liquid crystal, a well-known liquid crystal display unit fabrication technique was applied.

Then, Apiezon Wax was covered on the back face side of the Si substrate except for a portion directly under the liquid crystal pixel part, and the silicon substrate was partially removed to an insulation layer, using a mixture solution of hydrofluoric acid, acetic acid and nitric acid, whereupon a projection-type liquid crystal image display unit based on the light transmission was completed by filling a clear mold within a removed concave portion for a further improvement of the reliability.

As above described in detail, the present invention makes it possible to provide a high performance device having the elements and circuits integrated on the same substrate as the liquid crystal image display pixel, in which the stray capacity of the semiconductor element is reduced, the high speed operation is enabled, there is no latch-up phenomenon, and the radiation resistant characteristics are superior, because an Si monocrystalline substrate which is quite economical, even and flat over a large area, and has a quite excellent crystallinity is used, and semiconductor active elements are created on an Si monocrystalline layer having significantly less defects.

The liquid crystal image display unit of the present invention is created on a good monocrystalline layer formed on a non-transparent substrate by selectively removing the porous substrate or porous layer, and thus has a high performance. Also, the silicon substrate is used as a non-transparent substrate, and can become a starting material having a thermally, mechanically, chemically and physically good consistency with the conventionally silicon integrated circuit process.

In general, if a light source having a significantly great luminous intensity is used for the projection type liquid crystal image display unit, the light exciting current may be induced in the semiconductor layer by the light ray impinging upon the peripheral circuit portion, thereby causing some malfunctions, whereas the display unit of the present invention can avoid such a problem because the peripheral circuit portion is shielded from the light.

(EXAMPLE 5)

First, anodization was conducted on a P-type (100) monocrystalline Si substrate having a thickness of 200 μm in an HF solution.

The conditions of anodization were as follows:

| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 hour |
| Thickness of porous Si: | 200 (μm) |
| Porosity: | 56 (%) |

A 0.5 μm thick Si epitaxial layer was grown at a low temperature on the P-type (100) porous Si substrate by MBE (Molecular Beam Epitaxy) method, Deposition was conducted under the following conditions:

| Temperature: | 700° C. |
| Pressure: | 1 × 10$^{-9}$ Torr |
| Growth rate: | 0.1 nm/sec |

Next, a 100 nm thick oxide layer was formed on the surface of this epitaxial layer, and then bonded on to another Si substrate having a 5000 nm thick oxide layer formed on the surface thereof, whereupon two Si substrates were bonded strongly by heating them at 800° C. for 0.5 hour in an oxygen atmosphere.

Thereafter, selective etching was conducted on the bonded substrates in a mixture solution (10:6:50) of 49% hydrofluoric acid, alcohol and 30% hydrogen peroxide without agitation. In 65 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 50 Å or less after 65 minutes, with the selection ratio of the etching rate of the non-porous layer to that of the porous layer being as large as 1:10$^5$ and the etching amount of non-porous layer (several tens angstroms) could be ignored in a practical operation. That is, the 200 μm thick porous Si substrate was removed with a result that a 0.5 μm thick monocrystalline Si layer remained on the SiO$_2$.

Observing the cross-section with a transmission electron microscope, it was confirmed that no crystal defects were newly introduced into the Si layer and the excellent crystallinity was maintained.

Thereafter, the entire substrate was covered with Si$_3$N$_4$, and only the Si$_3$N$_4$ on the back face of the region to be made light-transparent was removed by etching. This substrate was first etched in a solution of hydrofluoronitric acid (84:16) for 19 minutes to leave the Si substrate 10 μm thick. Then it was etched in a solution of hydrofluoronitroacetic acid (1:3:8) for ten minutes, so that Si$_3$N$_4$ was etched only at the opening portion and SiO$_2$ was exposed. After the removal of Si$_3$N$_4$, an SOI member was fabricated in which the substrate was transparent to the light, in part thereof, and an Si layer with the same excellent crystallinity as the Si wafer was provided.

(EXAMPLE 6)

Anodization was conducted on a P-type (100) monocrystalline Si substrate having a thickness of 200 μm in an HF solution.

The conditions of anodization were as follows:

| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 0.5 μm thick Si epitaxial layer was grown at a low temperature on the P-type (100) porous Si substrate by plasma CVD method. Deposition was conducted under the following conditions:

| Gas: | SiH$_4$ |
| --- | --- |
| High frequency power: | 100 W |
| Temperature: | 800° C. |
| Pressure: | 1 × 10$^{-2}$ Torr |
| Growth rate: | 2.5 nm/sec |

Next, a 100 nm thick oxide layer was formed on the surface of this epitaxial layer, and then bonded on to another Si substrate having a 500 nm thick oxide layer formed on the surface thereof, whereupon two Si substrates were bonded strongly by heating them at 900° C. for 0.5 hour in an oxygen atmosphere.

Thereafter, selective etching was conducted on the bonded substrates in a mixture solution (1:5) of 49% hydrofluoric acid and 30% hydrogen peroxide without agitation. In 62 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 50 Å or less after 62 minutes, with the selection ratio of the etching rate of the non-porous layer to that of the porous layer being as large as 1:10$^5$, and the etching amount of non-porous layer (several tens angstroms) could be ignored in a practical operation. That is, the 200 μm thick porous Si substrate was removed with a result that a 0.5 μm thick monocrystalline Si layer remained on the SiO$_2$.

Thereafter, the entire substrate was covered with Si$_3$N$_4$, and only the Si$_3$N$_4$ on the back face of the region to be made light-transparent was removed by etching. This substrate was first etched in a solution of hydrofluoronitric acid (84:16) for 19 minutes to leave the Si substrate 10 μm thick. Then it was etched in a solution of hydrofluoronitroacetic acid (1:3:8) for ten minutes, so that Si$_3$N$_4$ was etched only at the opening portion and SiO$_2$ was exposed. After the removal of Si$_3$N$_4$, an SOI member was fabricated in which the substrate was transparent to the light, in part thereof, and an Si layer with the same excellent crystallinity as the Si wafer was provided.

(EXAMPLE 7)

Anodization was conducted on a P-type (100) monocrystalline Si substrate having a thickness of 200 μm in an HF solution.

The conditions of anodization were as follows:

| Applied voltage: | 2.6 (V) |
| --- | --- |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 0.5 μm thick Si epitaxial layer was grown at a low temperature on the P-type (100) porous Si substrate by bias sputter method. Deposition was conducted under the following conditions:

| RF frequency: | 100 MHz |
| --- | --- |
| High frequency power: | 600 W |
| Temperature: | 300° C. |
| Ar gas pressure: | 8 × 10$^{-3}$ Torr |
| Growth time: | 60 min. |
| Target DC bias: | −200 V |
| Substrate DC bias: | +5 V |

Next, a 100 nm thick oxide layer was formed on the surface of this epitaxial layer, and then bonded on to another Si substrate having a SiO$_2$(500 nm) / Si$_3$N$_4$ (100 nm) layer formed on the surface thereof, whereupon two Si substrates were bonded strongly by heating them at 900° C. for 0.5 hour in a nitrogen atmosphere.

Thereafter, selective etching was conducted on the bonded substrates in a mixture solution (10:1) of 49% hydrofluoric acid and alcohol without agitation. In 82 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 50 Å or less after 82 minutes, with the selection ratio of the etching rate of the non-porous layer to that of the porous layer being as large as 1:10$^5$, and the etching amount of non-porous layer (several tens angstroms) could be ignored in a practical operation. That is, the 200 μm thick porous Si substrate was removed with a result that a 0.5 μm thick monocrystalline Si layer remained on the SiO$_2$/Si$_3$N$_4$.

Thereafter, the entire substrate was covered with Si$_3$N$_4$ as an anti-etching film, and only the Si$_3$N$_4$ on the back face of the region to be made light-transparent was removed by etching. This substrate was first etched in a solution of hydrofluoronitric acid (84:16) for 19 minutes to leave the Si substrate 10 μm thick. Then it was etched in a solution of hydrofluoronitroacetic acid (1:3:8) for ten minutes, so that Si$_3$N$_4$ was etched only at the opening portion and Si$_3$N$_4$ was exposed. After the removal of Si$_3$N$_4$, an SOI member was fabricated in which the substrate was transparent to the light, in part thereof, and an Si layer with the same excellent crystallinity as the Si wafer was provided.

(EXAMPLE 8)

Anodization was conducted on an N-type (100) monocrystalline Si substrate having a thickness of 200 μm in an HF solution.

The conditions of anodization were as follows:

| Applied voltage: | 2.6 (V) |
| --- | --- |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 5 μm thick Si epitaxial layer was grown at a low temperature on the N-type (100) porous Si substrate by liquid phase growth method. Growth conditions were as follows:

| Solvent: | Sn |
| --- | --- |
| Temperature: | 900° C. |
| Growth atmosphere: | H$_2$ |
| Growth time: | 50 min. |

Next, a 100 nm thick oxide layer was formed on the surface of this epitaxial layer, and then bonded on to another Si substrate having a 500 nm oxide layer formed on the surface thereof, whereupon two Si substrates were bonded strongly by heating them at 1000° C. for 0.5 hour in a nitrogen atmosphere.

Thereafter, selective etching was conducted on the bonded substrates in a 49% hydrofluoric acid with agitation. In 78 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 50 Å or less after 78 minutes, with the selection ratio of the etching rate of the non-porous layer to that of the porous layer being as large as $1:10^5$, and the etching amount of non-porous layer (several tens angstroms) could be ignored in a practical operation. That is, the 200 μm thick porous Si substrate was removed with a result that a 5 μm thick monocrystalline Si layer remained on the $SiO_2$.

Thereafter, the entire substrate was covered with $SiO_2$ as an anti-etching film, and only the $SiO_2$ on the back face of the region to be made light-transparent was removed by etching. This substrate was etched in a solution of ethylene diamine (17 ml)+water (8 ml) +pyrocatechol (3 g) for four hours, so that $SiO_2$ was etched only at the opening portion and $SiO_2$ layer lying directly under the Si layer was exposed. After the removal of $SiO_2$ as the anti-etching film, an SOI member was fabricated in which the substrate was transparent to the light, in part thereof, and an Si layer with the same excellent crystallinity as the Si wafer was provided.

(EXAMPLE 9)

Anodization was conducted on a P-type (100) monocrystalline Si substrate having a thickness of 200 μm in an HF solution.

The conditions of anodization were as follows:

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 1.6 (hour) |
| Thickness of porous Si: | 200 (μm) |
| Porosity: | 56 (%) |

A 1 μm thick Si epitaxial layer was grown on the P-type (100) porous Si substrate by a low pressure CVD method. Deposition was conducted under the following conditions:

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

Next, a 100 nm thick oxide layer was formed on the surface of this epitaxial layer, and then bonded on to another Si substrate having a 500 nm oxide layer formed on the surface thereof, whereupon two Si substrates were bonded strongly by heating them at 1000° C. for 0.5 hour in a nitrogen atmosphere.

Thereafter, selective etching was conducted on the bonded substrates in a mixture solution (10:6:50) of buffered hydrofluoric acid (36% NH$_4$F+4.5% HF+H$_2$O), alcohol and 30% hydrogen peroxide without agitation. In 205 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 100 Å or less after 205 minutes, with the selection ratio of the etching rate of the non-porous layer to that of the porous layer being as large as $1:10^5$, and the etching amount of non-porous layer (several tens angstroms) could be ignored in a practical operation. That is, the 200 μm thick porous Si substrate was removed with a result that a 1 μm thick monocrystalline Si layer remained on the $SiO_2$.

When $SiH_2Cl_2$ was used as a source gas, the accelerated etching characteristics peculiar to the porous substrate was maintained although the growth temperature must be elevated several tens degrees.

MOSFET was fabricated on the monocrystalline Si layer. Note that the fabrication method of MOSFET is a well-known integrated circuit fabrication technique, and the description thereof is omitted herein.

Thereafter, the entire substrate was covered with $SiO_2$ as an anti-etching film, and only the $SiO_2$ on the back face of the region to be made light-transparent was removed by etching. This substrate was etched in a solution of 6MKOH for 200 minutes, so that $SiO_2$ was etched only at the opening portion and $SiO_2$ layer lying directly under the Si layer was exposed. After the removal of $SiO_2$ as the anti-etching film, an SOI member was fabricated in which the substrate was transparent to the light, in part thereof, and an Si layer with the same excellent crystallinity as the Si wafer was provided.

(EXAMPLE 10)

A 1 μm thick Si epitaxial layer was grown on a P-type (100) Si substrate having a thickness of 200 μm by CVD method. Deposition was conducted under the following conditions:

| | | |
|---|---|---|
| Reaction gas flow: | SiH$_2$Cl$_2$ | 1000 SCCM |
| | H$_2$ | 230 l/min. |
| Temperature: | 1080° C. | |
| Pressure: | 80 Torr | |
| Time: | 2 min. | |

Then, anodization was conducted on this substrate in an HF solution. The current density was 100 mA/cm$^2$ and the porosity rate was 8.4 μm/min, at this time, so that the whole of a P-type (100) Si substrate having a thickness of 200 μm was made porous in 24 minutes. As previously described, with this anodization, the P-type (100) Si substrate only was made porous, and there was no change in the Si epitaxial layer.

Next, a 100 nm thick oxide layer was formed on the surface of this epitaxial layer, and then bonded on to another Si substrate having a 500 nm thick oxide layer formed on the surface thereof, whereupon two Si substrates were bonded strongly by heating them at 900° C. for 0.5 hour in a nitrogen atmosphere.

Thereafter, selective etching was conducted on the bonded substrates in a mixture solution (1:5) of buffered hydrofluoric acid (36% NH$_4$F+4.5% HF+H$_2$O) and 30% hydrogen peroxide with agitation. In 191 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 100 Å or less after 191 minutes, with the selection ratio of the etching rate of the non-porous layer to that of the porous layer being as large as 1:10⁵, and the etching amount of non-porous layer (several tens angstroms) could be ignored in a practical operation. That is, the 200 μm thick porous Si substrate was removed with a result that a 1.0 μm thick monocrystalline Si layer remained on the $SiO_2$.

Observing the cross-section with a transmission electron microscope, it was confirmed that no crystal defects were newly introduced into the Si layer and excellent crystallinity was maintained.

Thereafter, the entire substrate was covered with $Si_3N_4$, and only the $Si_3N_4$ on the back face of the region to be made light-transparent was removed by etching. This substrate was first etched in a solution of hydrofluoronitric acid (84:16) for 19 minutes, and the Si substrate was left behind 10 μm thick. Then, it was etched in a solution of hydrofluoronitroacetic acid (1:3:8) for ten minutes, so that $Si_3N_4$ was etched only at the opening portion and $SiO_2$ was exposed. After the removal of $Si_3N_4$, an SOI member was fabricated in which the substrate was transparent to the light, in part thereof, and an Si layer with the same excellent crystallinity as the Si wafer was provided.

(EXAMPLE 11)

A 5 μm thick Si epitaxial layer was grown on a P-type (100) Si substrate having a thickness of 200 μm by atmospheric pressure CVD method. Deposition was conducted under the following conditions:

| Reaction gas flow: | $SiH_2Cl_2$ | 1000 SCCM |
|---|---|---|
|  | $H_2$ | 230 l/min. |
| Temperature: | 1080° C. |  |
| Pressure: | 760 Torr |  |
| Time: | 1 min. |  |

Then, anodization was conducted on this Si substrate in an HF solution.

The conditions of anodization were as follows:

| Applied voltage: | 2.6 (V) |
|---|---|
| Current density: | 30 (mA · cm⁻²) |
| Anodizing solution: | $HF:H_2O:C_2H_5OH$ = 1:1:1 |
| Time: | 1.6 (hour) |
| Thickness of porous Si: | 200 (μm) |
| Porosity: | 56 (%) |

As previously described, with this anodization, the P-type (100) Si substrate only was made porous, and there was no change in the Si epitaxial layer.

Next, a 100 nm thick oxide layer was formed on the surface of this epitaxial layer, and then bonded on to another Si substrate having a 500 nm thick oxide layer formed on the surface thereof, whereupon two Si substrates were bonded strongly by heating them at 900° C. for 0.5 hour in an oxygen atmosphere.

Thereafter, selective etching was conducted on the bonded substrates in a mixture solution (10:1) of 49% hydrofluoric acid and alcohol without agitation. In 275 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 100 Å or less after 275 minutes, with the selection ratio of the etching rate of the non-porous layer to that of the porous layer being as large as 1:10⁵, and the etching amount of non-porous layer (several tens angstroms) could be ignored in a practical operation. That is, the 200 μm thick porous Si substrate was removed with a result that a 5 μm thick monocrystalline Si layer remained on the $SiO_2$.

Observing the cross-section with a transmission electron microscope, it was confirmed that no crystal defects were newly introduced into the Si layer and excellent crystallinity was maintained.

Thereafter, the entire substrate was covered with $Si_3N_4$, and only the $Si_3N_4$ on the back face of the region to be made light-transparent was removed by etching. This substrate was first etched in a solution of hydrofluoronitric acid (84:16) for 19 minutes, and the Si substrate was left behind 10 μm thick. Then, it was etched in a solution of hydrofluoronitroacetic acid (1:3:8) for ten minutes, so that $Si_3N_4$ was etched only at the opening portion and $SiO_2$ was exposed. After the removal of $Si_3N_4$, an SOI member was fabricated in which the substrate was transparent to the light, in part thereof, and an Si layer with the same excellent crystallinity as the Si wafer was provided.

(EXAMPLE 12)

A 1 μm thick N-type Si layer was formed on the surface of a P-type (100) Si substrate having a thickness of 200 μm by proton ion implantation. The implantation amount of H⁺ was 5×10¹⁵ (ions/cm²). Anodization was conducted on this substrate in a 50% HF solution. The current density was 100 mA/cm², and the porosity rate was 8.4 μm/min, at this time, so that the whole of a P-type (100) Si substrate having a thickness of 200 μm was made porous in 24 minutes. As previously described, with this anodization, the P-type (100) Si substrate only was made porous, and there was no change in the N-type Si layer.

Next, a 100 nm thick oxide layer was formed on the surface of this N-type Si layer, and then bonded on to another Si substrate having $SiO_2$ (200 nm)/$Si_3N_4$ (100 nm) formed on the surface thereof, whereupon two Si substrates were bonded strongly by heating them at 800° C. for 0.5 hour in an oxygen atmosphere.

Thereafter, selective etching was conducted on the bonded substrates in a buffered hydrofluoric acid (36% $NH_4F$+4.5% HF+$H_2O$) with agitation. In 258 minutes, the porous Si substrate was completely removed by the selective etching, with the monocrystal Si acting as an etch stopper, and the monocrystalline Si layer only was left behind without being etched.

The etching rate of the non-porous Si monocrystal with respect to the etching solution was so low as to be about 100 Å or less after 258 minutes, with the selection ratio of the etching rate of the non-porous layer to that of the porous layer being as large as 1:10⁵, and the etching amount of non-porous layer (several tens angstroms) could be ignored in a practical operation. That is, the 200 μm thick porous Si substrate was removed with a result that a 1.0 μm thick monocrystalline Si layer remained on the $SiO_2/Si_3N_4$.

Observing the cross-section with a transmission electron microscope, it was confirmed that no crystal defects were newly introduced into the Si layer and excellent crystallinity was maintained.

Thereafter, the entire substrate was covered with $Si_3N_4$ as an anti-etching film, and only the $Si_3N_4$ on the back face of the region to be made light-transparent was removed by etching. This substrate was first etched in a solution of hydrofluoronitric acid (84:16) for nineteen minutes, and the Si substrate was left behind 10 μm thick. Then, it was etched in a solution of hydrofluoronitroacetic acid (1:3:8) for ten minutes, so that $Si_3N_4$ was etched only at the opening portion and $Si_3N_4$ was exposed. After the removal of $Si_3N_4$ as the anti-etching film, an SOI member was fabricated in which the substrate was transparent to the light, in part thereof, and an Si layer with the same excellent crystallinity as the Si wafer was provided.

(EXAMPLE 13)

Anodization was conducted on a P-type (100) monocrystalline Si substrate having a thickness of 500 µm in a 50% HF solution. The current density at the time was $10mA/cm^2$. A porous layer having a thickness of 20 µm was formed on the surface thereof in ten minutes. A 0.5 µm thick Si epitaxial layer was grown at a low temperature on the P-type (100) porous Si substrate by the low pressure CVD method. Deposition was conducted under the following conditions:

| Gas: | $SiH_2Cl_2$ | (0.61 l/min) |
|---|---|---|
|  | $H_2$ | (100 l/min) |
| Temperature: | 850° C. |  |
| Pressure: | 50 Torr |  |
| Growth rate: | 0.1 µm/min |  |

Next, the surface of this epitaxial layer was thermally oxidized 50 nm thick. Then a silicon substrate having a 800 µm thick oxide layer on the surface thereof was bonded on to the thermally oxidized film, whereupon two Si substrates were bonded strongly by heating them at 900° C. for 1.5 in an oxygen atmosphere.

Then, by removing the silicon substrate by a thickness of 490 µm by grinding from the back face thereof, the porous layer was exposed.

$Si_3N_4$ was deposited 0.1 µm thick by plasma CVD method to cover the two bonded substrates, and only the nitride film on the porous substrate was removed by reactive ion etching.

Thereafter, selective etching was conducted on the bonded substrates in a mixture solution (10:6:50) of 49% hydrofluoric acid, alcohol and hydrogen peroxide without agitation. After fifteen minutes, the porous Si layer was completely removed by the selective etching, with the monocrystal Si acting as an etch stopper, and the monocrystalline Si layer only was left behind without being etched.

The etching rate of the non-porous Si monocrystal with respect to the etching solution was so low as to be less than about 40 Å in fifteen minutes, with the selection ratio of the etching rate of the non-porous layer to that of the porous layer being as large as $1:10^5$ or greater, and the etching amount of non-porous layer (several tens angstroms) could be ignored in a practical operation. Thus, the $Si_3N_4$ layer was removed with a result that a 0.5 µm thick monocrystalline Si layer remained on the silicon substrate having an insulation layer on the surface thereof.

Apiezon Wax or electron wax can be covered in place of $Si_3N_4$ layer, with the same effects, and only the porous Si layer can be completely removed.

Thereafter, the entire substrate was covered with $SiO_2$ as an anti-etching film, and only the $SiO_2$ on the back face of the region to be made light-transparent was removed by etching. This substrate was etched in a solution of ethylene diamine (17 ml) +water (8 ml) +pyrocatechol (3 g) for four hours, so that $SiO_2$ was etched only at the opening portion and $SiO_2$ layer lying directly under the Si layer was exposed. After the removal of $SiO_2$ as the anti-etching film, an SOI member was fabricated in which the substrate was transparent to the light, in part thereof, and an Si layer with the same excellent crystallinity as the Si wafer was provided.

(EXAMPLE 14)

A 1 µm thick Si epitaxial layer was grown on a P-type (100) Si substrate having a thickness of 200 µm by the CVD method. Deposition was conducted under the following conditions:

| Reaction gas flow: | $SiH_2Cl_2$ | 1000 SCCM |
|---|---|---|
|  | $H_2$ | 230 l/min. |
| Temperature: | 1080° C. |  |
| Pressure: | 80 Torr |  |
| Time: | 2 min. |  |

Anodization was conducted on this substrate in a 50% HF solution. The current density was $100 mA/cm^2$ and the porosity rate was 8.4 µm/min, at this time, so that the whole of the P-type (100) Si substrate having at thickness of 200 µm was made porous in 24 minutes. As previously described, with this anodization, the P-type (100) Si substrate only was made porous, and there was no change in the Si epitaxial layer.

Then a silicon substrate having a 800 µm thick oxide layer on the surface thereof was bonded on to the surface of this epitaxial layer, whereupon two Si substrates were bonded strongly by heating them at 1100° C. for 1.5 in a nitrogen atmosphere.

$Si_3N_4$ was deposited 0.1 µm thick by plasma CVD method to cover the two bonded substrates, and only the nitride film on the porous substrate was removed by reactive ion etching.

Thereafter, selective etching was conducted on the bonded substrates in a mixture solution (1:5) of 49% hydrofluoric acid and hydrogen peroxide with agitation. After 62 minutes, the porous Si layer was completely removed by the selective etching, with the monocrystal Si acting as an etch stopper, and the monocrystalline Si layer only was left behind without being etched.

The etching rate of the non-porous Si monocrystal with respect to the etching solution was so low as to be less than about 50 Å in 62 minutes, with the selection ratio of the etching rate of the non-porous layer to that of the porous layer being as large as $1:10^5$, and the etching amount of non-porous layer (several tens angstroms) could be ignored in a practical operation. That is, the porous Si substrate having a thickness of 200 µm was removed with a result that a 1 µm thick monocrystalline Si layer remained on the insulating substrate after the removal of $Si_3N_4$ layer.

Observing the cross-section with a transmission electron microscope, it was confirmed that no crystal defects were newly introduced into the Si layer and excellent crystallinity was maintained.

MOSFET was fabricated on the monocrystalline Si layer. Note that the fabrication method of MOSFET is a well-known integrated circuit fabrication technique, and the description thereof is omitted herein.

Thereafter, the entire substrate was covered with $SiO_2$ as an anti-etching film, and only the $SiO_2$ on the back face of the region to be made light-transparent was removed by etching. This substrate was etched in a solution of 6MKOH for 200 minutes, so that $SiO_2$ was etched only at the opening portion and $SiO_2$ layer lying directly under the Si layer was exposed. After the removal of $SiO_2$ as the anti-etching film, an SOI member was fabricated in which the substrate was transparent to the light, in part thereof, and an Si layer with the same excellent crystallinity as the Si wafer was provided.

As above described in detail, with the present invention, a monocrystalline semiconductor layer is formed on the surface of a light non-transparent insulating substrate (which has an insulation layer on an Si substrate) by removing a porous Si substrate in a process including at least wet chemical etching, and a part of the insulating substrate is removed with a treatment including at least wet chemical etching, until the insulating surface near the surface of the monocrystalline semiconductor layer is exposed from the face side on which the monocrystalline semiconductor layer is not formed (back face side), whereby a continuous thin film is left behind without any supporting member provided directly therebeneath, and the light non-transparent substrate can be changed to a partly light transparent substrate.

Also, with the present invention, the light non-transparent substrate is formed with electronic devices at least on a portion to be made light-transparent before transformation into the light transparent type, and then can be transformed to the light transparent substrate.

With the present invention, the light non-transparent insulating substrate, after being formed with a monocrystalline Si layer thereon, can be transformed to the light transparent type by removing only a necessary portion of the light non-transparent substrate, whereby it is possible to fabricate a light transparent member of the SOI structure easily, which is superior in productivity, uniformity, controllability and economy, and comprising an Si layer having the same excellent crystallinity as the monocrystalline wafer, without the use of any light transparent substrate represented by the glass.

The light transparent SOI member according to the present invention is applicable as a light transparent member for a view finder, a contact sensor, or a liquid crystal display, as well as an X-ray mask, a pressure sensor, and micromechanics.

(EXAMPLE 15)

FIG. 18 is a schematic process view of this example.

Anodization was conducted on a P-type (100) monocrystalline Si substrate having a thickness of 300 μm in an HF solution to form a porous Si substrate.

The conditions of anodization were as follows:

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 2.4 (hour) |
| Thickness of porous Si: | 300 (μm) |
| Porosity: | 56 (%) |

A 1.0 μm thick Si epitaxial layer 102 was grown on the P-type (100) porous Si substrate 101 thus obtained by a low pressure CVD method. Deposition was conducted under the following conditions:

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

Next, 1000 Å thick oxide layer 103 was formed on the surface of this epitaxial layer 102, and then bonded on to another Si substrate 107 having a 5000 Å thick oxide layer 104 and a 1000 Å thick nitride layer formed on the surface thereof, whereupon two Si substrates were bonded strongly by heating them at 800° C. for 0.5 hour in a nitrogen atmosphere.

Thereafter, selective etching was conducted on the bonded substrates in a mixture solution (10:6:50) of 49% hydrofluoric acid, alcohol and 30% hydrogen peroxide without agitation. In 65 minutes, the porous Si substrate 101 was completely removed by the selective etching, with the monocrystal Si acting as an etch stopper, and the non-porous Si layer only was left behind without being etched. The etching rate of the non-porous Si monocrystal with respect to the etching solution was so low that the etching layer was 50 Å thick or less after 65 minutes, with the selection ratio of the etching rate of the non-porous layer to that of the porous layer being as large as 1:10$^5$, and the etching amount of non-porous layer (several tens angstroms) could be ignored in a practical operation. Thus, the 200 μm thick porous Si substrate 101 was removed with a result that a 1.0 μm thick monocrystalline Si layer 102 remained on the SiO$_2$ layer 103. When SiH$_2$Cl was used as a source gas, the accelerated etching characteristics were maintained, although the growth temperature must be elevated several tens degrees.

A field effect transistor was created on the monocrystalline silicon thin film 102, and interconnected to produce a complementary element and an integrated circuit thereof, and form a pixel switching element and a peripheral drive circuit necessary for the liquid crystal image display unit. Note that the method of fabricating each transistor was a well-known MOS integrated circuit fabrication technique.

After a black matrix and a color filter were created on a cover glass, a common electrode was formed and the orientation processing was performed. After an active matrix substrate was subjected to the orientation processing and a seal material was printed, both of them were assembled and the liquid crystal was injected therein. For various processes for the liquid crystal, a well-known liquid crystal display unit fabrication technique was applied.

Then, the Si substrate 107 beneath the liquid crystal pixel part was removed with the following method.

Figure 19:
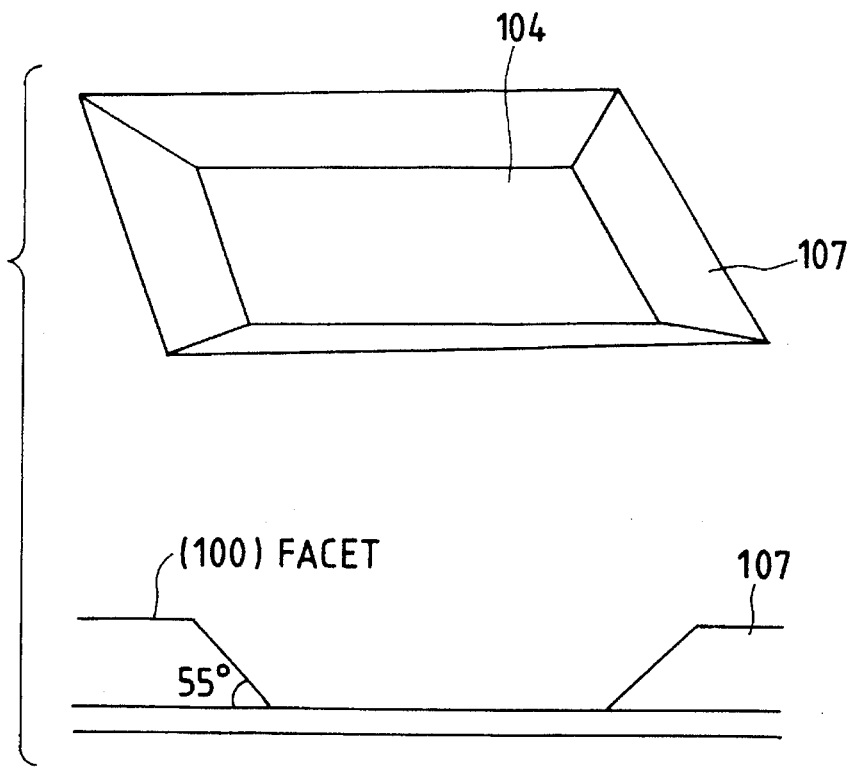
FIGS. 19 and 20 are schematic views for explaining the lower side of a liquid crystal pixel part of the semiconductor substrate for the liquid crystal display unit according to one embodiment of the present invention.

30 wt % KOH aqueous solution was heated to about 110° C., and the etching was made in a (100) direction of Si, with SiN as a mask. The etching rate showed the anisotropy with respect to the crystal plane, and was about 300 μm/h for a (100)-plane. The shape after etching is shown in FIG. 19, and it can be found that the angle of the slope after etching is 55° and a high anisotropy is indicated. When the insulation layer 104 is reached, the etching is substantially ended. That is, the side etching rate in a lateral direction is quite small. With this method, it is possible to remove the Si substrate 107 beneath the liquid crystal pixel part at a high precision.

Finally, a projection-type liquid crystal image display unit based on the light transmission was completed by filling a spin on glass within a removed concave portion for a further improvement of the reliability.

(EXAMPLE 16)

A liquid crystal image display unit was completed in the same way as example 15, except that the removal of Si substrate 107 was performed with the following method.

A mixture solution of ethylene diamine 75 ml, catechol 12 g, water 24 ml and pyrazine 0.45 g was heated to about 115° C., and the etching was performed with SiN as a mask. In the present invention, the selection ratio of SiO$_2$ is very high, i.e., 1000 or greater, and SiO$_2$ is usable as a membrane and an anti-etching mask.

(EXAMPLE 17)

A liquid crystal image display unit was completed in the same way as example 15, except that the removal of Si substrate 107 was performed with RIE. The etching could be performed substantially vertically to the mask pattern.

(EXAMPLE 18)

A liquid crystal image display unit was completed in the same way as example 15, except that the removal of Si substrate 107 was performed with the following method.

A 1:1 aqueous solution of hydrazine and water was heated to about 100° C., and the anisotropic etching was performed with $SiO_2$ as a mask. The etching rate was 2 μm/min.

(EXAMPLE 19)

A liquid crystal image display unit was completed in the same way as example 15, except that the removal of Al was performed by plasma etching in Cl-type gases, using an Al substrate having $Al_2O_3$ (ruby) on the surface thereof as the light non-transparent substrate which was not transparent to the light in the visible light region.

With the present invention, the substrate having the anisotropic etching characteristics can be freely selected, so that a clean liquid crystal plane can be obtained by selecting a ruby film or the like for the substrate as shown in this example.

(EXAMPLE 20)

Figure 20:
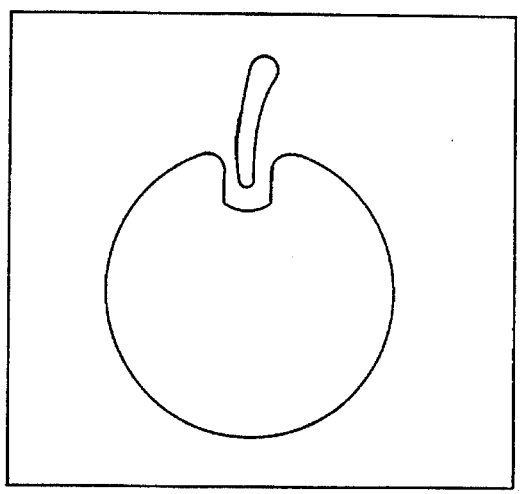
Figure 21A:
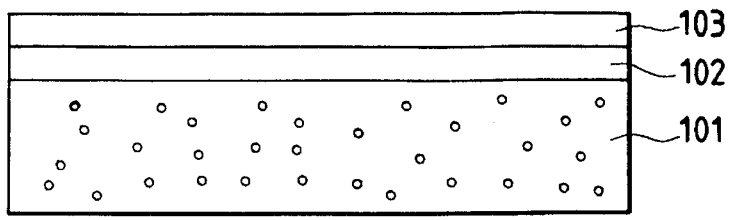
FIGS. 21A to 21D are schematic views for explaining a fabrication process of a semiconductor substrate for a liquid crystal display unit according to an example 21 of the present invention.
Figure 21B:
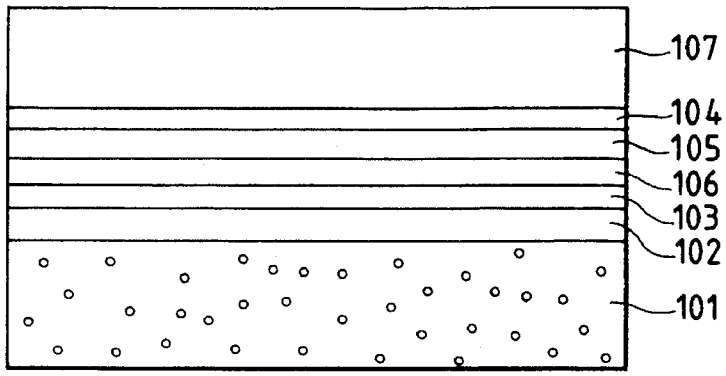
Figure 21C:
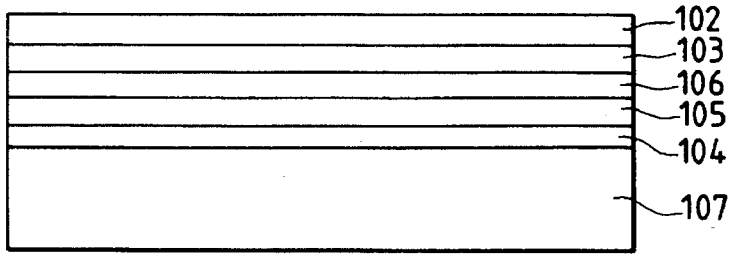
Figure 21D:
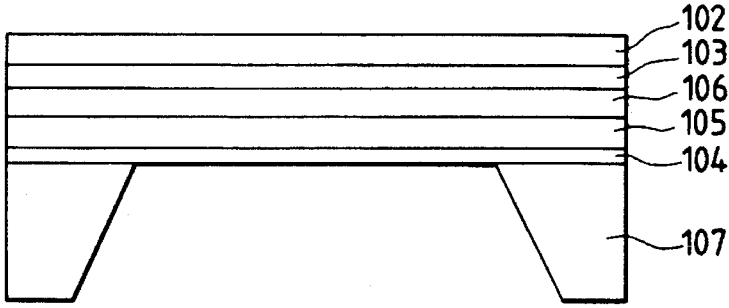

A liquid crystal image display unit was completed in the same way as example 15, except that the Si substrate was removed in the shape of an apple as shown in FIG. 20.

As the etching is performed at high precision with the present invention, a variety of patterns can be raised by the backlight, as in this example.

As above described in detail, the present invention makes it possible to provide a high performance device having the elements and circuits integrated on the same substrate as the liquid crystal image display pixel, in which the stray capacity of the semiconductor element is reduced, the high speed operation is enabled, there is no latch-up phenomenon, and the radiation resistant characteristics are superior, because an Si monocrystalline substrate which is quite economical, even and flat over a large area, and has a quite excellent crystallinity is used, and semiconductor active elements are created on an Si monocrystalline layer having significantly less defects.

The liquid crystal image display unit of the present invention is created on a good monocrystalline layer formed on the non-transparent substrate by selectively removing the porous substrate or porous layer by anisotropic etching, and thus has a high performance. Also, the silicon substrate is used as a non-transparent substrate, and can become a starting material having a thermally, mechanically, chemically and physically good consistency with the conventional silicon integrated circuit process.

In general, if a light source having a significantly great luminous intensity is used for the projection-type liquid crystal image display unit, the light exciting current may be induced in the semiconductor layer by the light ray impinging upon the peripheral circuit portion, thereby causing some malfunctions, whereas the display unit of the present invention can avoid such a problem because the peripheral circuit portion is shielded from the light.

Moreover, since the liquid crystal image display unit of the present invention uses a substrate having the anisotropic etching characteristics for the light non-transparent substrate, it is possible to remove a lower portion of liquid crystal pixel part at a high precision.

(EXAMPLE 21)

FIG. 21 shows schematically a fabrication process of this example.

Anodization was conducted on a P-type (100) monocrystalline Si substrate having a thickness of 300 μm in an HF solution to form a porous Si substrate.

The conditions of anodization were as follows:

| | |
|---|---|
| Applied voltage: | 2.6 (V) |
| Current density: | 30 (mA · cm$^{-2}$) |
| Anodizing solution: | HF:H$_2$O:C$_2$H$_5$OH = 1:1:1 |
| Time: | 2.4 (hour) |
| Thickness of porous Si: | 300 (μM) |
| Porosity: | 56 (%) |

A 1.0 μm thick Si epitaxial layer 102 was grown on the P-type (100) porous Si substrate 101 thus obtained by a low pressure CVD method. Deposition was conducted under the following conditions.

| | |
|---|---|
| Source gas: | SiH$_4$ |
| Carrier gas: | H$_2$ |
| Temperature: | 850° C. |
| Pressure: | 1 × 10$^{-2}$ Torr |
| Growth rate: | 3.3 nm/sec |

Next, a 1000 Å thick oxide layer 103 was formed on the surface of this epitaxial layer 102, and then bonded onto another Si substrate 107 having a 5000 Å thick oxide layer 104, a 1000 Å thick nitride layer 1:10$^5$, and a 2000 Å thick or greater SiN$_x$ insulation layer 106 formed on the surface thereof, whereupon two Si substrates were bonded strongly by heating them at 800° C. for 0.5 hour in a nitrogen atmosphere.

Thereafter, a selective etching was conducted on the bonded substrates in a mixture solution (10:6:50) of 49% hydrofluoric acid, alcohol and 30% hydrogen peroxide without agitation. In 65 minutes, the porous Si substrate 101 was completely removed by the selective etching, with the monocrystal Si acting as an etch stopper, and the non-porous Si layer only was left behind without being etched. The etching rate of the non-porous Si monocrystal with respect to the etching solution was so low that the etching layer was 50 Å thick or less after 65 minutes, with the selection ratio of the etching rate of the non-porous layer to that of the porous layer being as large as 1:10$^5$, and the etching amount of non-porous layer 101 (several tens angstroms) could be ignored in a practical operation. Thus, the 200 μm thick porous Si substrate 101 was removed with a result that a 1.0 μm thick monocrystalline Si layer 102 remained on the SiO$_2$ layer 103. When SiH$_2$Cl was used as a source gas, the accelerated etching characteristics were maintained, although the growth temperature must be elevated several tens degrees.

A field effect transistor was created on the monocrystalline silicon thin film 102, and interconnected to produce a complementary element and an integrated circuit thereof, and form a pixel switching element and a peripheral drive circuit necessary for the liquid crystal image display unit. Note that the method of fabricating each transistor was a well-known MOS integrated circuit fabrication technique.

After a black matrix and a color filter were created on a cover glass, a common electrode was formed and the orientation processing was performed. After an active matrix substrate was subjected to the orientation processing and a seal material was printed, both of them were assembled and the liquid crystal was injected therein. For various processes for the liquid crystal, a well-known liquid crystal display unit fabrication technique was applied.

Thereafter, the Si substrate 107 was covered with hydrofluoric acid resistant rubber except for a section directly under the liquid crystal pixel part, and then partially removed to the insulation layer 104, using a mixture solution of hydrofluoric acid, acetic acid and nitric acid, whereby a projection-type liquid crystal image display unit based on the light transmission was completed.

As in this example, the substrate formed by the bonding of a substrate having an insulation film formed on an Si substrate, and a substrate in which an Si substrate is made porous and then Si is epitaxially grown on the porous Si can be made several μm thick, because there is no limitation of Si monocrystalline film with respect to the underlaid insulation film, and an SiN film can be also used.

Also, there is no restriction on the fabrication of forming TFT by providing a light transparent film between the light non-transparent substrate and the monocrystalline TFT for the improvement of film strength, when the SOI substrate is created, so that a fabrication method with high degrees of freedom can be provided. Further, since a reinforcing layer is formed before the removal of light non-transparent layer, it is possible to avoid any damage occurring at the removal of light non-transparent layer.

(EXAMPLE 22)

Figure 22:
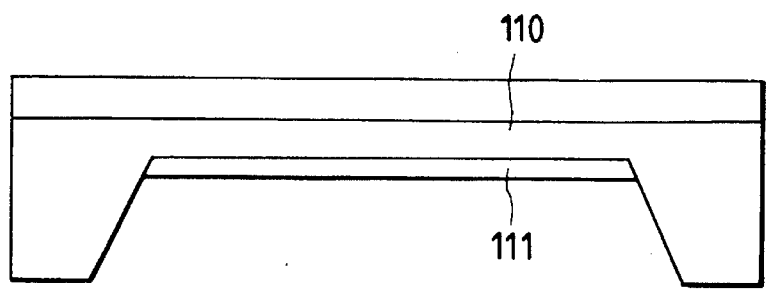
FIGS. 22 is a schematic cross-sectional view showing a semiconductor substrate for a liquid crystal display unit according to an example 22 of the present invention.

A liquid crystal image display unit was fabricated in the same way as example 21, except that a 5000 Å thick Si layer 110 was left behind under the insulation layer by selective etching (N/P$^+$) of Si, as shown in FIG. 22, the Si layer 110 was thermally oxidized at a temperature of 800° to 1000° C. to make the Si layer transparent to the light, and then an $SiN_x$ insulation layer 111 was formed on the thermally oxidized film 110 by CVD method. In this example, the strength can be improved due to the provision for two layers of reinforcing film.

Also, the back face potential can be controlled by further forming an electric conductive film of light transparent thin film such as ITO on the $SiN_x$ insulation layer.

(EXAMPLE 23)

Figure 23:
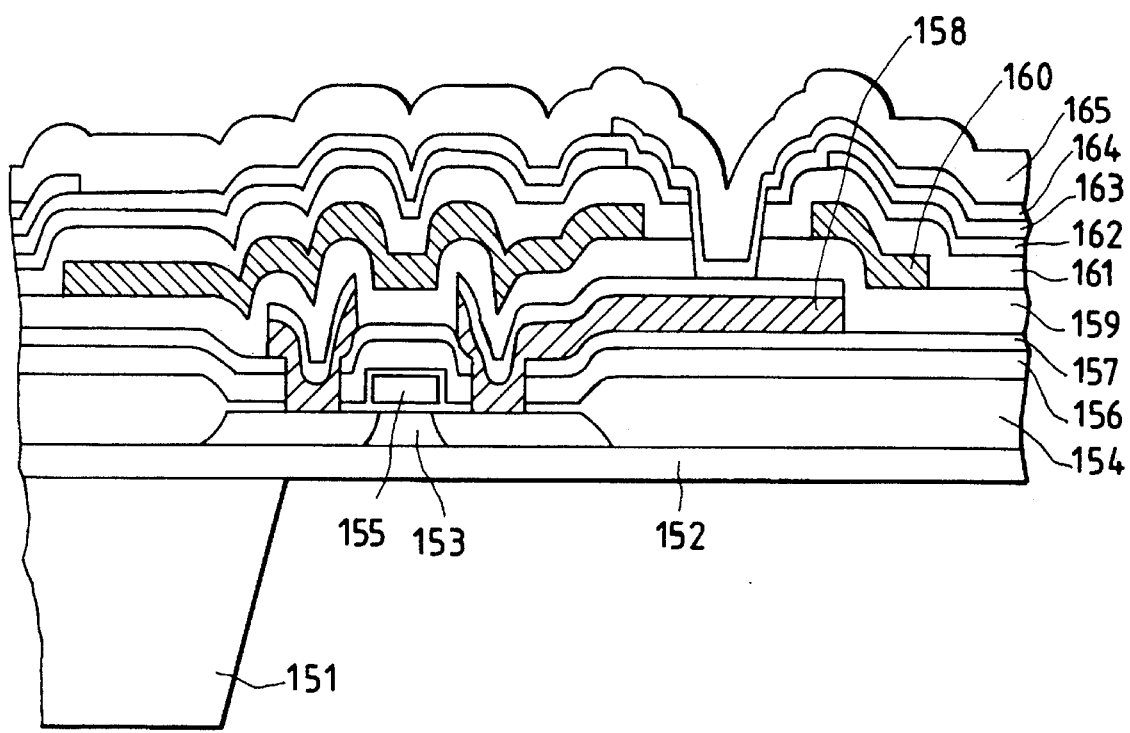
FIG. 23 is a schematic cross-sectional view showing a part of a liquid crystal display unit according to an example 23 of the present invention.
Figure 24A:
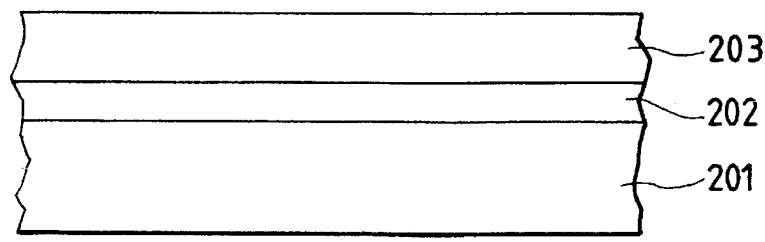
FIGS. 24A to 24D are schematic views showing a part of a liquid crystal display unit according to an example 24 of the present invention.
Figure 24B:
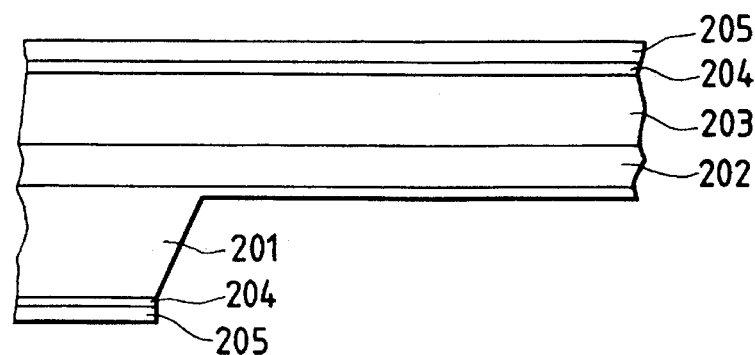
Figure 24C:
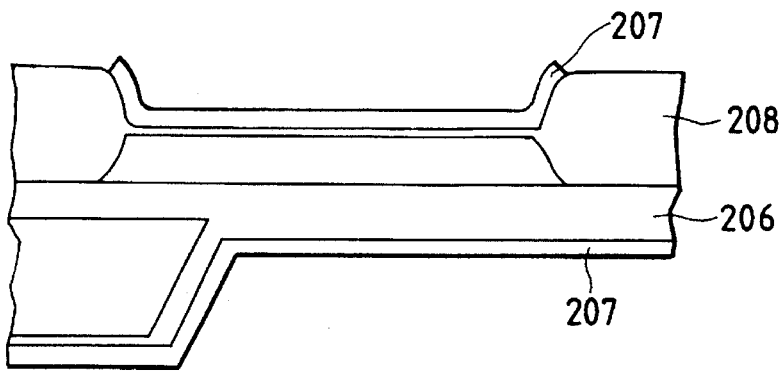
Figure 24D:
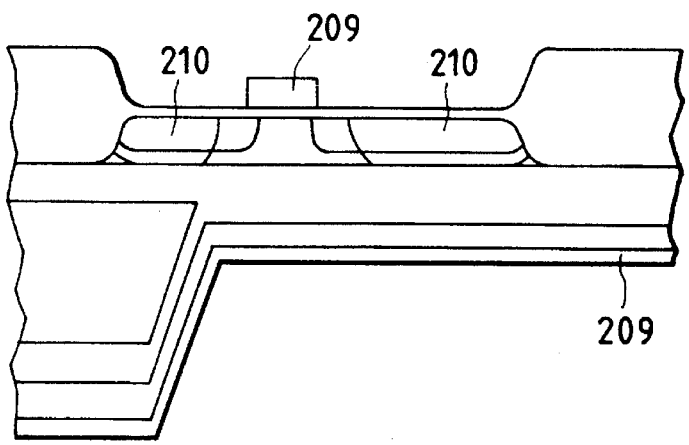
Figure 25:
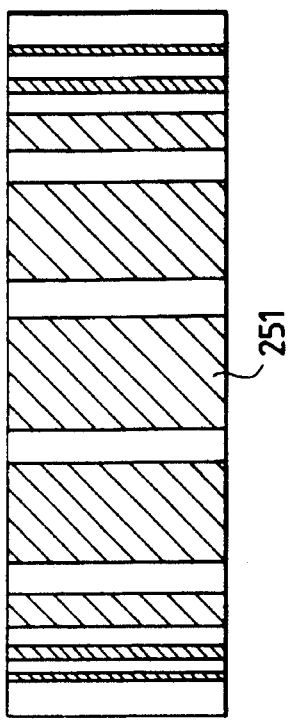
FIG. 25 is a schematic view showing a portion of a liquid crystal display unit according to an example 25 of the present invention.

A liquid crystal image display unit was fabricated in the same way as Example 21, except that Lp-SiN 156 having a great film strength was used as an interlayer insulating film of SiTFT, shown in FIG. 23. The problems with the use of Lp-SiN film as an interlayer insulating film include the adherence with the metallic film, and the protect effects of $H_2$.

The problem associated with the adherence with the metallic film is resolved by taking a sandwich structure with $SiO_2$ or BPSG film carried therebetween. Also, for the $H_2$ protect effects, Vth (threshold voltage) can be controlled by precontrolling the density of impurities in MOS channel portion.

(EXAMPLE 24)

$SiO_2$ layer 202 is formed on a substrate 201 by the implantation of $O^+$ ions of about $1\times10^{18}$ cm$^{-2}$ at 200 key, and a thermal treatment at about 1300° C., as shown in FIG. 24.

The substrate 201 formed in the above way, and two layer films of $SiO_2$ 204/$SIN_x$ 205 are formed by thermal oxidation method and LP-CVD method on the front and back sides of substrate 202. Subsequently, the back face is patterned, and a window is opened in the panel portion.

Then, the etching of silicon is conducted with KOH-type. The Lp-SiN film becomes a mask member for KOH. The etching of silicon is performed entirely or partially. With a subsequent thermal oxidization, only the back face of panel portion is thermally oxidized.

Thereafter, the back face side is further reinforced by thermal oxidation and CVD method in the process of forming TFT after peeling off the surface SiN film. In particular, the Lp-SiN film 207 for use with the LOCOS oxidation is a tensile film having an internal stress of film up to about $10^{10}$ dyn/cm$^2$, and is optimum as a back face reinforcing film. Reference numeral 209 is a gate electrode, and 210 is a source and a drain for the MOS transistor.

When the light non-transparent substrate 210 is etched from the back face side, the film strength of light transparent region is determined only by the insulating film 202 and the Si layer 203 on the upper face of light non-transparent substrate, resulting in narrower degrees of freedom in the film configuration due to the restriction of TFT. However, the film strength of back face can be improved without restriction by the TFT in this example.

(EXAMPLE 25)

A liquid crystal image display unit was fabricated in the same way as example 21, except that the $SiN_x$ insulation layer 251 was patterned from a central portion of the light transparent region toward the peripheral portion.

With this example, the adjustment of light transparent region is allowed, and in particular the strength at the central portion of the light transparent region having a weak strength can be reinforced.

As above described in detail, the present invention makes it possible to provide a high performance device with elements and circuits integrated on the same substrate as the liquid crystal image display pixel, in which the stray capacity of the semiconductor element is reduced, the high speed operation is enabled, there is no latch-up phenomenon, and the radiation resistant characteristics are superior, because an Si monocrystalline substrate which is quite economical, even and flat over a large area, and has a quite excellent crystallinity is used, and semiconductor active elements are created on the Si monocrystalline layer having significantly less defects.

The liquid crystal image display unit of the present invention is created on a good monocrystalline layer formed on the non-transparent substrate by selectively removing the porous substrate or porous layer by anisotropic etching, and thus has a high performance. Also, the silicon substrate is used as a non-transparent substrate, and can become a starting material having a thermally, mechanically, chemically and physically good consistency with the conventional silicon integrated circuit process.

In general, if a light source having a significantly great luminous intensity is used for the projection-type liquid crystal image display unit, the light exciting current may be induced in the semiconductor layer by the light ray impinging upon the peripheral circuit portion, thereby causing some malfunctions, whereas the display unit of the present invention can avoid such a problem because the peripheral circuit portion is shielded from the light.

Moreover, the liquid crystal image display unit of the present invention is provided with $SiN_x$ insulation layer in the light transparent region where the light non-transparent substrate is removed, so that the strength of that region is reinforced, and the reliability is improved.

(EXAMPLE 26)

Figure 26:
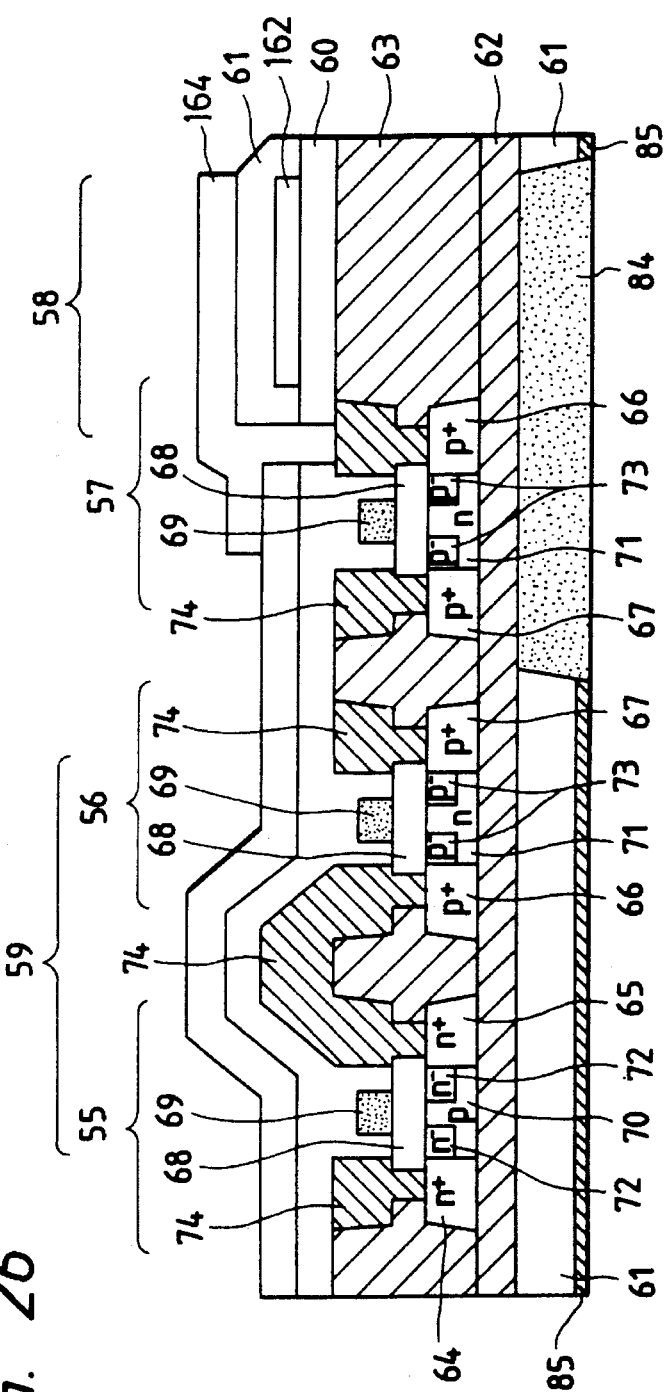
FIG. 26 is a schematic cross-sectional view showing a liquid crystal display unit according to an example 26 of the present invention.

FIG. 26 shows a liquid crystal display unit which uses a CMOS inverter for the peripheral drive circuit, and a PMOS transistor for the switching element of pixel electrode. This figure is a cross-sectional view of a substrate only on the side where semiconductor devices such as transistors are incorporated. In the FIG., 61 is a support substrate, 62 is an underlaid insulation layer, 63 is an element separation oxide film, 64 is a source region of NMOS transistor, 65 is a drain region of NMOS transistor, 66 is a drain region of PMOS transistor, 67 is a source region of PMOS transistor, 68 is a gate oxide film, 69 is a gate electrode, 70 is a channel region of NMOS transistor, 71 is a channel region of PMOS transistor, 72 is an N-type field relief region, 73 is a P-type field relief region, 74 is an Al (wiring) electrode, 75 is an NMOS transistor, 76, 77 are PMOS transistors, 58 is a holding capacity portion, 59 is a CMOS inverter, 80, 81 are interlayer insulating films, 82 is a common electrode, and 83 is a pixel electrode, 84 is a back face filler, and 85 is a back face electrode.

A substrate as above constituted and another substrate provided with the common electrode are disposed opposingly via a spacer, and made a panel by enclosing a liquid crystal therein.

The requirement for the liquid crystal display unit is that the light can be transmitted through the image display unit of both the reflection type and the transmission type. Accordingly, one sheet of quartz plate is conventionally used. On the other hand, though Si is generally used as an active layer of transistor, a monocrystal Si which is most favorable as the active layer is quite difficult to fabricate, and could not be formed actually on the quartz. Therefore, in the case where the transistor is formed on the pixel display portion, and the case where the transistor is integrated with the peripheral driving circuit, a polycrystalline Si formed even on the quartz has been used.

However, in order to attain a higher definition of screen and a higher driving speed in accordance with the requirements for higher quality image, the polycrystalline Si has some limits, so that it was desired to constitute a liquid crystal display unit with semiconductor devices of a monocrystalline Si.

Thus, with this example, a liquid crystal display unit having an improved performance of the semiconductor device and a higher speed can be provided in such a manner that a monocrystalline Si thin film is formed via an insulation layer on a semiconductor or conductor substrate, which is then removed only on an image display portion to be made transparent, and control means of the back face potential is provided on the peripheral drive circuit portion of the substrate to control the substrate potential.

That is, with this example, it is possible to provide a liquid crystal display unit of the active matrix type comprising a semiconductor active element having an active layer formed by the use of a monocrystalline Si thin film which is formed via an insulation layer on a semiconductor or conductor substrate, characterized in that an image display portion has the transparency due to the exposure of only the insulation layer by removing the substrate or the filling of a transparent filler after removing the substrate, and the peripheral drive circuit portion has the substrate left behind and comprises back face potential control means.

The monocrystalline Si thin film of this example is obtained with a conventional SIMOX (Separation by Implanted Oxygen) method or a method using a polycrystalline Si substrate. The polycrystalline Si thin film obtained with the latter fabrication method has few defects and serves for an ideal semiconductor as an active layer for the transistor.

This example uses a CMOS inverter with a small consumption power in the peripheral drive circuit, a PMOS transistor without back face leak and with a high voltage resistance in the switching of pixel electrode, and a P-type Si substrate, wherein the substrate potential is controlled by providing a metallic electrode made of, e.g. aluminum, on the back face of the substrate. The silicon resin was used for the light transparent filler 84.

In this example, the etching rate of 4 μm/min was obtained at 100° C. using an 8000 Å thick silicon oxide film for the underlaid insulation layer and a 30% KOH aqueous solution for the etching of silicon. A 5000 Å thick silicon nitride film deposited by LP-CVD (Low Pressure-Chemical Vapor Deposition) was used as an anti-etching film at this time. The thickness of this film is desirably greater, and cracks may easily occur above a thickness of 6000 to 8000 Å, thereby degrading the anti-etching property. Accordingly, the thickness of about 1000 to 6000 Å is desirable.

Figure 27:
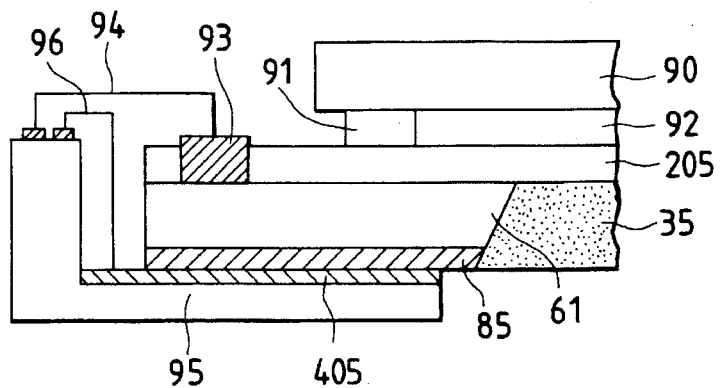
FIG. 27 is a schematic cross-sectional view showing the structure of a back face electrode in a liquid crystal display unit according to an embodiment of the present invention.

FIG. 27 shows the wiring state of the back face electrode. In the figure, 90 is an opposed substrate provided with a common electrode, which is disposed via an adhesive 81 opposingly to the substrate, and carries a liquid crystal 92 therebetween. Reference numeral 93 is a pad provided on the drive circuit such as a CMOS inverter, and connected to the side of a package 95 by means of a bonding wire 94, while the back face electrode 85 is secured via conductive material to the package 95, and connected to the side of the package 95 by means of a bonding wire 96, so that the potential is controlled. The thickness of Si support substrate is 550 μm, which is sufficient to retain the strength of entire chip.

Figure 28:
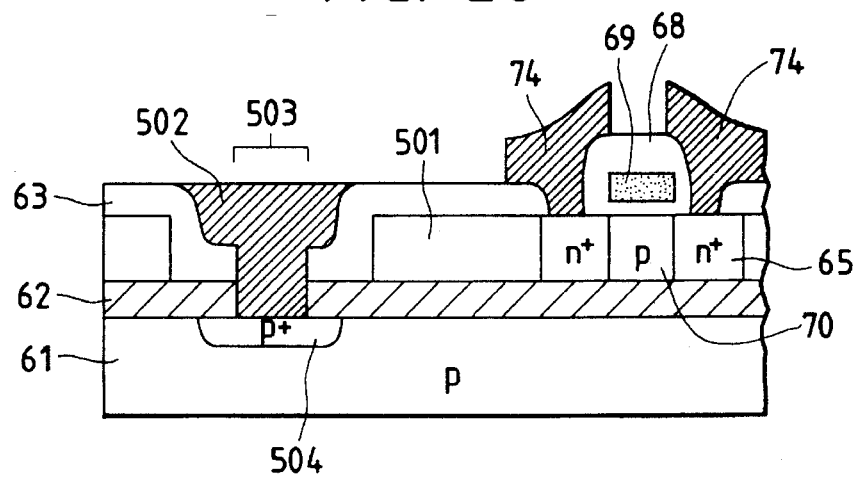
FIG. 28 is a schematic cross-sectional view showing the structure of a back face electrode in a liquid crystal display unit according to another embodiment of the present invention.

FIG. 28 shows another form to realize this example. In FIG. 28, there is shown a structure in which the back face electrode is provided on the upper face of device area, wherein 501 is a separation layer for the separation between elements, and 502 is a back face electrode. With this method, an opening portion 503 passing through an interlayer insulating film 63 and an underlaid insulating film 62 is provided in making a contact hole after the formation of device. In order to improve the ohmic property of contact, $1\times10^{15}$ cm$^{-2}$ ions of boron are implanted, and Al is deposited after a low resistive p-type diffusion layer 504 is formed, whereby the structure of FIG. 28 can be obtained.

With this constitution, the efficient driving can be achieved under the conditions where the film thickness $(T_{BOX})$ of underlaid insulation layer is 8000 Å, $V_{SS}$=OV, $V_{DD}$=14 V, and the back face potential is 2 to 5 V. Thus a liquid crystal display unit having 64 gradations and consisting of 400,000 pixels can be realized having a light transmittance of the display unit of 90% or greater.

The liquid crystal display unit of this example can drive the semiconductor device used therein at a speed 5 to 100 times higher than that of the conventional polycrystalline TFT, because of the use of a monocrystalline Si thin film as an active layer of the semiconductor device, and further can improve the performance of the circuit by sufficiently reducing the leak current of parasitic element for the semiconductor device used in the peripheral drive circuit while controlling the back face potential, so that a high quality image display can be achieved at a high definition of 32 gradations or greater and with several tens thousand pixels, and the sufficient strength for the circuit using the monocrystalline Si can be assured with the substrate removed only on the image display portion to make the display portion transparent.

(EXAMPLE 27)

In order to eliminate the bonding as previously described, it is conceived that the image display region and the peripheral circuit are provided on the same substrate.

Figure 29:
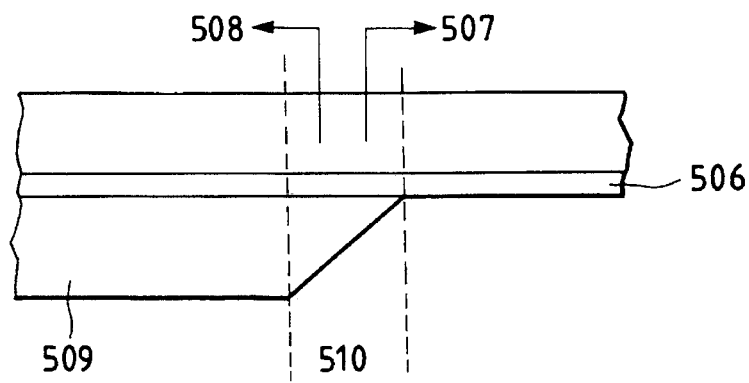
FIG. 29 is a schematic view for explaining a part of a liquid display unit according to one embodiment of the present invention.

FIG. 29 is a schematic cross-sectional view where the liquid crystal pixel part and the peripheral circuit are provided on the same substrate.

As shown in FIG. 29, an image display region 507 including a pixel TFT and a pixel electrode, and a peripheral circuit 508 for the driving thereof are formed on the same substrate insulation layer 506, and interconnected via the data line and the gate line, wherein the image display region is made transparent to transmit the light therethrough, for example, by etching the semiconductor substrate in an etching solution such as KOH, and the peripheral circuit region has the semiconductor or conductor substrate left behind on the back face thereof for a predetermined voltage to be applied, because the device characteristics (e.g., leak current amount of NMOS) within the peripheral circuit may be influenced by the potential at the back face of the peripheral circuit, whereby the above-mentioned structure can be realized.

However, a transition region 510 where the film thickness of substrate transitionally varies is naturally produced in forming a transparent substrate region and a conductor substrate region within the same substrate, so that when a part of the area for the formation of the peripheral circuit extends to the transition region as shown in FIG. 29, the electric field may be differently applied on the peripheral circuit because the film thickness of transition region in the conductor substrate is not constant, thereby causing the dispersion in the device characteristics to occur in the peripheral circuit; while when a part of image display region extends to the transition region, there is a problem that the adverse effect such as the occurrence of defective pixels inferior in transparency may be exerted.

This example provides an image display unit characterized in that there are provided a portion constituting a semiconductor or conductor substrate via an insulation layer, and a portion constituting only the insulation layer, and a peripheral circuit is provided above the portion constituting the semiconductor or conductor substrate, and an image display region on the portion constituting only the insulation layer, wherein the interconnection therebetween can be made by the use of the same wiring material as used within the peripheral circuit and the image display region, and the wiring area is wider than the transition region of the semiconductor or conductor substrate thickness.

That is, in this example, no adverse effects are exerted on the peripheral circuit, because the peripheral circuit and the image display region do not exist on the transition region.

Herein, to order for the wiring area to be wider than the transition region, it is desirable to have the wiring area beyond a size of transition region plus 0.3 mm. This is a value taken in consideration of the alignment margin at the position where the transition region is formed, so that the transition region will not extend to the area 3 or 4 even if the misalignment occurs.

Figure 30:
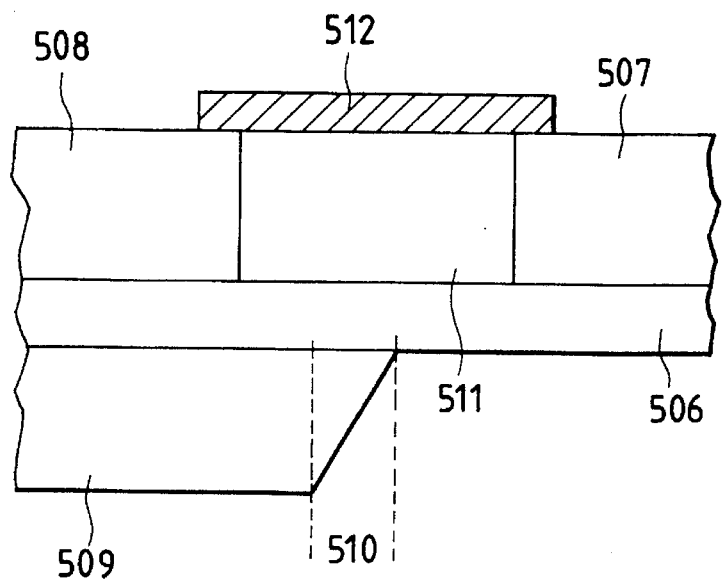
FIG. 30 is a schematic cross-sectional view for explaining a part of a liquid crystal display unit according to example 27 of the present invention.
Figure 31:
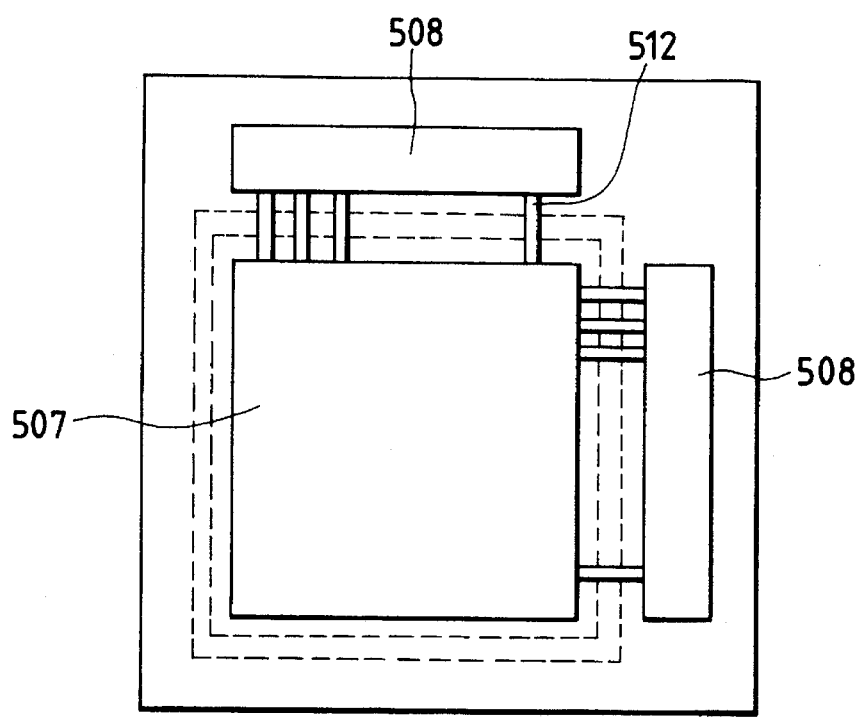
FIG. 31 is a schematic plan view of a liquid crystal display unit according to one embodiment of the present invention.

FIG. 30 is a cross-sectional view of a part of the image display unit according to the present invention, and FIG. 31 is a plan view thereof. The plan view is commonly used in the examples as hereinafter described. Reference numeral 509 is a semiconductor or conductor substrate, 506 is an insulation layer, 508 is a peripheral circuit formation region, 507 is an image display region, and 511 is an isolation region for electrically isolating the regions 508, 507 and 510 is a transition region of the substrate film thickness.

The peripheral circuit formation region 508 and the image display region 507 are fabricated in a semiconductor region on the insulation layer by a semiconductor device process. These are electrically isolated by an element isolation region 511 formed by the LOCOS process, the trench isolation process, and the PN junction separation process. A wiring member 512 serves to connect the peripheral circuit formation region 508 and the image display region 507, and is made in such a manner that the film of a metal such as Al, Ti, Ta, Mo, Cu, W, a silicide such as $TiSi_2$, $TaSi_2$, $WSi_2$, $MoSi_2$, porous Si or ITO, is deposited by CVD method, sputtering method or vapor deposition method, and then formed to a desired pattern by the photolithography process.

The wiring member 512 is formed in a film thickness of several thousands Å and a width of about 1 to 100 µm.

The peripheral circuit 508 is formed on the semiconductor or conductor substrate except for the transition region 510, and the image display region 507 is formed on the transparent substrate except for the transition region, whereby both regions are electrically connected, with desired terminals joined through the wiring member 512, so that the peripheral circuit with less dispersion in the characteristics and the image display region having less image defects are formed on the same substrate, whereby a high resolution image display unit capable of making the minute patterning can be realized with low cost.

(EXAMPLE 28)

Figure 32:
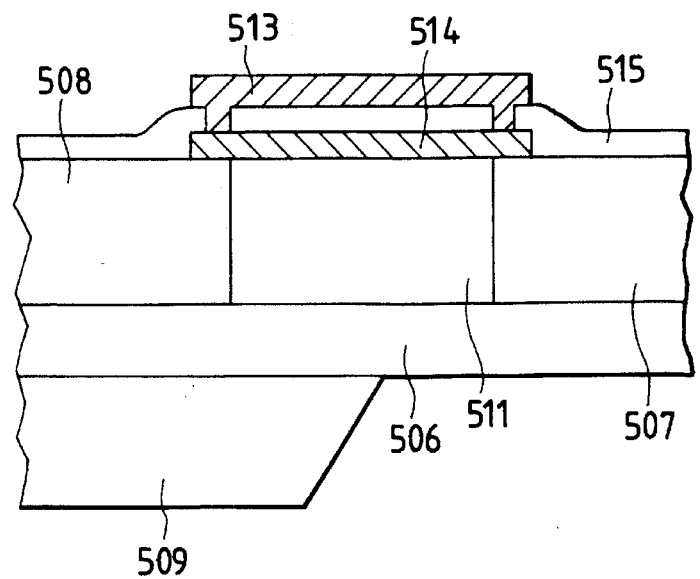
FIG. 32 is a schematic cross-sectional view showing a part of a liquid crystal display unit according to an example 28 of the present invention.

FIG. 32 is a cross-sectional view of a part of an image display unit according to another form of the present invention.

In FIG. 32, the multi wiring having two layers (513, 514) of wiring member is shown, and has an advantage of preventing the disconnection, in addition to the effects as shown in example 27. The transition region of the film thickness produced as a result of etching has generally a width of several hundreds µm, and assuming that the wiring is formed at a pitch of 10 µm in the transition region having a width of 500 µm, the regions 508 and 507 must be connected via a slender wire having a length of 500 µm and a width of 7 µm, in which a severe problem may arise with the disconnection of wire. A multi wiring structure increases the redundancy, but provides a higher resistance against the disconnection. A variety of combinations of multi wiring can be contemplated, for example, such that 513 is Al, 514 is polycrystalline Si, 513 is ITO, and 514 is Al. Also, three or more layers of wiring member can be realized.

(EXAMPLE 29)

Figure 33A:
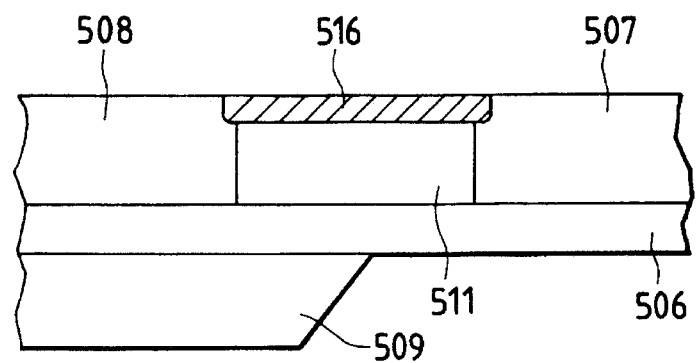
FIGS. 33A and 33B are schematic cross-sectional views showing a part of a liquid crystal display unit according to an example 29 of the present invention.
Figure 33B:
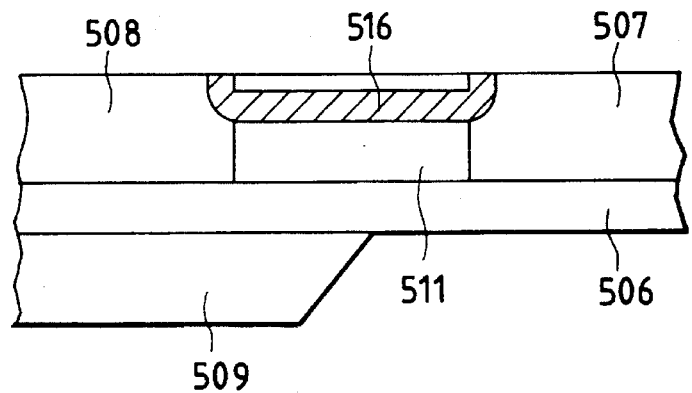

FIG. 33 shows a wiring member using a monocrystalline Si, in which FIG. 33A shows a monocrystalline Si 516 on the surface, and FIG. 33B shows a monocrystalline Si 516 buried therein. The monocrystalline Si 516 is electrically isolated from an isolation region 511.

If the monocrystalline wiring is used, the wiring having a low resistance of several tens Ω can be formed without damaging the flatness of substrate surface, so that for example, when the present invention is applied to the liquid crystal display unit, the disorder in the orientation of liquid crystal caused by a step difference can be reduced, (EXAMPLE 30)

Figure 34:
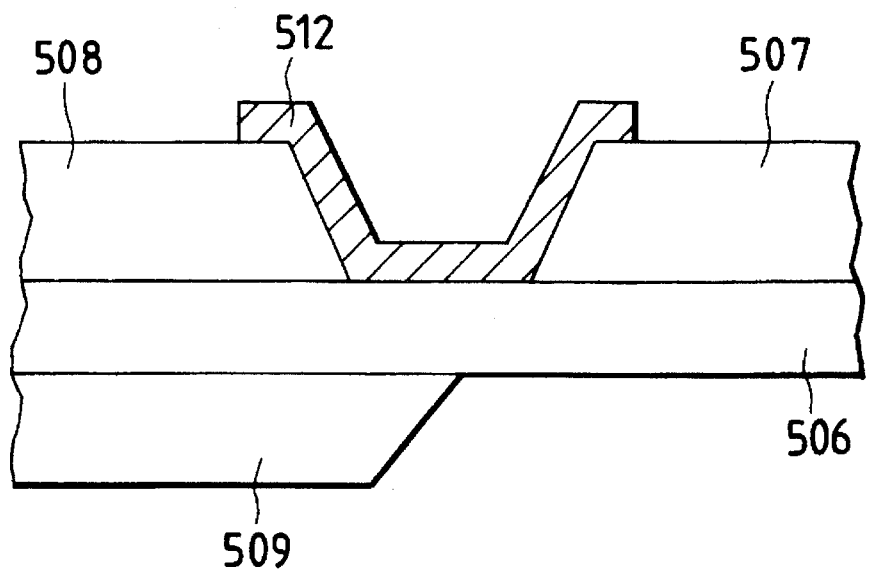
FIG. 34 is a schematic cross-sectional view showing a part of a liquid crystal display unit according to an example 30 of the present invention.

FIG. 34 shows a structure in which the peripheral circuit 508 and the image display unit 507 are completely isolated.

Since in this example the peripheral circuit 508 and the image display unit 507 are completely isolated, they are of course insulated, with a small amount of capacitive coupling thereof, whereby the problem associated with the cross talk in the image display unit 507 or malfunction in the peripheral circuit 508 can be reduced.

(EXAMPLE 31)

Figure 35:
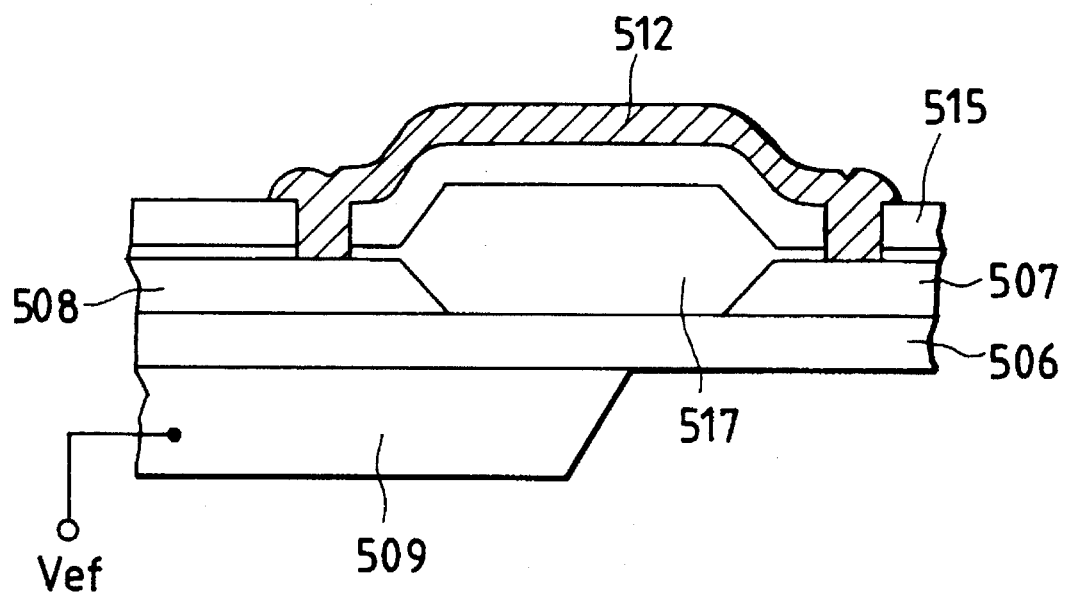
FIG. 35 is a schematic cross-sectional view showing a part of a liquid crystal display unit according to an example 31 of the present invention.

This example as shown in FIG. 35 is a liquid crystal display unit fabricated in a typical semiconductor fabrication process. The peripheral circuit 508 and the image display region 507 are made within a semiconductor layer provided on the insulation layer, and both are insulated by an LOCOS insulating film 517. The wiring member 512 is formed on the LOCOS insulating film 517, and the peripheral circuit 508 and the image display region 507 are interconnected via contact hole. A semiconductor substrate 509 is provided under the peripheral circuit, with a certain region of LOCOS 514 as the boundary, whereby the dispersion in the device characteristics is suppressed by setting the potential to a desired value $V_{ref}$. Reference numeral 515 is an insulating film for preventing the short circuit of the wiring 512 with regions 508, 507 from occurring at an unnecessary site.

While the above description was made with the example of display unit using TFT, the present invention is not limited to TFT, but it will be appreciated that the active matrix liquid crystal display unit using the diode or MIM element, or the simple matrix liquid crystal display unit containing the drive circuit can provide the same effects.

The interconnection between the image display unit and the peripheral circuit can be made with the minute patterning and at a low cost. Since the peripheral circuit is surely formed on the semiconductor or conductor substrate, the dispersion in the device characteristics of the peripheral circuit can be reduced. The image defective area having insufficient transparency can be reduced.

(EXAMPLE 32)

A liquid crystal display unit of the active matrix type will be now described in which the characteristics of the CMOS inverter can be used for the peripheral drive circuit, and the PMOS transistor is used for the switching element.

Figure 36A:
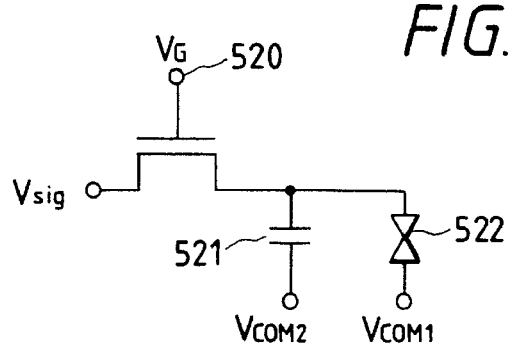
FIG. 36A to 36C are schematic views for explaining the operation of a MOS transistor.

FIG. 36A shows an equivalent circuit of each pixel in the liquid crystal display unit. Reference numeral 520 is a gate electrode, 521 is a storage capacitor, and 522 is a liquid crystal capacitive portion. In the conventional liquid crystal display unit, the active layer of transistor is a polycrystalline Si thin film.

At present, it is commonly practiced that a plurality of types of semiconductor devices are combined within one display unit to form a circuit. However, since the semiconductor devices have different characteristics, the optimal condition for an individual device cannot be set for a plurality of types of semiconductor devices formed on the same substrate, so that the semiconductor devices are used while the problem associated with each device is unresolved.

Figure 36B:
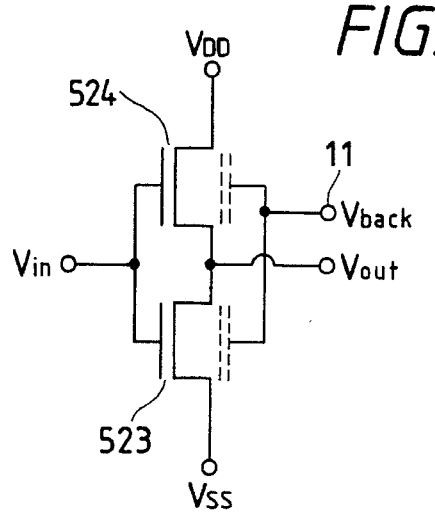

FIG. 36B shows an equivalent circuit for a CMOS inverter having nMOS transistor 523 and pMOS transistor 524, which is formed using SIMOX (Separation by Implanted Oxygen) substrate.

Figure 36C:
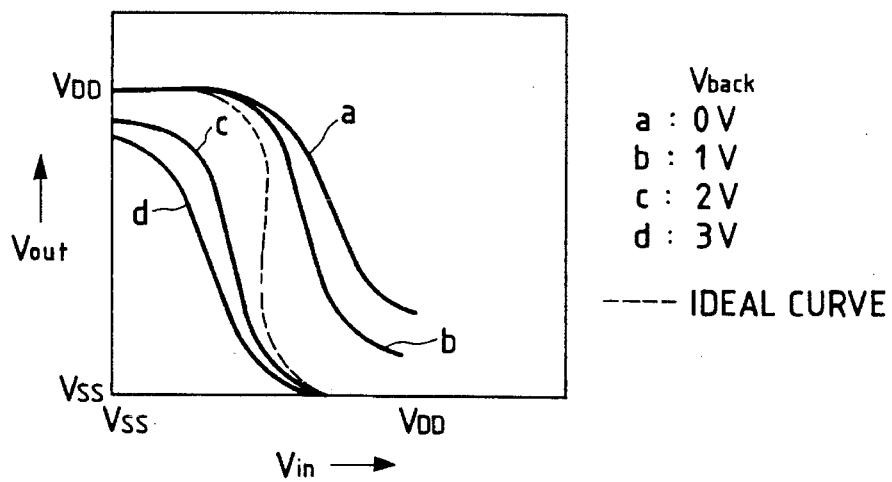

On the substrate side of the CMOS inverter, there arises a parasitic MOS transistor in which the supporting substrate serves as a gate electrode and the insulation layer between the support substrate and the active layer serves as a gate insulation layer. In the conventional CMOS inverter, it is difficult to increase the absolute value of threshold voltage for the parasitic MOS transistor, and even if $V_{back}$ is set at any value, the parasitic NMOS or PMOS transistor will operate, so that the leak current may flow. FIG. 36C shows the input/output characteristics of CMOS transistor. Since the parasitic transistor operates near $V_{back}=0$ as shown in this figure, the output does not completely drop down to $V_{SS}$ due to the leak current of PMOS transistor even if $V_{in}$ comes closer to $V_{DD}$. On the other hand, since the parasitic NMOS transistor operates near $V_{back}=3$, the output does not completely drop down to $V_{DD}$ due to the leak current of NMOS transistor even if $V_{in}$ comes closer to $V_{SS}$.

The CMOS inverter has the above-mentioned problem, but with the NMOS transistor alone made on the thin film monocrystal, there is seen a "kink" phenomenon of yielding a step difference in the static curve, and it is necessary to provide a passage through which occurring holes can escape to relieve this phenomenon.

In the PMOS transistor, the driving speed may be limited due to a parasitic capacity between the source/drain and the channel region.

In this way, the characteristics of semiconductor active elements are different from each other, and the characteristics or conductions may depend on the usage of the semiconductor active element incorporated therein, whereby when a plurality of semiconductor active elements were formed on the same substrate, the method of obtaining more desirable characteristics was demanded because of the conflicting conditions which might occur.

The present inventors have performed acute examinations to resolve the above problem, and as a result, achieved this example by noting that the characteristics of each semiconductor active element can be controlled to some extent depending on the film thickness of active layer. For example, the active layer is made thicker than the conventional active layer to improve the input/output characteristics of the CMOS inverter, while it is made thinner to design the complete depletion type in preference of high speed drive; also, it is effective to provide a thick active layer to prevent the "kink" of NMOS transistor, and to design the thick active layers for the NMOS and PMOS transistors to give the voltage resistant property.

In view of the above aspect, with this example, in a semiconductor device using a plurality of semiconductor active elements, there is provided means for controlling the film thickness of active layer in accordance with the desired characteristics to derive more excellent characteristics of respective semiconductor active elements.

That is, this example provides a semiconductor device having a plurality of semiconductor active elements each comprising an active layer formed of a monocrystalline semiconductor thin film on an insulation layer, characterized in that the active layer of the semiconductor active element has at least two kinds of film thicknesses. In the present invention, for a plurality of semiconductor active elements, a plurality of kinds of elements or a plurality of same elements may be used.

Further, this example provides a liquid crystal display unit of the active matrix type in which a CMOS inverter is used as the peripheral drive circuit and a PMOS or NMOS transistor is used as the pixel switching element by applying the above means, characterized in that the film thickness of the active layer for CMOS inverter is thicker than that of the active layer for the switching element.

A method for forming different active layers in this example will be described below.

The active layer of Si which is most frequently used will be described for the convenience of explanation, although the active layer is made of a monocrystalline semiconductor thin film. The method for forming the monocrystalline Si thin film is preferably carried out in such a manner that after a monocrystalline Si thin film is grown epitaxially on the porous Si substrate, two substrates are bonded and the porous Si substrate is removed by etching, or the porous Si substrate is removed by etching before bonding and then bonded on to substrate. The monocrystalline Si thin film thus obtained has few defects, and allows for the high speed driving. However, the present invention is not particularly limitative to such monocrystalline Si thin film, and for example, the monocrystalline Si thin film obtained by SIMOX may contain a quantity of impurities and therefore is unsuitable for the use.

The monocrystalline Si layer of this example is formed by using a porous Si substrate which is produced by making the monocrystalline Si substrate porous like the above example.

Next, a method for changing the thickness of active layer will be described,

FIG. 37 shows two methods. First, preparing a supporting substrate 525 having the monocrystalline Si layer 527 on the underlaid insulation layer 526, the surface thereof is thermally oxidized 100 to 500 Å thick, and a pad $SiO_2$ layer 528 is formed. After the SiN layer 529 is deposited 1000 to 3000 Å thick by LP-CVD, the patterning is conducted, as shown in FIG. 37A. Then, the monocrystalline Si is etched on a portion of the surface where $SiO_2$ layer 528 and SiN layer 529 are removed, using a chlorine gas. For example, when the original Si layer 527 has a thickness of 1000 Å, it is etched to a thickness of 2000 to 6000 Å. Thereby, a structure as shown in FIG. 37B is obtained.

Thereafter, the $SiO_2$ layer 528 and the SiN layer 529 are removed in sequence, so that a thick monocrystalline Si layer A and a thin monocrystalline Si layer B are obtained. After the preparation of (A), only a portion not covered with the SiN layer 529 can be oxidized by the thermal treatment at a temperature of 900° to 1200° C. in the oxygen or water vapor gas atmosphere (C). When the original Si layer 527 has a thickness of 1000 Å, the selective $SiO_2$ layer is oxidized to a thickness of 6000 to 15000 Å. Thereafter, unnecessary portion including this selective $SiO_2$ layer is etched, so that the monocrystalline Si layer having a different film thickness can be obtained.

In this way, a semiconductor active element is formed by changing the film thickness of the monocrystalline Si in accordance with the design requirements.

This example can improve the characteristics of each element as well as the performance of the whole device, in such a manner that if a semiconductor device comprises a plurality of semiconductor active elements, each active layer is changed to a desired state, so that the active layers having different film thicknesses are provided within the same device.

More specifically, the film thickness is determined in accordance with the object of the device. For example, when the high voltage resistance and a high voltage are required, it is effective to set a large film thickness. This is also effective not only for improving the performance of individual transistor, but also suppressing the operation of parasitic element (e.g., parasitic PMOS transistor) caused by the large film thickness. When the high speed at a relatively low voltage is required, the thin film is more desirable. The thin film is effective for the improvement not only in the performance of individual transistor, but also the characteristics of the entire circuit mainly due to the effect of diminishing the parasitic capacity.

The optimal value for the film thickness of active layer in the present invention will differ depending on the device of interest. For example, in the NMOS transistor, the occurrence of hot carriers is more remarkable than that in the PMOS transistor, so that the voltage resistance will easily decrease. Accordingly, in a circuit requiring the high voltage resistance and a high voltage, the optimal value for the active layer of NMOS transistor is larger than that of PMOS transistor.

Figure 38:
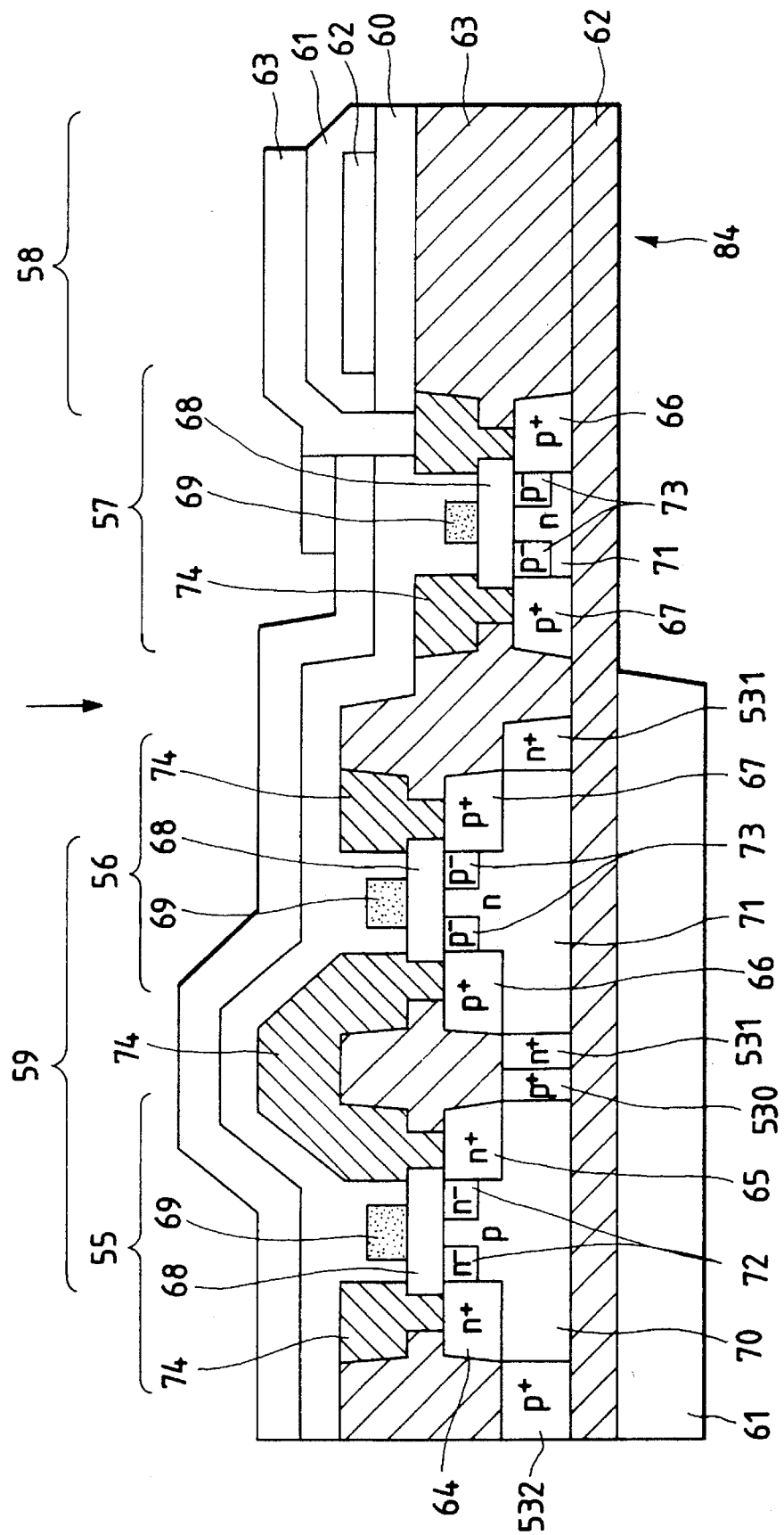
FIG. 38 is a schematic cross-sectional view showing a liquid crystal display unit according to one embodiment of the present invention.

FIG. 38 shows a cross-sectional view of a liquid crystal display device in this example of the present invention. The fundamental constitution is the same as that of the liquid crystal display device as previously described and shown in FIG. 26, and therefore the duplicate description is omitted. In this example, the film thickness of active layer for the CMOS inverter 59 used for the peripheral drive circuit is so large as to be 8000 to 1000 Å, while the film thickness of active layer for the PMOS transistor 57 used for the switching of pixel electrode is 2000 to 6000 Å. The junction separation is provided between the active layers for the PMOS transistor and NMOS transistor in the CMOS inverter of drive circuit. In this example, the active layer is formed by the fabrication method of monocrystalline Si thin film as previously described, and the Si substrate is used as a supporting substrate 61, comprising a hollow portion 84 which is made by the etching for a necessary transparent display portion, but the above monocrystalline Si thin film can be formed on a transparent substrate made of, e.g., glass, so that all the surface can be made of glass.

Figure 39A:
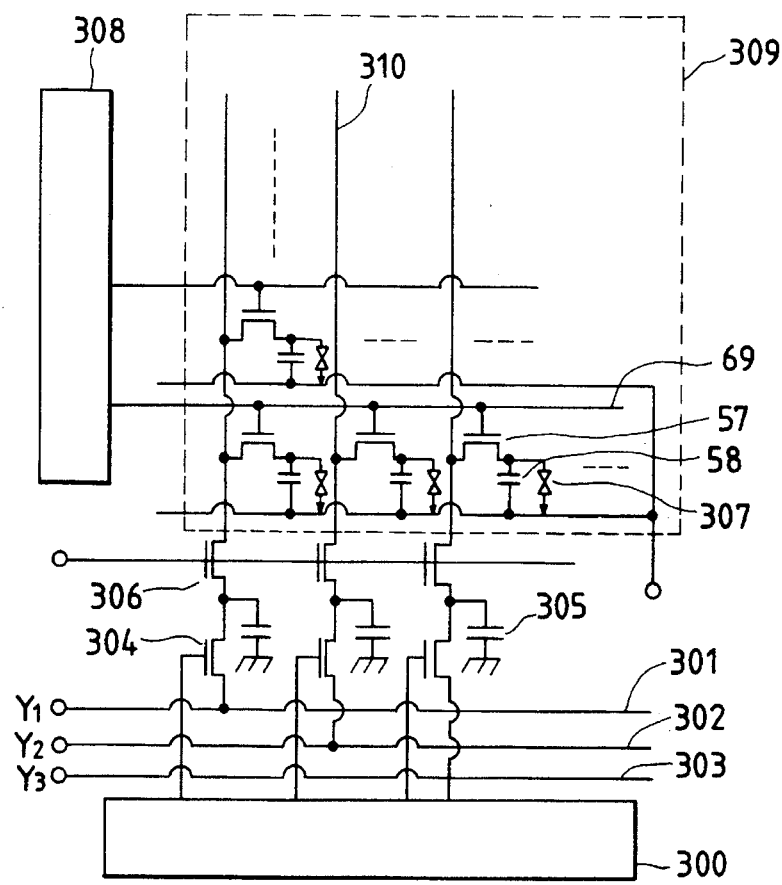
FIGS. 39A and 39B are schematic views for explaining a circuit configuration of a liquid crystal display unit according to one embodiment of the present invention.
Figure 39B:
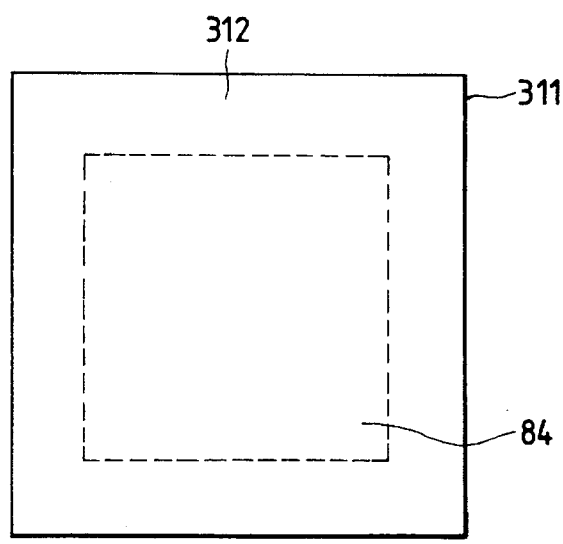

FIG. 39A shows an equivalent circuit diagram of this example. Reference numeral 300 is a horizontal shift register for driving a single line 310, 301 to 303 are red (R), green (G) and blue (B) video signal lines, 304 is a transistor for transferring a signal to MOS of buffer capacity. Reference numeral 305 is a buffer capacitor for temporarily storing the signal of each signal line, 306 is a MOS transistor switch for transferring the signal stored in the buffer capacitor to a pixel part, 307 is a liquid crystal capacity, 308 is a vertical shift register for driving a gate line 69, and 309 is a display portion, wherein the display portion 309 is a hollow portion 84 in which the supporting substrate is removed and a portion having the peripheral drive circuit formed is a non-transparent portion 312 where the Si substrate remains, as shown in FIG. 39B.

In this example, there is no current flow between source and drain even if a reversal layer due to a potential of the supporting substrate is formed on the upper face of underlaid oxide film 12, because sources and drains 64 to 67 for the PMOS and NMOS transistors 55, 56 for use in the drive circuit are separated away several thousands Å or more from underlaid oxide film 12. Therefore, there is no necessity for taking into consideration the operation of parasitic MOS transistor, and an ideal curve for the input/output characteristics is shown in FIG. 36C, with $V_{DD}=8$ V, $V_{SS}=-6$ V, and the thickness of underlaid insulting film=5000 Å.

Note that the distance from the bottom face of source/drain to the upper face of underlaid oxide film, at which the MOS transistor having an underlaid oxide film as the gate oxide film will not operate, is preferably set in a range of 2000 to 10000 Å, although it may mainly depend on the density of impurities in the channel region. Even below this distance, the operation can be controlled by increasing the absolute value of the threshold of parasitic MOS transistor.

Since in this example the parasitic transistor can be sufficiently turned off even with a relatively thin thickness of underlaid insulting film of 5000 Å, the high voltage driving was easily enabled. In this example, $V_{DD}-V_{SS}=14$ V was possible, so that a voltage of ±5 V or greater could be applied to a liquid crystal for use with the liquid crystal display. As a result, a liquid crystal panel having 100 thousand pixels or more could be realized at a high gradation of 64 or greater.

In this example, the PMOS transistor was used as the switching element of pixel part, but the NMOS transistor can be used in the same configuration.

(EXAMPLE 33)

Figure 40A:
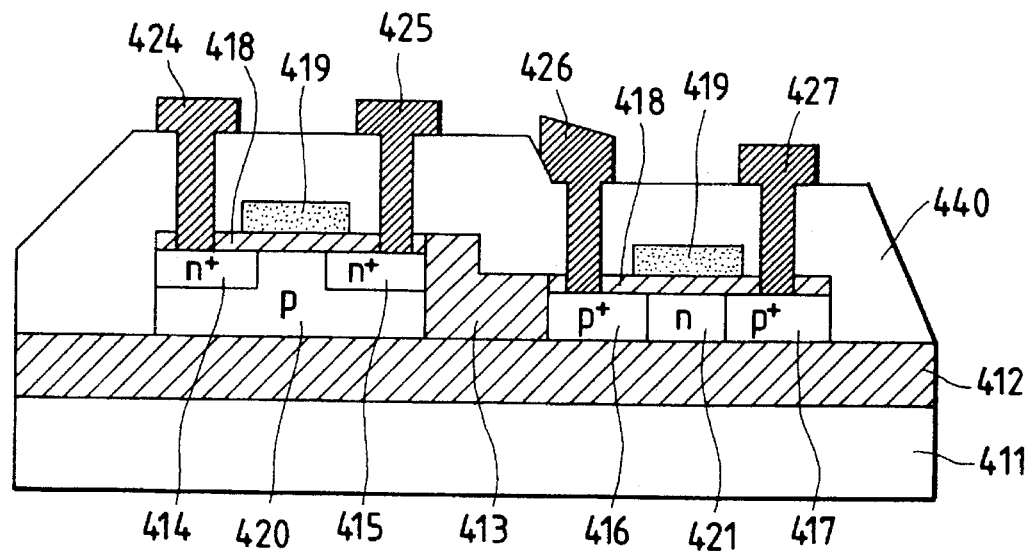
FIGS. 40A to 40C are schematic views for explaining a CMOS transistor for use with the present invention.

FIG. 40A shows another example in which LSI is implemented with a CMOS circuit formed on SOI (Silicon on Insulator). In the figure, 411 is a support substrate, 412 is an underlaid insulation layer, 413 is an element separation oxide film, 414 is an NMOS source region, 415 is an NMOS drain region, 416 is a PMOS drain region, 417 is a PMOS source region, 418 is a gate oxide film, 419 is a gate electrode, 420 is an NMOS channel region, 421 is a PMOS channel region, 424 to 427 are electrodes, and 440 is an interlayer insulating film. In this example, the thickness of active layer for the NMOS transistor is 4000 to 10000 Å, and the thickness of active layer for the PMOS transistor is 500 to 3000 Å.

Figure 40B:
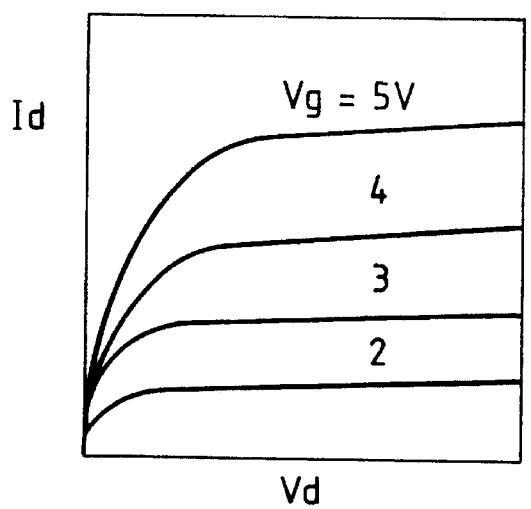
Figure 40C:
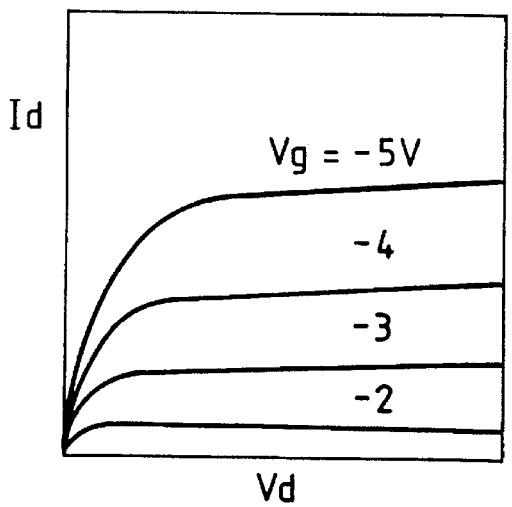

As shown in the figure, the source 414 and the drain 415 for the NMOS transistor do not reach the underlaid insulating layer. The static curves for the NMOS and PMOS transistors are shown in FIGS. 40B and 40C. As there is no "kink" which is found in the normal NMOS transistor, and no leak current flows on the back face, as seen in the figure, so that the Si voltage of support substrate 411 can be set at will in a range of 0 to +7 V.

A CMOS ring oscillator and a shift register using NMOS and PMOS transistors of this example were fabricated, and the operation of the ring oscillator and the shift register was confirmed in a range of gate length 0.2 to 3.0 μm, and particularly, the voltage resistance of NMOS transistor was improved, so that the driving at 7 V was enabled with a gate length of 0.5 μm.

Applying this example, for example, the normal CMOS inverter is provided with a current driving force for the PMOS transistor and the NMOS transistor, and the areas of the PMOS transistor and the NMOS transistor are changed to improve the degrees of freedom in designing the circuit with the equal on/off characteristics, while the area of NMOS transistor can be made smaller and the integration of the whole device can be improved by changing the film thicknesses of these active layers.

(EXAMPLE 34)

Figure 41:
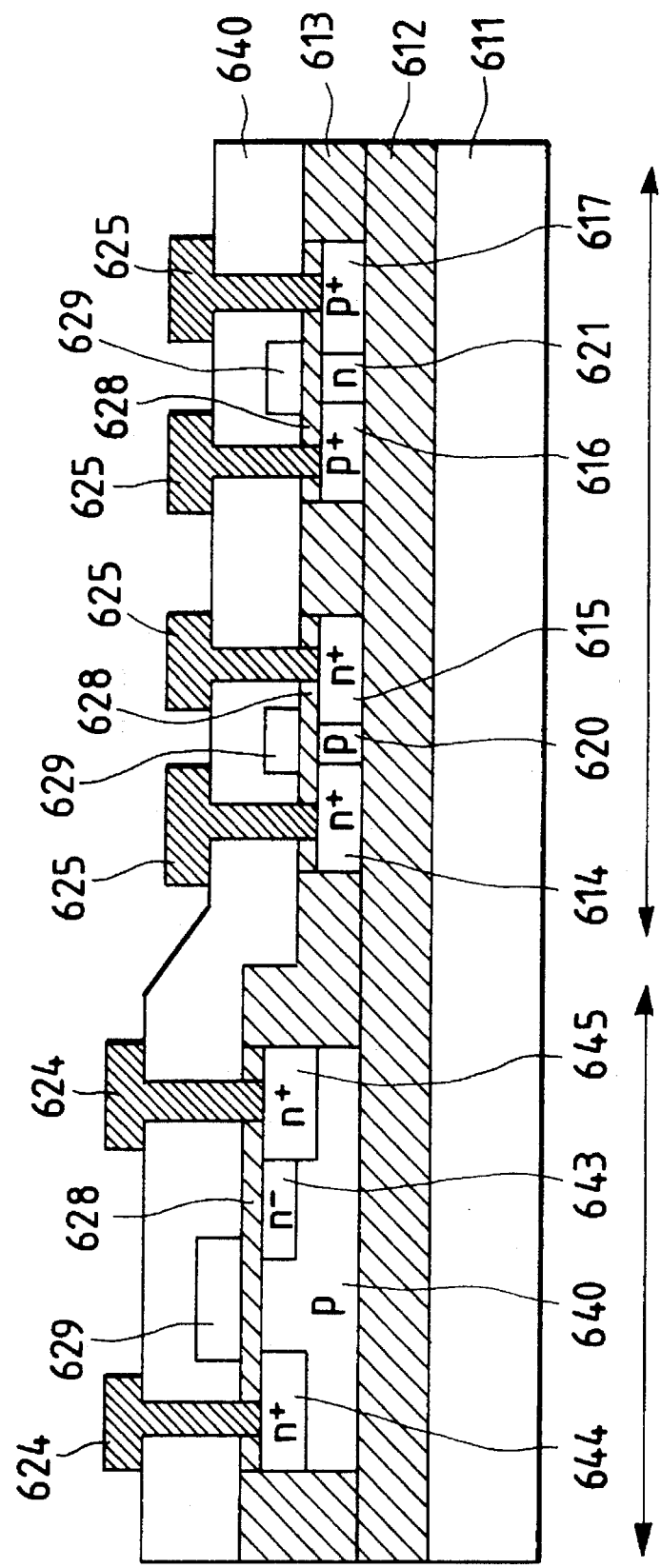
FIG. 41 is a schematic cross-sectional view of a CMOS circuit according to example 34 of the present invention.

FIG. 41 shows still another example. This example is a semiconductor device having a MOSFET with a high voltage resistance of 10 V or more and a fully depleted high speed CMOS logic integrated therein. In the figure, 611 is a support substrate, 612 is an underlaid insulation layer, 613 is an element separation oxide film, 614 is an NMOS source region, 615 is an NMOS drain region, 616 is a PMOS drain region, 617 is a PMOS source region, 618 is a gate oxide film, 619 is a gate electrode, 620 is an NMOS channel region, 621 is a PMOS channel region, 624 is a high voltage resistant NMOS source and drain electrode, 625 is an electrode for the PMOS and NMOS transistors on the CMOS logic side, 640 is an interlayer insulating film, 643 is a high voltage resistant NMOS drain field relief region, 644 is a high voltage resistant NMOS source region, and 645 is an NMOS drain region.

Figure 42A:
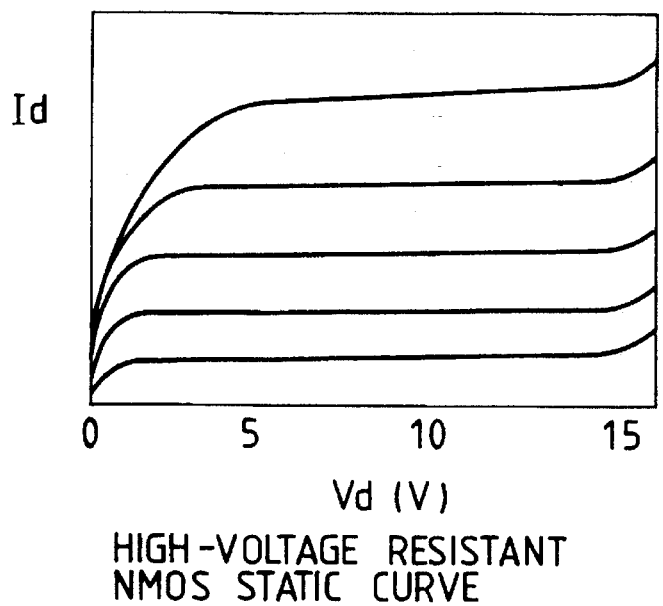
FIGS. 42A and 42B are graphs showing the characteristics of the MOS transistor for use with the present invention.
Figure 42B:
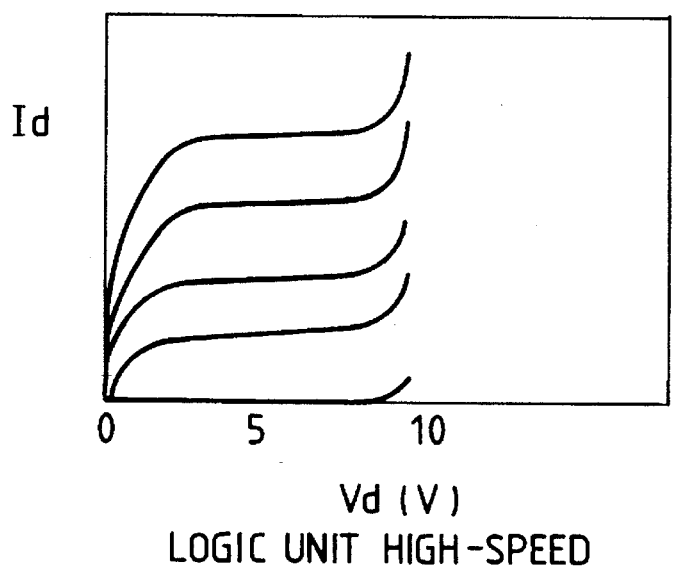

The high voltage resistant NMOS FET of this example indicated a voltage resistance of 15 V or greater as shown in FIG. 42 without the occurrence of holes near the drain which may degrade the voltage resistance. This is because the escape passage of holes has been maintained by increasing the film thickness of active layer. On the other hand, the NMOS transistor in the logic portion has a small film thickness of active layer at a voltage resistance of 8 V, as well as a small drain and source capacity, whereby the operation speed was improved to about two times that of the same circuit formed on the bulk, because the channel portion has been fully depleted.

(EXAMPLE 35)

Figure 43:
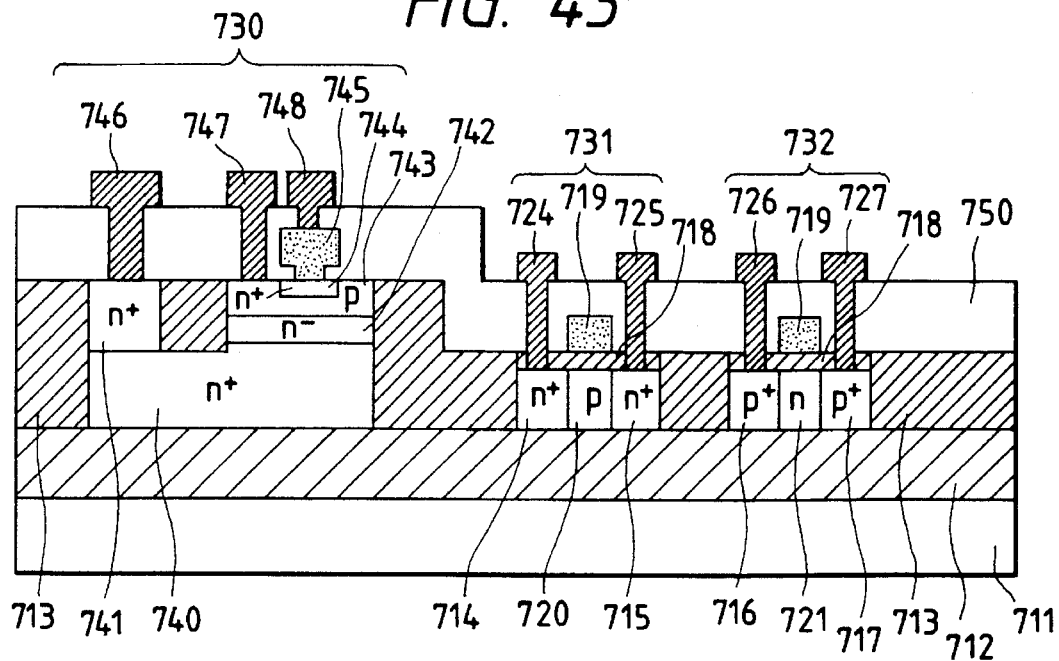
FIG. 43 is a schematic cross-sectional view of SRAM according to an example 35 of the present invention.

FIG. 43 shows a cross section of the main portion for a high speed Bi-CMOS SRAM (static random access memory using a bipolar transistor and a CMOS inverter) in still another example.

Figure 44:
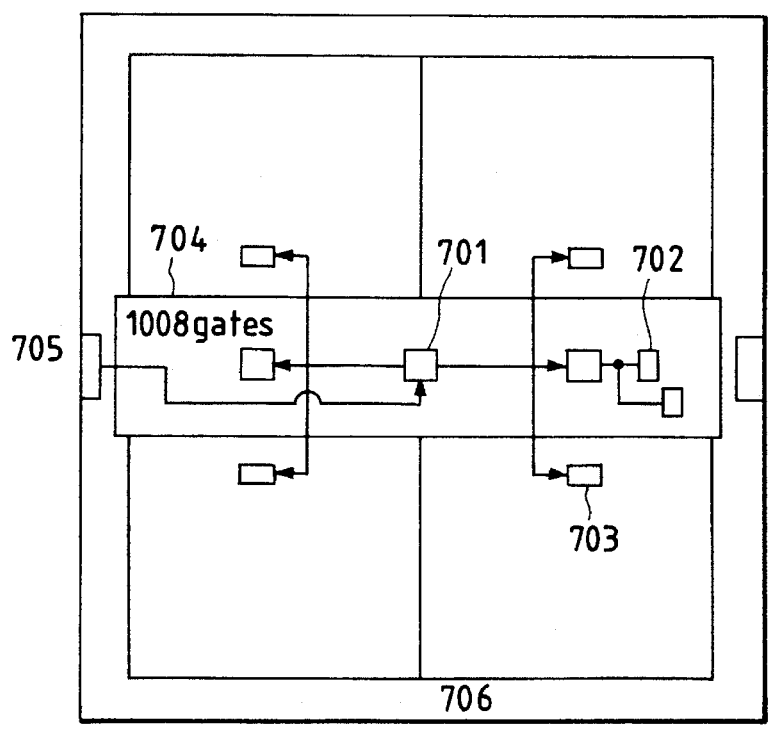
FIG. 44 is a schematic diagram for explaining a circuit block configuration of SRAM according to an example 35 of the present invention.

First, SRAM will be described. FIG. 44 shows an overall configuration diagram for a static RAM mounted on the logic circuit in this example. A clock input from clock shaping circuit 705 as will be described later is subdivided into six parts by a first stage clock driver A701 to drive a next stage clock driver B703. The first stage clock driver A701, together with a part of clock driver B703 and a logic circuit (e.g., flip-flop 702), is created on a gate array 704 having 1000 gates. The gate array 704 comprises macro cells of SRAM arranged peripherally in the form of 12 word×18 bit, around which an input/output circuit 706 is disposed.

Figure 45:
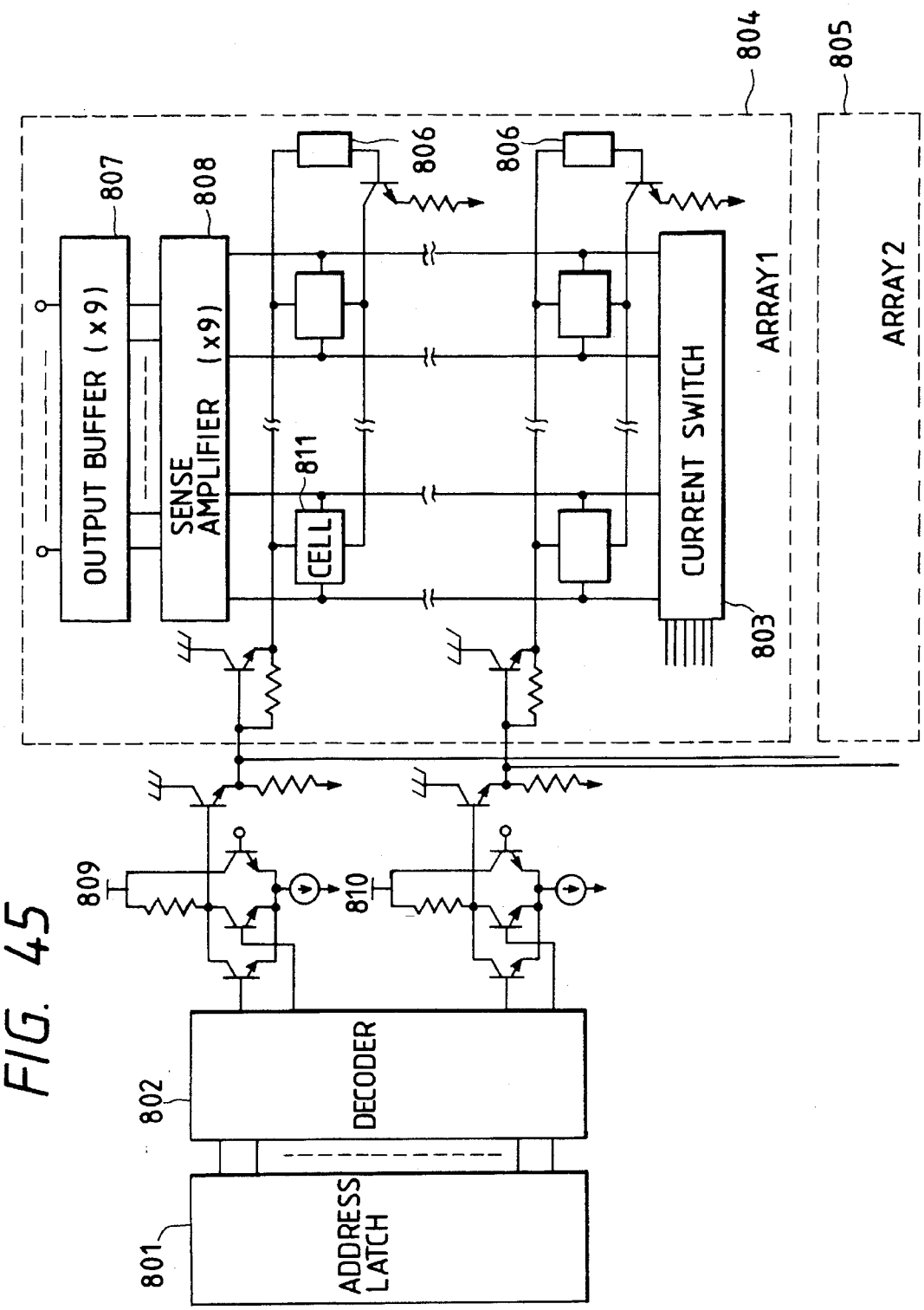
FIG. 45 is a circuit configuration diagram of SRAM as shown in FIG. 44.

The details of macro cell of SRAM are shown in FIG. 45. One macro cell consists of a plurality of repetitive sections, each section surrounded by the broken line for an array 804 comprising a memory cell 811 arranged as an array on the 64 word lines (line in the horizontal direction) and the data lines of 9 bit (line in the vertical direction with two lines per cell), the 64 word line drivers 1 to 64; 809, 810 for driving the word lines, a decoder 802 for selecting the word line, an address latch 801 for temporarily storing a code for the selection of word line, a current switch 803 for writing data on to a selected memory cell 811, an output buffer 807 for reading the data written on each memory cell 811, a sense amplifier 808 for amplifying the read data, and a discharge circuit 806 for deleting the memory cell data. Note that the word line driver is commonly provided to the arrays, as shown in the figure.

Figure 46:
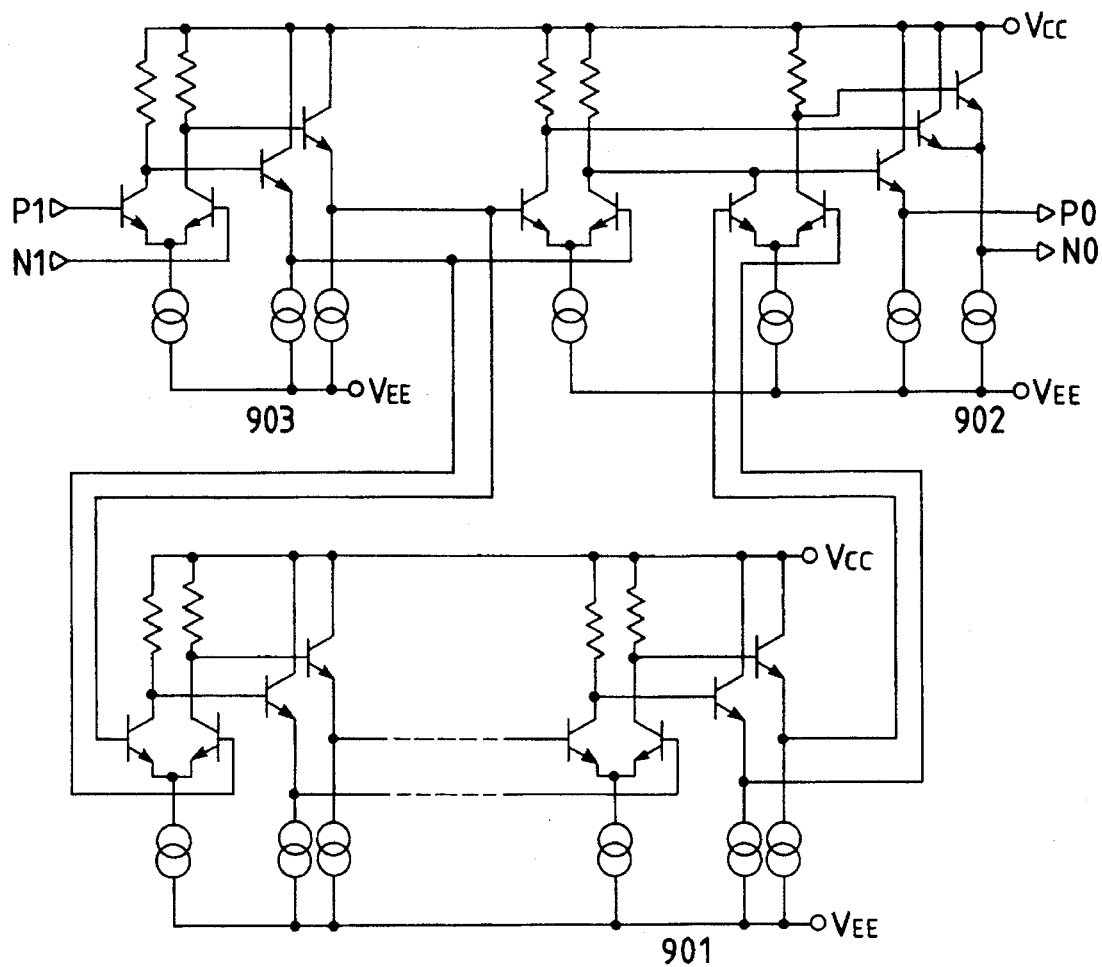
FIG. 46 is a circuit configuration diagram of a clock shaping circuit for use with the present invention.

FIG. 46 shows the details of the clock shaping circuit as shown in FIG. 44. The clock shaping circuit is one for resolving the delay of input signal P1, N1 occurring at the rise or fall and obtaining a more ideal pulse signal as the output P0, N0, and consists of a buffer 902 for differentially amplifying the input signal, a shaping circuit 903 having the differential amplification, and a delay circuit 901. $V_{CC}$ shows a power supply on the high voltage side, and $V_{EE}$ shows a power supply on the low voltage side.

In this example, a word driver, a current switch, a discharge circuit, and a pulse shaping circuit are constituted of the bipolar transistor, and other circuit portions are constituted of the CMOS inverter.

Next, the CMOS inverter and the bipolar transistor as shown in FIG. 43 will be described below. In FIG. 43, 711 is a support substrate, 712 is an underlaid insulating film, 713 is an element separation oxide film, 714 is an NMOS source region, 715 is an NMOS drain region, 716 is a PMOS drain region, 717 is a PMOS source region, 718 is a gate oxide film, 719 is a gate electrode, 720 is an NMOS channel region, 721 is a PMOS channel region, 724 is an NMOS source electrode, 725 is an NMOS drain electrode, 726 is a PMOS drain electrode, 727 is a PMOS source electrode, 730 is an NPN bipolar transistor, 731 is an NMOS transistor, 732 is a PMOS transistor, 740 is a collector buried layer, 741 is a collector leading layer, 742 is an intrinsic collector region, 743 is a p-type base region, 744 is an $n^+$-type emitter region, 745 is an emitter region, 746 is a collector region, 747 is a base region, 748 is an emitter electrode, and 750 is an interlayer insulating film.

In this example, the thickness of active layer is set to 1.0 μm to make the resistance of collector buried layer sufficiently low, and it is set within a range of 500 to 3000 Å as the full depletion type to reduce the junction capacity on the MOS transistor side.

In this example, the collector substrate capacity was made about OFF. Also, the use of SOI MOS allowed the consumption power to be suppressed to 1/10 as compared with the logic of bipolar constitution, although the speed was decreased by about 10%.

In this example, specifically, the semiconductor active element has different characteristics or conditions depending on its usage, and in order to satisfy different requirements on the same substrate, the constitution of the present invention to derive the required characteristics sufficiently by changing the film thickness of semiconductor active layer is very simple and effective means. With the present invention, it is possible to obtain the semiconductor device having a higher performance than the conventional semiconductor device, without raising the cost.

What is claimed is:

1. A liquid crystal display, comprising:

an insulating layer, an epitaxial semiconductor layer disposed on one side of said insulating layer and a monocrystalline semiconductor layer disposed on another side of said insulating layer, said liquid crystal display further comprising a pixel portion and a driving circuit provided outside said pixel portion, wherein said pixel portion comprises switching elements and said switching elements and said driving circuit are provided within said epitaxial semiconductor layer; and wherein said monocrystalline semiconductor layer is provided only on areas of said insulating layer other than beneath said pixel portion.

2. A liquid crystal display according to claim 1, wherein said epitaxial semiconductor layer and said monocrystalline semiconductor layer comprise Si.

3. A liquid crystal display according to claim 1 or 2, wherein said insulating layer is SiO.

4. A liquid crystal display according to claim 1, further comprising a transparent member, said transparent member being provided on the same side of said insulating layer as said monocrystalline semiconductor layer, said transparent member being provided on said insulating layer beneath said pixel portion.

5. A liquid crystal display according to claim 4, wherein said transparent member comprises SiN.

6. A liquid crystal display according to claim 4, wherein said transparent member comprises resin.

7. A liquid crystal display according to claim 1, wherein said monocrystalline semiconductor layer tapers toward said insulating layer around said pixel portion.

8. A liquid crystal display according to claim 3, wherein said switching element comprises a transistor and said driving circuit comprises transistors.

9. A liquid crystal display according to claim 8, wherein said driving circuit transistors have active layers with a thickness greater than that of said switching element transistor.

10. A liquid crystal display according to claim 9, wherein said switching element transistor has a MOS structure and said driving circuit is a C-MOS inverter.

11. A liquid crystal display according to claim 9, further comprising potential setting means provided in said epitaxial semiconductor layer in an area other than said pixel portion.

* * * * *

UNITED STATES PATENT AND TRADEMARK OFFICE
CERTIFICATE OF CORRECTION

PATENT NO. : 5,530,266
DATED : June 25, 1996
INVENTOR(S) : TAKAO YONEHARA ET AL.   Page 1 of 4

It is certified that error appears in the above-identified patent and that said Letters Patent is hereby corrected as shown below:

On the title page:
AT [56] REFERENCES CITED

Foreign Patent Documents,
"1194351  8/1989  Japan" should read
--1-194351  1/1989  Japan--.

COLUMN 2

Line 25, "Concerning" should read --¶ Concerning--.

COLUMN 3

Line 57, "pixel, is a" should read --pixel, 6 is a--.

COLUMN 4

Line 31, "and a monolithic" should read
--in a monolithic structure--.
Line 53, "monolithic" should read
--a monolithic structure--.

COLUMN 7

Line 3, "anon-porous" should read --a non-porous--.

COLUMN 10

Line 45, "alo" should read --al.--.
Line 65, ">4," should read --$\lambda$>4,--.

UNITED STATES PATENT AND TRADEMARK OFFICE
CERTIFICATE OF CORRECTION

PATENT NO.   :   5,530,266
DATED        :   June 25, 1996
INVENTOR(S)  :   TAKAO YONEHARA ET AL.

It is certified that error appears in the above-identified patent and that said Letters Patent is hereby corrected as shown below:

COLUMN 15

Line 43, "gages" should read --gases--.

COLUMN 20

Line 67, "is" should be deleted.

COLUMN 25

Line 65, "unit" should read --unit.--.

COLUMN 28

Line 1, "method," should read --method.--.

COLUMN 36

Line 16, "at" should read --a--.
Line 21, "having a" should read --having an--.

COLUMN 44

Line 40, "of" should read --of the--.

COLUMN 47

Line 7, "reduced," should read --reduced.--.

UNITED STATES PATENT AND TRADEMARK OFFICE
CERTIFICATE OF CORRECTION

PATENT NO. : 5,530,266
DATED : June 25, 1996
INVENTOR(S) : TAKAO YONEHARA ET AL.   Page 3 of 4

It is certified that error appears in the above-identified patent and that said Letters Patent is hereby corrected as shown below:

COLUMN 49

Line 54, "1000 Å," should read --10000 Å,--.

COLUMN 50

Line 32, "1000 Å," should read --10000 Å,--.

COLUMN 51

Line 4, "insulting" should read --insulating--.
Line 15, "insulting" should read --insulating--.

COLUMN 52

Line 55, "cell 811,an" should read --cell 811, an--.

UNITED STATES PATENT AND TRADEMARK OFFICE
CERTIFICATE OF CORRECTION

PATENT NO. : 5,530,266
DATED      : June 25, 1996
INVENTOR(S): TAKAO YONEHARA ET AL.

It is certified that error appears in the above-identified patent and that said Letters Patent is hereby corrected as shown below:

COLUMN 54

Line 9, "and" should be deleted.

Signed and Sealed this

Twenty-second Day of October, 1996

Attest:

BRUCE LEHMAN

Attesting Officer     Commissioner of Patents and Trademarks